(12) United States Patent
Tsukamoto et al.

(10) Patent No.: US 6,438,281 B1
(45) Date of Patent: Aug. 20, 2002

(54) OPTICAL WIRING LAYER, OPTOELECTRIC WIRING SUBSTRATE, MOUNTED SUBSTRATE, AND METHODS FOR MANUFACTURING THE SAME

(75) Inventors: Takehito Tsukamoto; Koichi Kumai; Takao Minato; Shigeru Hirayama; Masayuki Ode, all of Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 09/539,860

(22) Filed: Mar. 30, 2000

(30) Foreign Application Priority Data

Mar. 30, 1999 (JP) .............................. 11-088569
Apr. 2, 1999 (JP) .......................... 11-096060

(51) Int. Cl.[7] ................................ G02B 6/12
(52) U.S. Cl. ......................... 385/14; 385/49; 385/88; 385/89
(58) Field of Search ..................... 385/14, 49, 88–94

(56) References Cited

U.S. PATENT DOCUMENTS

| | | | | |
|---|---|---|---|---|
| 4,756,590 A | * | 7/1988 | Forrest et al. ................ 385/89 |
| 4,897,711 A | * | 1/1990 | Blonder et al. ................ 257/48 |
| 5,627,931 A | * | 5/1997 | Ackley et al. ................ 385/88 |
| 5,761,350 A | * | 6/1998 | Koh ............................ 385/14 |
| 5,786,925 A | * | 7/1998 | Goossen et al. ............ 359/245 |
| 5,987,202 A | * | 11/1999 | Gruenwald et al. ........... 385/49 |
| 6,146,743 A | * | 11/2000 | Haq et al. .................... 428/210 |
| 6,243,509 B1 | * | 7/2001 | Chen ............................ 385/14 |
| 6,285,808 B1 | * | 9/2001 | Mehlhorn et al. ............ 385/14 |

* cited by examiner

Primary Examiner—Hemang Sanghavi
Assistant Examiner—Scott A Knauss

(57) ABSTRACT

A first clad layer is formed on a smooth support substrate via a release layer. On the first clad layer, a core through which light propagates and alignment marks are simultaneously formed. Further, these layers are covered with a second clad to obtain an optical wiring layer. Then, the optical wiring layer is released from the support substrate and stuck to a substrate having an electric wiring. Subsequently, on the resulting substrate are formed a mirror for reflecting light propagating through the core, pads for installing optical parts or the like, and via holes for electrically connecting the electric wiring on the substrate to the pads. For this formation, the alignment marks are used as references.

78 Claims, 38 Drawing Sheets

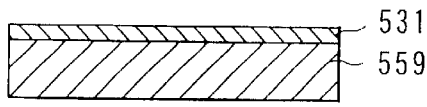
FIG. 28A
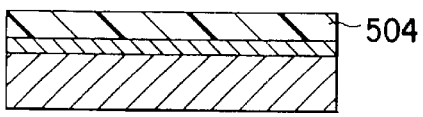
FIG. 28B
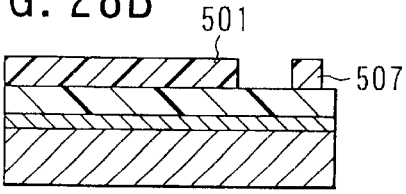
FIG. 28C
FIG. 28D
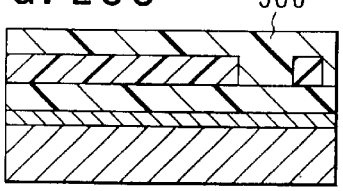
FIG. 28E
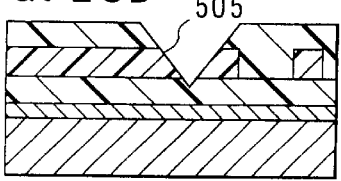
FIG. 28F
FIG. 28G
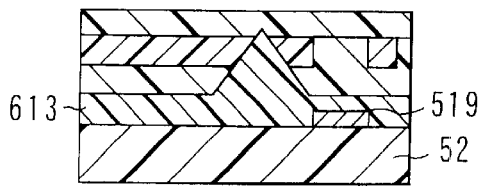
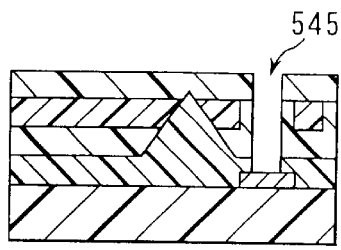
FIG. 28H
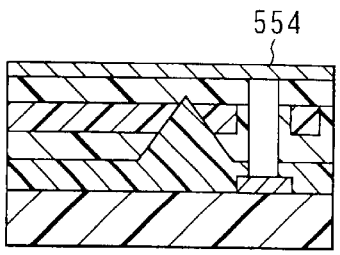
FIG. 28I
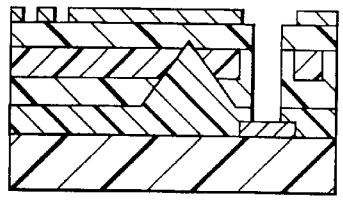
FIG. 28J
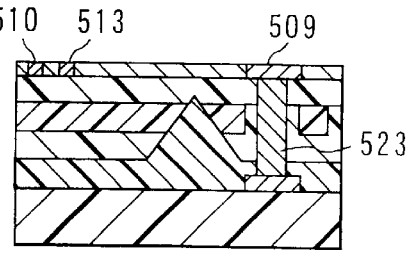
FIG. 28K
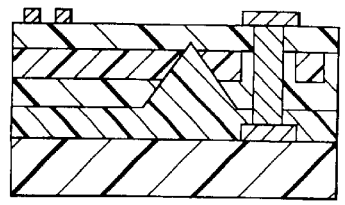
FIG. 28L

OPTICAL WIRING LAYER, OPTOELECTRIC WIRING SUBSTRATE, MOUNTED SUBSTRATE, AND METHODS FOR MANUFACTURING THE SAME

CROSS-REFERENCE TO RELATED APPLICATIONS

This application is based upon and claims the benefit of priority from the prior Japanese Patent Applications No. 11-088569, filed Mar. 30, 1999; and No. 11-096060, filed Apr. 2, 1999, the entire contents of which are incorporated herein by reference.

BACKGROUND OF THE INVENTION

The present invention relates to an optical wiring layer through which light propagates, an optoelectric wiring substrate comprising the optical wiring layer and a substrate having an electric wiring, a mounted substrate in which an optical part or the like is mounted on the optoelectric wiring substrate, and methods for manufacturing each of these structures.

In the field of electric elements such as semiconductor large-scale integrated circuits (LSI), the degree of integration of transistors has been increasing. Some semiconductor large-scale integrated circuits Among these LSIs are those which operate at so high a clock frequency as 1 GHz.

To mount highly integrated electric elements on an electric wiring substrate, packages such as BGAs (Ball Grid Arrays) and CSPs (Chip Size Packages) have been developed and put to practical use.

In general, the inter-element signal speed outside an electric element increases linearly with the clock frequency inside the electric element. The increase in inter-element signal speed induces noise such as reflection arising from the inappropriate shape of an electric wiring joining elements together, or cross talk. Another problem may occur that this increase causes an increased amount of electromagnetic waves to be generated from the electric wiring to adversely affect the surroundings. Thus, in constructing systems, the signal speed between electric elements is diminished enough to prevent these problems. As a result, highly integrated electric elements cannot fully provide their functions.

In order to solve these problems, the following methods have been contemplated: Part of an electric wiring on an electric wiring substrate is replaced with an optical wiring comprised of optical fibers so that optical signals are used instead of electric signals. This is because optical signals do not cause noise or electromagnetic waves.

An example of this method if disclosed in Japanese Laid-Open Patent Publication (Kokai) No. 9-236731. This is a method for forming optical waveguides on an electric wiring substrate. Specifically, optical waveguides are directly formed on a ceramic multilayer wiring substrate (in the order of a clad layer, a core pattern, and a clad layer).

Multiple layers of electric wirings, however, are formed on a surface of the electric wiring substrate, which acts as an under layer of the optical wiring layer. This electric wiring forms very large recesses and projections. Thus, disadvantageously, when the optical waveguides are formed on the electric wiring substrate, the propagation loss of optical waves increases.

BRIEF SUMMARY OF THE INVENTION

The present invention is provided in view of these circumstances, and it is an object thereof to provide an optical wiring layer, an optoelectric wiring substrate, a mounted substrate, and methods for manufacturing these structures wherein the propagation loss of optical signals is small and wherein high-density mounting and size reduction can be achieved.

The present invention is an optoelectric substrate comprising a substrate having an electric wiring and an optical wiring layer laminated on the substrate, the optical wiring layer comprising: a core through which light propagates; a clad for holding the core; a mirror for reflecting light propagating through the core; first conductive installation means formed on a surface of the optical wiring layer for installing light-receiving means for receiving light reflected by the mirror or light-emitting means for emitting light toward the mirror; and connection means for electrically connecting the first conductive installation means to the electric wiring.

According to this optoelectric wiring substrate, an optical wiring layer is laminated on a substrate having an electric wiring, in addition, conductive installation means, which install an optical part on the optical wiring layer, are provided. The optical part installed on the conductive installation means is electrically connected to the electric wiring.

Accordingly, with this configuration, the optical wiring layer is laminated on the substrate with the electric wiring. As a result, high-density mounting and size reduction can be achieved.

Another optoelectric wiring substrates according to present invention are as follows:

(1) The present invention is An optoelectric substrate comprising a substrate having an electric wiring and an optical wiring layer laminated on the substrate, the optical wiring layer comprising: a core through which light propagates; a clad for holding the core; a mirror for reflecting light propagating through the core; second conductive installation means formed on a surface of the optical wiring layer for installing an electric part; and connection means for electrically connecting the second conductive installation means to the electric wiring.

According to this optoelectric wiring substrate, an optical wiring layer is laminated on a substrate having an electric wiring, in addition, conductive installation means, which install an electric part on the optical wiring layer, are provided. The electric part installed on the conductive installation means is electrically connected to the electric wiring.

Accordingly, with this configuration, high-density mounting and size reduction can be achieved.

(2) The present invention is an optoelectric substrate comprising a substrate having an electric wiring and an optical wiring layer laminated on the substrate, the optical wiring layer comprising: a core through which light propagates; a clad for holding the core a mirror for reflecting light propagating through the core; first conductive installation means formed on a surface of the optical wiring layer for installing light-receiving means for receiving light reflected by the mirror or light-emitting means for emitting light toward the mirror; second conductive installation means formed on the optical wiring layer surface for installing an electric part; connection means for each of the conductive installation means to the electric wiring.

According to this optoelectric wiring substrate, an optical wiring layer is laminated on a substrate having an electric wiring, in addition, first conductive installation means for installing an optical part and second conductive installation means for installing an electric part, are provided. The optical part and the electric part installed on each of the conductive installation means are electrically connected to the electric wiring.

Accordingly, with this configuration, high-density mounting and size reduction can be achieved.

(3) The present invention is an optoelectric substrate comprising a substrate having an electric wiring and an optical wiring layer laminated on the substrate, the optical wiring layer comprising a first clad; a first core formed on the first clad through which light propagates; a mirror for reflecting light propagating through the first core; a second core formed on the first clad using a material identical to that of the first core; first conductive installation means laminated on the second core for installing light-receiving means for receiving light reflected by the mirror or light-emitting means for emitting light toward the mirror; connection means for electrically connecting the first conductive installation means to the electric wiring, and a second clad for holding at least one of the first clad, the first core, the mirror, the second core, and the connection means.

According to this optoelectric wiring substrate, an optical wiring layer is laminated on a substrate having an electric wiring, in addition, conductive installation means, which install an optical part on the optical wiring layer, are provided. The optical part installed on the conductive installation means is electrically connected to the electric wiring.

Accordingly, with this configuration, high-density mounting and size reduction can be achieved.

(4) The present invention is an optoelectric substrate comprising an optical wiring layer laminated on a substrate having an electric wiring, the optical wiring layer comprising a first clad; a first core formed on the first clad through which light propagates; a mirror for reflecting light propagating through the first core; a second core formed on the first clad using a material identical to that of the first core; second conductive installation means laminated on the second core for installing an electric part; connection means for electrically connecting the second conductive installation. means to the electric wiring, and a second clad for holding at least one of the first clad, the first core, the mirror, the second core, and the connection means.

According to this optoelectric wiring substrate, an optical wiring layer is laminated on a substrate having an electric wiring, in addition, conductive installation means, which install an electric part on the optical wiring layer, are provided. The electric part installed on the conductive installation means is electrically connected to the electric wiring.

Accordingly, with this configuration, high-density mounting and size reduction can be achieved.

(5) The present invention is an optoelectric substrate comprising an optical wiring layer laminated on a substrate having an electric wiring, the optical wiring layer comprising a first clad; a first core formed on the first clad through which light propagates; a mirror for reflecting light propagating through the first core; a second core formed on the first clad using a material identical to that of the first core; first conductive installation means formed on the second core for installing light-receiving means for receiving light reflected by the mirror or light-emitting means for emitting light toward the mirror; second conductive installation means formed on the second core for installing an electric part; connection means for electrically connecting the each of the connection means to the electric wiring, and a second clad for holding at least one of the first clad, the first core, the mirror, the second core, and the connection means.

According to this optoelectric wiring substrate, an optical wiring layer is laminated on a substrate having an electric wiring, in addition, first conductive installation means for installing an optical part and second conductive installation means for installing an electric part, are provided. The optical part and the electric part installed on each of the conductive installation means are electrically connected to the electric wiring.

Accordingly, with this configuration, high-density mounting and size reduction can be achieved.

(6) The present invention is an optoelectric wiring substrate comprising: a substrate having an electric wiring; a first optical wiring layer laminated on one of the surfaces of the substrate and having a core through which light propagates and a clad for holding the core; a second optical wiring layer laminated on the other surface of the substrate and having a core through which light propagates and a clad for holding the core; a third optical wiring layer penetrating the substrate in a perpendicular direction and having a core through which light propagates and a clad for holding the core; a first mirror formed to extend through the first optical wiring layer and the third optical wiring layer for reflecting light; propagating through one of the optical wiring layers, to the other optical wiring layer; and a second mirror formed to extend through the second optical wiring layer and the third optical wiring layer for reflecting light propagating through one of the optical wiring layers, to the other optical wiring layer.

According to this optoelectric wiring substrate, the third optical wiring layer penetrating the substrate in a perpendicular direction is connected the first optical wiring layer laminated on one of the surfaces of the substrate and the second optical wiring layer laminated on the other surface. In each of connection areas between the cores, a mirror for reflecting light propagating through one of the optical wiring layers to the other optical wiring layer is provided.

Accordingly, with this configuration, light is reflected by the mirror and propagates the third optical wiring layer so that light can propagate from one of the surfaces to the other surface.

Incidentally, it is preferable that each of the optoelectric wiring substrates further comprises alignment means formed a material to that of the core for using alignment with the substrate having the electric wiring.

Furthermore, it is preferable that each of the optoelectric wiring substrate further comprises alignment means formed a material to that of the first core for using alignment on forming of the mirror.

The above construction can implement an optical wiring layer, an optoelectric wiring substrate, a mounted substrate, and methods for manufacturing these structures wherein the propagation loss of optical signals is small and wherein high-density mounting and size reduction can be achieved.

In addition, the present invention is an optical wiring layer comprising: a first optical wiring layer having a core through which light propagates and a clad for holding the core; a second optical wiring layer having a core through which light propagates and a clad for holding the core, the second optical wiring layer being connected to the first optical wiring layer at a predetermined angle; and a mirror formed to extend through the first optical wiring layer and the second optical wiring layer for reflecting light propagating through one of the cores, to the other core.

According to this optical wiring layer, the second optical layer is connected to the first optical layer at a predetermined angle. In connection area between the cores, a mirror, which reflects light propagating through one of the cores, to the other core, is formed.

Furthermore, it is possible that the present invention is an optoelectric wiring substrate comprising: the optical wiring layer according to claim 14; and a substrate having an electric wiring on which the optical wiring layer is laminated.

Accordingly, with this configuration, high-density mounting and size reduction can be achieved.

Furthermore, it is possible that the present invention is a mounted substrate comprising: the optical wiring substrate and an optical part installed on the first conductive installation means for receiving light reflected by the mirror or emitting light toward the mirror.

Accordingly, with this configuration, high-density mounting and size reduction can be achieved.

Furthermore, it is possible that the present invention is a mounted substrate comprising: the optical wiring substrate; and an electric part installed on the second conductive installation means for receiving light reflected by the mirror or emitting light toward the mirror.

Accordingly, with this configuration, high-density mounting and size reduction can be achieved.

The above construction can implement an optical wiring layer, an optoelectric wiring substrate, a mounted substrate, and methods for manufacturing these structures wherein the propagation loss of optical signals is small and wherein high-density mounting and size reduction can be achieved.

The present invention is a method for manufacturing an optoelectric wiring substrate, comprising the steps of: forming an optical wiring layer on a smooth first support substrate; forming a mirror for reflecting light propagating through the optical wiring layer; releasing the optical wiring layer from the smooth first support substrate and sticking the optical wiring layer on a substrate having an electric wiring; and forming conductive installation means on the optical wiring layer for installing an optical or electric part to be mounted on the optoelectric wiring substrate, the conductive installation means being electrically connected to the electric wiring.

According to this method for manufacturing an optoelectric wiring substrate, after being manufactured on the flat first support substrate, the optical wiring layer is stuck to the substrate with the electric wiring. Thus, the effect of recesses and projections of the electric wiring on the substrate can be lessened compared to an optical wiring layer directly manufactured on the substrate with an electric wiring).

Another optoelectric wiring substrates according to present invention are as follows:

(1) The present invention is a method for manufacturing an optoelectric wiring substrate, comprising the steps of: forming an optical wiring layer on a smooth first support substrate; releasing the optical wiring layer from the smooth first support substrate, and sticking a surface of the optical wiring layer on a smooth second support substrate using a first adhesive; applying a second adhesive to one of substrates having an electric wiring; sticking the other surface of the optical wiring layer on the second adhesive; and releasing the smooth second support substrate and the first adhesive from the optical wiring layer.

According to this method for manufacturing an optoelectric wiring substrate, the optical wiring layer is fixed to the smooth second support substrate so as to be stuck to the electric wiring substrate while maintaining its smoothness.

With this configuration, the optical wiring layer of the optoelectric wiring substrate is not affected by the unevenness of the underlying electric wiring substrate surface. The propagation loss of optical signals can be minimized.

(2) The present invention is a method for manufacturing an optoelectric wiring substrate, comprising the steps of: forming an optical wiring layer on a smooth second support substrate; applying a adhesive to a substrate having an electric wiring; sticking the optical wiring layer on the adhesive; and releasing the smooth second support substrate from the optical wiring layer.

According to this method for manufacturing an optoelectric wiring substrate, the optical wiring layer is fixed to the smooth second support substrate so as to be stuck to the electric wiring substrate while maintaining its smoothness.

With this configuration, the optical wiring layer of the optoelectric wiring substrate is not affected by the unevenness of the underlying electric wiring substrate surface. The propagation loss of optical signals can be minimized.

(3) The present invention is a method for manufacturing an optoelectric wiring substrate comprising the step of: forming a first through-hole in a substrate having an electric wiring; forming first clads on both surfaces of the substrate and filling a clad in the first through-hole; forming a second through-hole in the first through-hole which has a smaller inner diameter than the first through-hole; covering the clad with a core layer to fill the second through-hole with a core, in order to obtain an optical wiring extending along the substrate and an optical wiring penetrating the optical wiring; removing portions of the core layer which are not used as the optical wirings, in order to expose the first clad; forming a second clad on exposed portions of the first clad and core layer, the second clad having a refractive index equal to that of the first clad; and forming a mirror for reflecting light from the optical wiring extending along the substrate to the optical wiring penetrating the optical wiring.

In addition, the present invention is a method for manufacturing an optoelectric wiring substrate comprising the step of: forming a release film on a smooth support substrate; forming a first optical wiring layer on the release layer which comprises a first core through which light propagates in a first direction and a clad for holding the first core; forming a hole in the first optical wiring layer which is inclined at a predetermined angle relative to the first optical wiring layer; filling a core in the hole to form a second core through which light propagates in a second direction; forming a mirror such that light from the first core is incident on the second core for reflecting light propagating through one of the optical wiring layers, to the other optical wiring layer; and releasing the optical wiring layers from the smooth support substrate.

The optoelectric wiring substrates according to each of the method of manufacturing can guide light from one surface of the substrate having the electric wiring to the other surface.

The above construction can implement an optical wiring layer, an optoelectric wiring substrate, a mounted substrate, and methods for manufacturing these structures wherein the propagation loss of optical signals is small and wherein high-density mounting and size reduction can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 28A to 28L show each step of another method for manufacturing the optical wiring layer substrate 80.

DETAILED DESCRIPTION OF THE INVENTION

A first to a sixth embodiments of the present invention will be described below with reference to the drawings.

First Embodiment

The embodiments of the present invention will be explained below with reference to the drawings.

An important point of the optoelectric wiring substrate shown in the first embodiment is the concept that an optical wiring layer in which optical parts (optical elements) are mounted is laminated on a substrate having an electric wiring.

Figure 1:
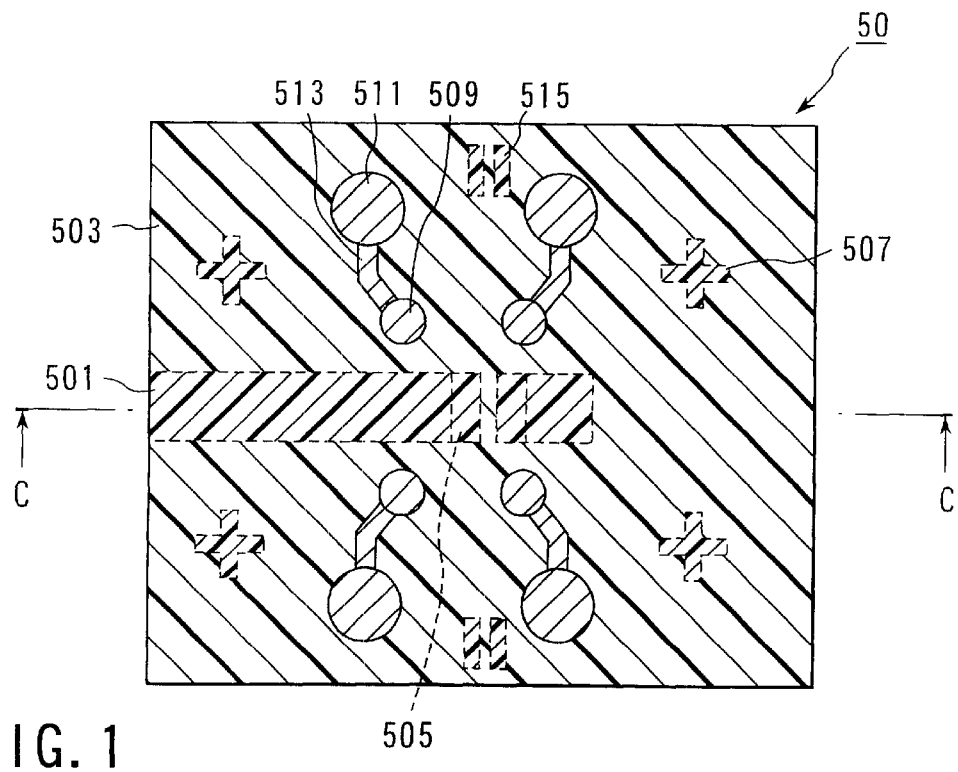
FIG. 1 is a top view of an optoelectric wiring substrate according to a first embodiment as seen from an optical part-mounted side.

FIG. 1 is a top view of an optoelectric wiring substrate 50 according to the first embodiment showing how the optical parts are mounted.

Figure 2A:
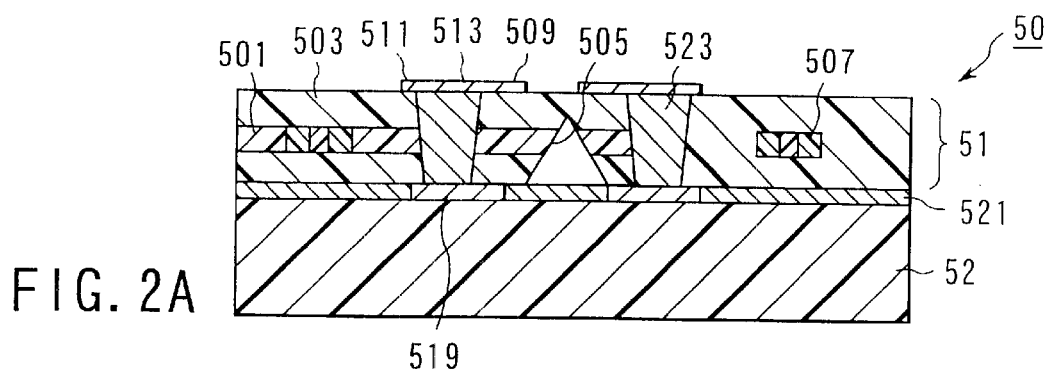
FIG. 2A is a sectional view taken along the direction C—C in FIG. 1.

FIG. 2A is a sectional view taken along the direction C—C in FIG. 1.

As shown in FIGS. 1 and 2, the optoelectric wiring substrate 50 is composed of a substrate 52 and an optical wiring layer 51 laminated thereon.

First, based on FIGS. 1 and 2, the configuration of the optoelectric wiring substrate 50 will be described in the order of an optical wiring system, an electric wiring system, and a connection between the optical and electric wiring systems.

An optical wiring layer 51 consists of a core 501 through which optical signals propagate and a clad 503 that confines optical signals in the core 501. Optical signals propagate through the core 501 by increasing the refractive index of a material forming the core 501 above that of the clad 503.

The core 501 has a mirror 505 installed in such a manner that optical signals are incident at 45°. Optical signals propagate between optical waveguides and an optical part (a laser diodes and a photo diodes) via a mirror 505 (see FIGS. 9A and 9B). An interface of the mirror 505 (the surface opposite to the core 501 side) is brought in contact with a resin having a lower refractive index than the core 501 or with air. Alternatively, a thin metal film may be formed on the interface.

Figure 2B:
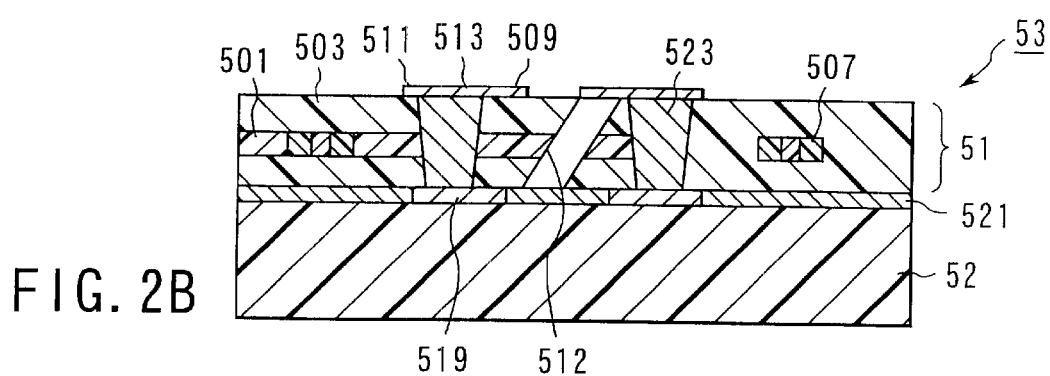
FIG. 2B shows another example of an optoelectric wiring substrate according to the first embodiment.

An optoelectric wiring substrate 53, which is shown in FIG. 2B, shows another example concerning formation of the mirror 505 installed in such a manner that optical signals are incident at 45°. The optoelectric wiring substrates 50 and 53 have the same configuration except for formation of the mirror 505.

The optical wiring layer 51 has pads 509 arranged on its surface and immediately over the mirror 505 in a periphery thereof. The pads 509 electrically connect the substrate 52 to the optical parts provided on the optical wiring layer 51. The number of pads 509 is determined by the number of optical parts installed. Accordingly, the number is not limited to four as shown in FIG. 1, but may be arbitrary. In addition, the shape of the pads is determined by the shape of connection terminals for the installed optical parts. Thus, the shape is not limited to a circle as shown in FIG. 1, but may be arbitrary. In general, the shape of pads may correspond to the shape of solder balls, metallic leads, or the like for connections with the optical parts.

Further, the optical wiring layer 51 has lands 511 and an electric wiring 513 installed on its surface, the electric wiring 513 connecting the lands 511 to the pads 509.

The substrate 52 has an electric wiring 519 on its surface. The substrate 52 may be a single-layer insulating substrate or a multilayered electric wiring substrate. The material of the substrate 52 may be a polyimide film, a substrate comprised of a glass cloth impregnated with an epoxy resin or the like, a ceramic substrate, etc.

The optical wiring layer 51 is fixed to the substrate 52 via an adhesive 521. In addition, the optical parts provided on the optical wiring layer 51 and the electric wiring 519 are electrically connected as follows:

That is, the lands 511 and the electric wiring 519 are electrically connected together via the via holes 523. A electric current from the electric wiring 519 is supplied to the lands 511 via the via holes 532 and further to the pads 509 via an electric wiring 513. The optical parts provided on the optical wiring layer 51 can obtain a required the electric current by means of electric connections with the pads 509.

Although not shown, the electric parts and the electric wiring on the substrate are similarly electrically connected together.

In the optoelectric wiring substrate shown in FIGS. 2A and 2B, the pads 509, the lands 511, and the electric wiring 513 are exposed on the surface of the optical wiring layer 51. On the contrary, optoelectric wirings 55, 57 are shown in FIGS. 3A and 3B wherein the lands 511 and electric wiring 513 on the surface of the optical wiring layer 51 are coated with a resin layer 525 having the same refractive index as the clad 503 and wherein only the portion of the pad 5 for electric connections with the optical parts is exposed.

Differences between a method for manufacturing the optoelectric substances 50, 53 and a method for manufacturing the optoelectric substances 55, 57 and differences in the effects of these substrates will be described below.

Figure 3A:
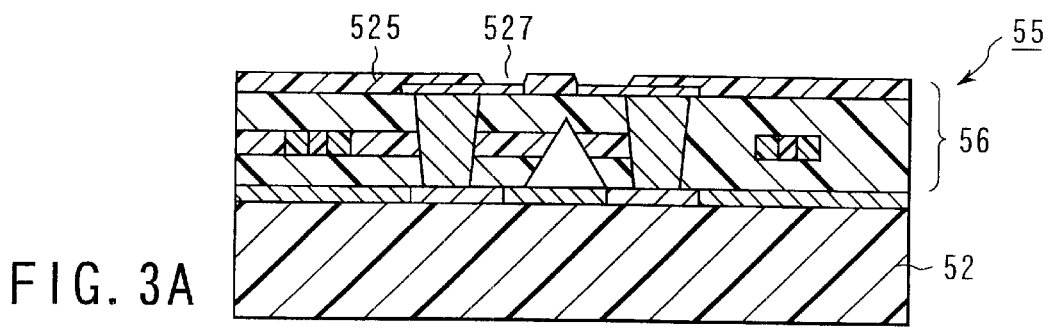
FIGS. 3A and 3B show an optoelectric wiring substrate in which only part of pads 509 for electric connections with an optical part are exposed.
Figure 3B:
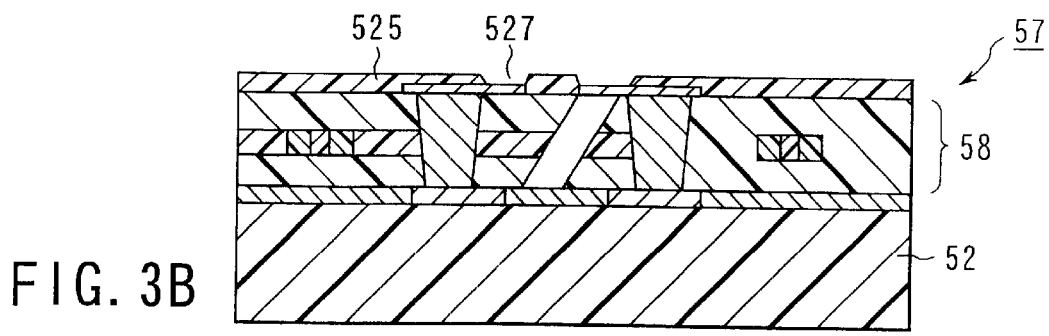

Although not shown in FIGS. 3A and 3B, the pads for electric connections with the electric pads must be similarly exposed.

Next, alignment of the optoelectric wiring substrate according to the present invention will be explained.

Since the present invention is the optoelectric wiring substrate in which the optical parts are mounted, alignment between the substrate and the optical parts is important.

Thus, each of the optoelectric wiring substances 50, 53, 55, 57 has alignment marks 507 formed thereon for determining the positions of the pads 509 for mounting the optical parts and alignment marks 515 for determining the position of the mirror 505. These alignment marks are formed simultaneously with the core 501 as described below.

Figure 4:
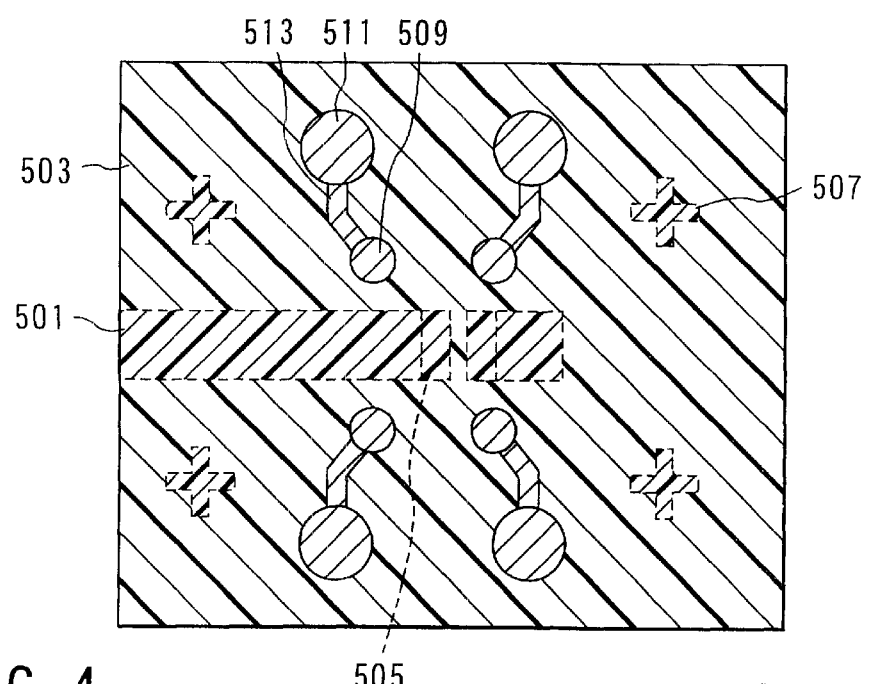
FIG. 4 is a top view of an optoelectric wiring substrate with no alignment mark formed therein as seen from the optical part-mounted side.

Although not explained in this embodiment, the alignment marks may be provided as required. If, for example, alignment marks 515 are not formed, the surface of the optoelectric wiring substrate 59 on which the optical parts are mounted is as shown in FIG. 4.

2. Method for Manufacturing an Optoelectric Wiring Substrate

Next, a method for manufacturing an optoelectric wiring substrate according to the present invention will be explained.

A summary of the method for manufacturing an optoelectric wiring substrate according to the present invention will be given below.

First, an optical wiring layer is produced on a support substrate that is separate from a substrate having an electric wiring. At this point, a core and alignment marks are simultaneously produced using the photolithography technology.

Next, a mirror is provided in part of the core using the alignment marks as references.

Next, the optical wiring layer is stuck to the substrate.

Next, using the alignment marks as references, pads are formed on the optical wiring layer, the pads being electrically connected to the electric wiring on the substrate via the via holes.

An import point of this manufacturing method is that the method comprises the step of producing the optical wiring layer on the separate support substrate beforehand and the step of sticking this layer to the electric wiring substrate. Thus, this method does not include the step of producing an optical wiring by directly stacking it on an insulated substrate having recesses and projections as well as an electric wiring. Due to these steps, the optical wiring layer serves to lessen the effect of recesses and projections on the underlying electric wiring substrate, thereby reducing the loss of optical signals arising from this unevenness.

Three examples of manufacturing methods will be described below in further detail with reference to the drawings.

<Method 1—1 for Manufacturing an Optoelectric Wiring Substrate>

A first example shows a method for manufacturing an optoelectric wiring substrate 50, which is shown in FIG. 2A. This method will be described below with reference to FIGS. 5A to 5O.

Figure 5A:
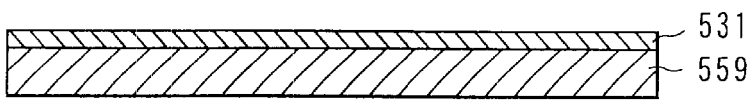
FIGS. 5A to 5O show each step of a method for manufacturing an optoelectric wiring substrate 50.
Figure 5B:
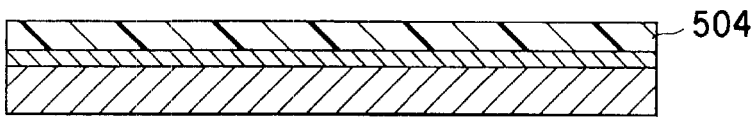
Figure 5C:
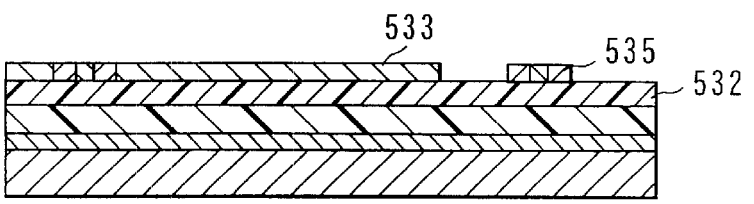
Figure 5D:
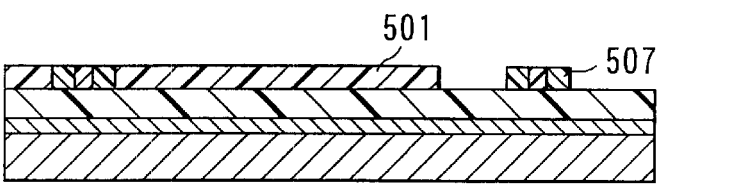
Figure 5E:
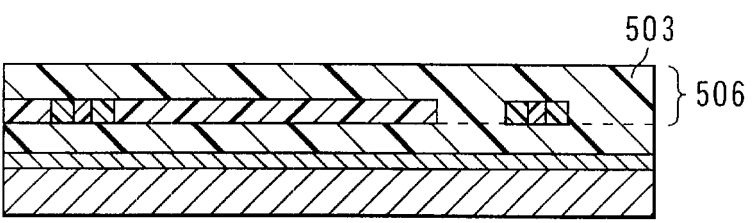
Figure 5F:
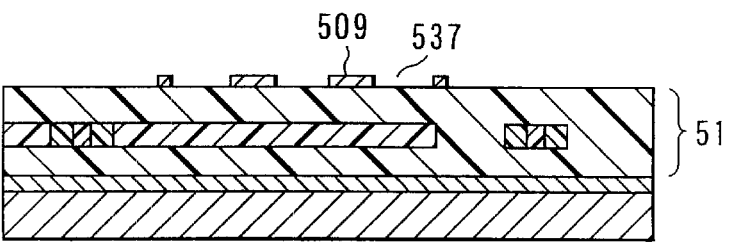
Figure 5G:
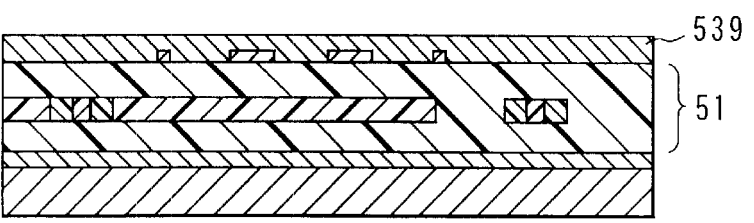
Figure 5H:
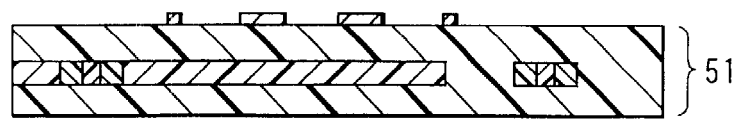
Figure 5I:
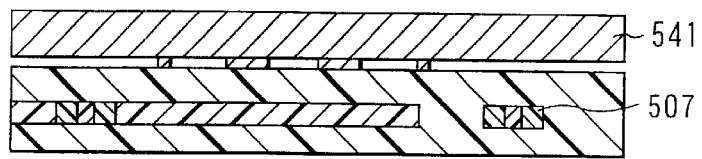
Figure 5J:
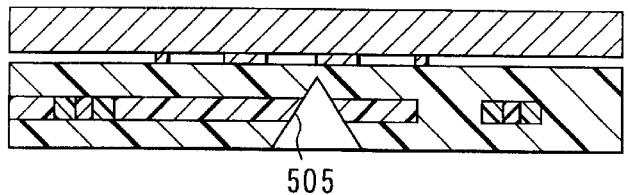
Figure 5K:
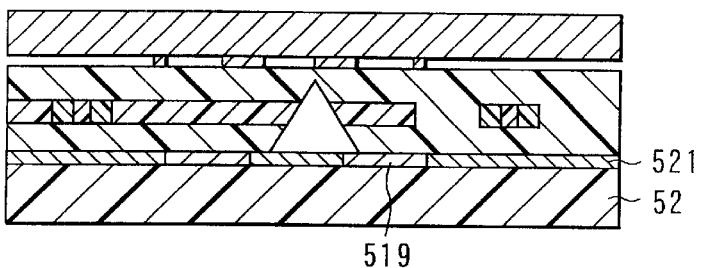
Figure 5L:
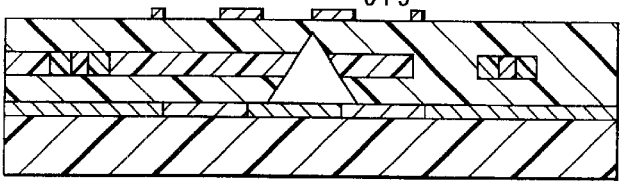
Figure 5M:
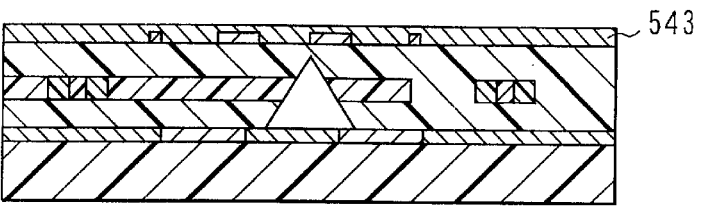
Figure 5N:
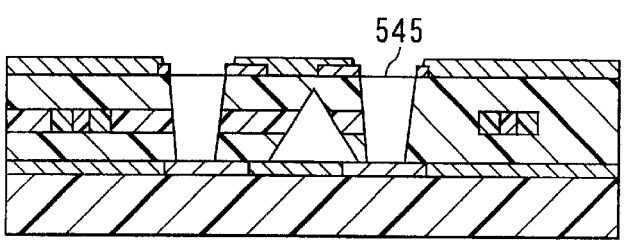
Figure 5O:
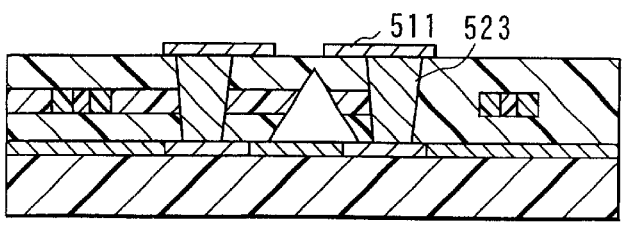

FIGS. 5A to 5O show each step of the method for manufacturing the optoelectric wiring substrate 50 and are arranged in the order of the steps.

First, as shown in FIG. 5A, a thin film layer of Cr and Cu is sputtered as a release layer 531 on a support substrate 559 that is a silicon wafer, and about 10 $\mu$m of Cu layer is subsequently formed thereon in a copper sulfate plating bath.

Next, as shown in FIG. 5B, Polyimide OPI-N1005 (manufactured by Hitachi Chemical Industry Inc.) is spin-coated on the release layer 531 as a first clad 504 and imidized at 350° C. At this point, the film thickness is, for example, about 20 $\mu$m.

As shown in FIG. 5C, Polyimide OPI-N1305 (manufactured by Hitachi Chemical Industry Inc.) is similarly spin-coated on the first clad 504 as a core layer 532 and imidized at 350° C. At this point, the film thickness is, for example, about 8 $\mu$m. The materials of the core 501 (core layer 532) and the first clad 504 (the clad 503), which constitute an optical wiring layer 51, need not necessarily be the polyimide resins. The materials may be polymeric materials such as fluorinated or deuterated epoxy resins, ester methacrylate resins, or the like which are subject to fewer losses in the wavelength of light used for optical signals.

Further, Al is deposited on a surface of the core layer 532, a predetermined photo resist pattern is formed, and Al metal masks 533 and 535 are formed by means of etching. The metal mask 533 corresponds to a pattern of a core 501 that will be an optical wiring. In addition, the metal mask 535 corresponds to a pattern of alignment marks 507.

Next, as shown in FIG. 5D, an oxygen gas is used to etch the core layer 532 by means of reactive ion etching. Further, the Al film, which is the metal masks, is etched off to simultaneously form the pattern of the core 501 (optical wiring) and the pattern of the alignment marks 507. At this point, the line width of the core 501 pattern is, for example, 8 $\mu$m. In addition, its cross section is a square, for example, 8 $\mu$m in height and 8 $\mu$m in width. The size of the cross section of the core 501 are not limited to this but may be between 5 and 100 $\mu$m depending on differences in transmission mode and in refractive index between the core and the clad.

As shown in FIG. 5E, OPI-1005 is coated and imidized as a second clad 506. This step is similar to that for the first clad 504. At this point, the clad has a thickness of 20 $\mu$m, for example, on the core optical wiring layer. Thus, the clad 503 which comprises the first clad 504 and the second clad 506 is formed Then, as shown in FIG. 5F, a thin metal film of Cr and Cu is sputtered on a surface of the second clad 506. In addition, about 10 $\mu$m of a Cu layer is formed in a copper sulfate plating bath. Further, a photo resist pattern is formed using the photolithography technique, and is etched using an etchant. As a result, pads 509, an electric wiring 513, and lands 511 can be formed. Previously formed openings 537 are shown with the lands 511 in FIG. 5E. Hole sections for forming via holes 523 are formed later in these openings 537 by means of a laser. In addition, although not shown, at the same time, pads, an electric wiring, and lands for connections with electric parts are formed.

Next, a photo resist 539 is coated as a protect film as shown in FIG. 5G. This film protects the pads, 509, electric wiring 513, and lands 511, which are formed of copper, from a release agent.

Next, the Cu layer in the release layer 531 is dissolved using a ferric chloride liquid as a release agent, and the optical wiring layer is released to produce an optical wiring film, as shown in FIG. 5H.

As shown in FIG. 5I, the side of the optical wiring layer 51 on which the pads 509, the electric wiring 513, and the lands 511 are formed is stuck to a second support 541 using an adhesive. In this case, the second support 541 had better be transparent so that the alignment marks 507 can be seen from the side of the optical wiring layer 51 which is not stuck to the second support. In addition, the adhesive must be easy to release or be likely to have its adhesive strength reduced when hardened by means of ultraviolet rays.

As shown in FIG. 5J, in forming the core 501 pattern, a mirror 34 is mechanically formed in part of the core 501 pattern at an angle of 45° relative to the substrate 52 using the alignment marks 507 (refer to FIG. 4) as references.

As shown in FIG. 5K, as an adhesive 521, a modified polyimide resin exhibiting a thermal plasticity is coated and dried on the substrate 52 with the electric wiring 519. Then, the surface of the optical wiring layer on which the mirror has been formed is stuck to the substrate 52 and heated for adhesion.

Next, the structure is irradiated with ultraviolet rays to release the second support 541, as shown in 5L.

Then, a plated resist 543 is coated on the optical wiring layer 51 as a protect film, as shown in FIG. 5M.

As shown in FIG. 5N, at the openings 537 of the lands 511, which correspond to positions at which the via holes 523 are to be formed, holes 545 for the via holes 523 are formed by means of a laser. In this case, suitable lasers include an excimer laser, a carbon dioxide laser, a YAG laser, etc.

As shown in FIG. 5O, a thin metal film of cr and Cu is sputtered on the surface of the optical wiring layer 51 and on internal surfaces of the laser-processed holes 545. Then, this thin metal film is used as an electrode to plate the inside of the via holes 523 and the land 511 sections with copper in a copper sulfate plating bath. Finally, the plated resist 543, which is a protect film, is removed, and the via holes 523 and the lands 511 are formed to obtain the optoelectric wiring substrate 50 shown in FIG. 2A.

<Method 2 for Manufacturing an Optoelectric Wiring Substrate>

A second example of a method for manufacturing an optoelectric wiring substrate is another method for manufacturing the optoelectric wiring substrate 50 shown in FIG. 2A. This method will be described below with reference to FIGS. 6A to 6M.

FIGS. 6A to 6M show each step of this method for manufacturing the optoelectric wiring substrate 50 and are arranged in the order of the steps.

Figure 6A:
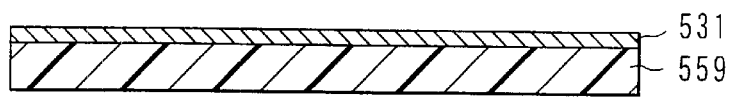
FIGS. 6A to 6M show each step of another method for manufacturing the optoelectric wiring substrate 50.

First, as shown in FIG. 6A, a thin film layer of Cr and Cu is sputtered as a release layer 531 on a substrate 52 that is a silicon wafer, and about 10 $\mu$m of Cu layer is subsequently formed thereon in a copper sulfate plating bath.

Figure 6B:
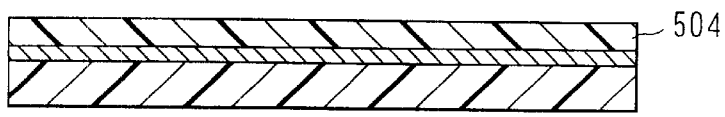

Next, as shown in FIG. 6B, Polyimide OPI-N1005 (manufactured by Hitachi Chemical Industry Inc.) is spin-coated on the release layer 531 as a first clad 504 and imidized at 350° C. At this point, the film thickness is, for example, about 20 $\mu$m.

Figure 6C:
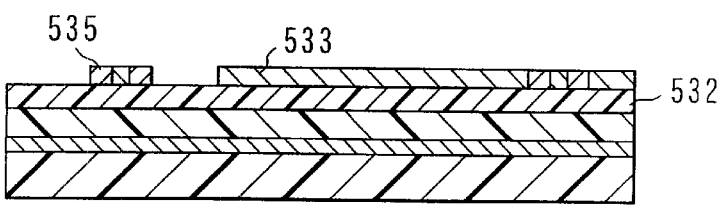

As shown in FIG. 6C, Polyimide OPI-N1305 (manufactured by Hitachi Chemical Industry Inc.) is similarly spin-coated on the first clad 504 as a core layer 532 and imidized at 350° C. At this point, the film thickness is, for example, about 8 μm. The materials of the core 501 (core layer 532) and clad 503, which constitute an optical wiring layer, need not necessarily be the polyimide resins. The materials may be polymeric materials such as fluorinated or deuterated epoxy resins, ester methacrylate resins, or the like which are subject to fewer losses in the wavelength of light used for optical signals.

Further, Al is deposited on a surface of the core layer 532, and a predetermined photo resist pattern is formed and etched to form Al metal masks 533 and 535. The metal mask 533 corresponds to a pattern of a core 501 that will be an optical wiring. In addition, the metal mask 535 corresponds to a pattern of alignment marks 507.

Figure 6D:
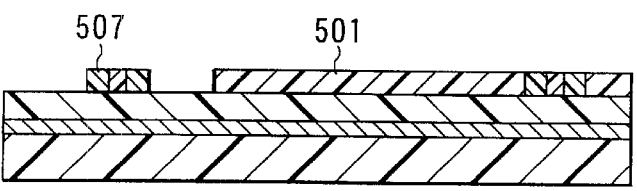

Next, as shown in FIG. 6D, an oxygen gas is used to etch the core layer 532 by means of reactive ion etching. Further, the Al film, which is the metal masks, is etched off to simultaneously form the pattern of the core 501 (optical wiring) and the pattern of the alignment marks 507. At this point, the line width of the core 501 pattern is, for example, 8 μm. In addition, its cross section is a square, for example, 8 μm in height and 8 μm in width. The size of the cross section of the core 501 are not limited to this but may be between 5 and 100 μm depending on differences in transmission mode and in refractive index between the core and the clad.

Figure 6E:
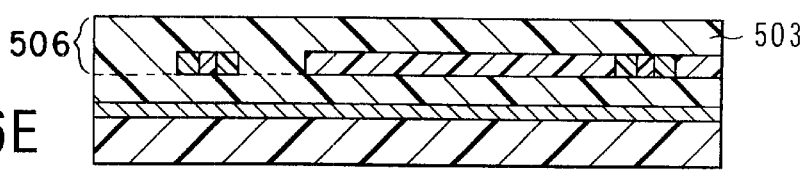

As shown in FIG. 6E, OPI-1005 is coated and imidized as a second clad 506. This step is similar to that for the first clad 504. At this point, the clad has a thickness of 20 μm, for example, on the core optical wiring layer.

Figure 6F:
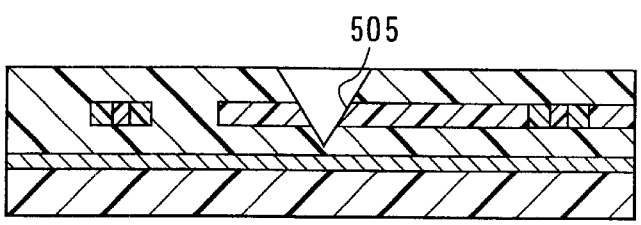

Then, as shown in FIG. 6F, in forming the core 501 pattern, a mirror 505 is mechanically formed in part of the core 501 pattern at an angle of 45° relative to the substrate 52 using the simultaneously formed alignment marks (refer to FIG. 4) as references.

Figure 6G:
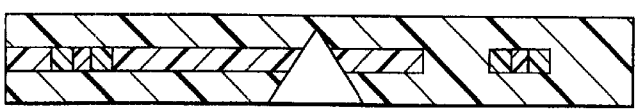

Next, the Cu layer in the release layer is dissolved using a ferric chloride liquid as a release agent, and the optical wiring layer is released to produce an optical wiring film, as shown in FIG. 6G.

Figure 6H:
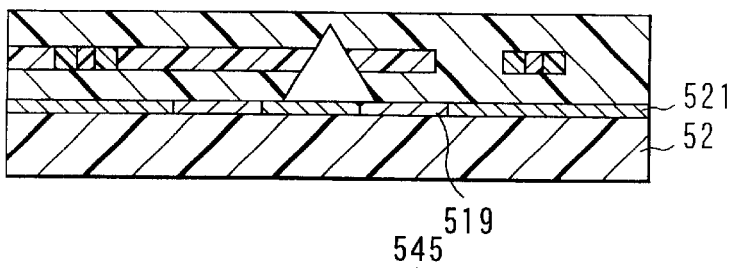

As shown in FIG. 6H, as an adhesive 521, a modified polyimide resin exhibiting thermal plasticity is coated and dried on the substrate 52 with the electric wiring 519. Then, the surface of the optical wiring layer on which a mirror has been formed is stuck to the substrate 52 and heated for adhesion.

Figure 6I:
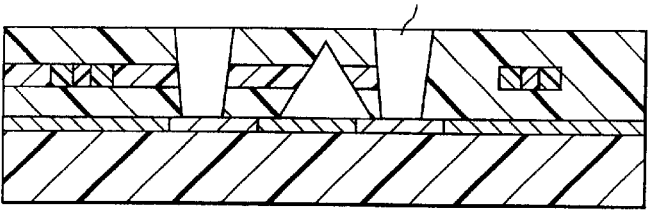

As shown in FIG. 6I, at positions at which via holes 523 are to be formed, holes 545 are formed by means of a laser. In this case, suitable lasers include an excimer laser, a carbon dioxide laser, a YAG laser, etc.

Figure 6J:
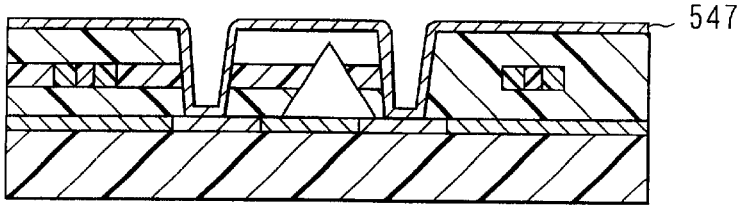

As shown in FIG. 6J, a thin metal film 547 of Cr and Cu is sputtered on a surface of the optical wiring layer 51 and on internal surfaces of the laser-processed holes 545.

Figure 6K:
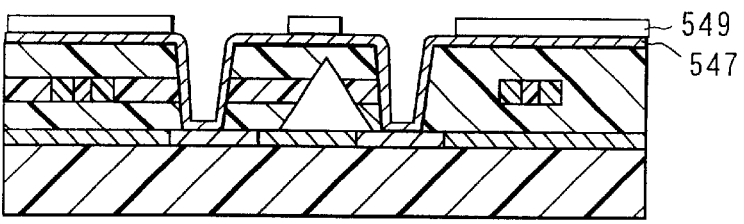
Figure 6L:
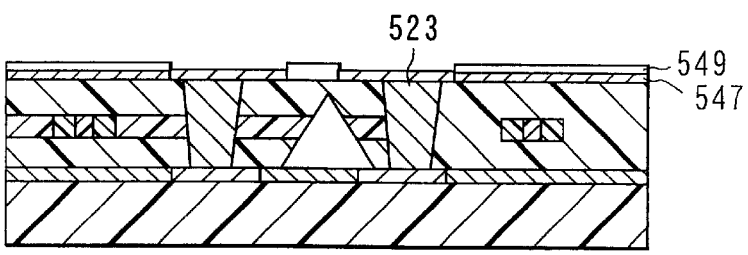

A plated resist pattern 543 (protect film 549) is formed on the optical wiring layer surface except for pads 509, lands 511, and an electric wiring 513, as shown in FIG. 6K.

As shown in FIG. 6I, the thin metal film 547 is used as an electrode to plate the inside of the via holes 523, the pads 509, the lands 511, and the electric wiring 513 with copper in a copper sulfate plating bath.

Figure 6M:
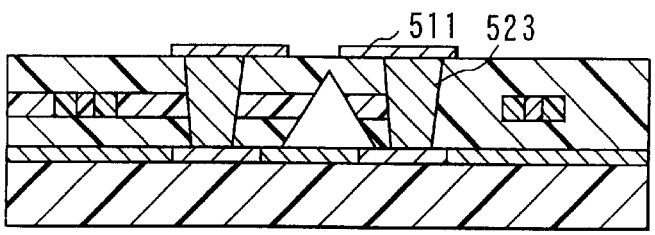

As shown in FIG. 6M, the plated resist 543 is removed and the thin metal film 547 is further removed by means of soft etching. Then, the via holes 523, the pads 509, the lands 511, and the electric wiring are formed to obtain the optoelectric wiring substrate 50.

<Method 3 for Manufacturing an Optoelectric Wiring Substrate>

A third example of a method for manufacturing an optoelectric wiring substrate is a method for manufacturing an optoelectric wiring substrate 53, which is shown in FIG. 2B. This method will be described below with reference to FIGS. 7A to 7P.

Figure 7A:
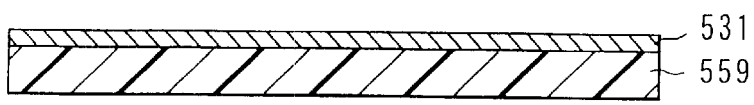
FIGS. 7A to 7P show each step of another method for manufacturing an optoelectric wiring substrate 53.
Figure 7B:
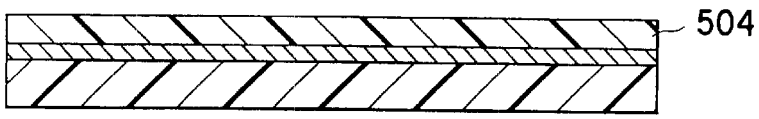
Figure 7C:
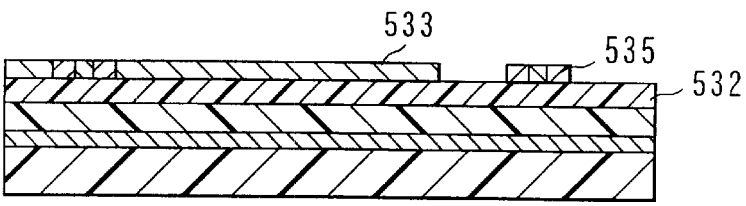
Figure 7D:
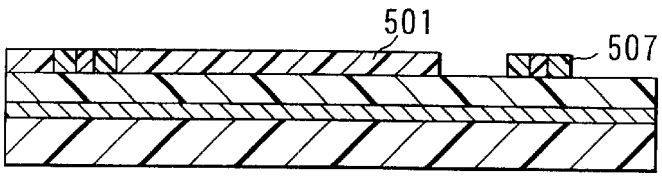
Figure 7E:
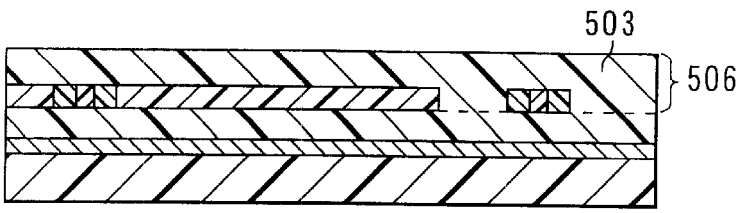
Figure 7F:
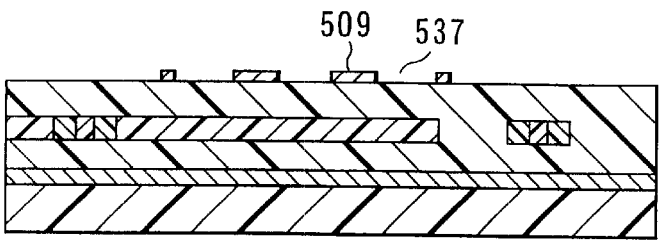
Figure 7G:
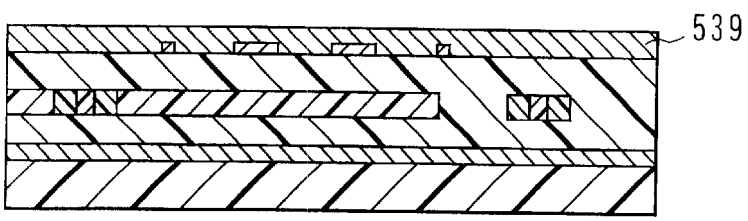
Figure 7H:
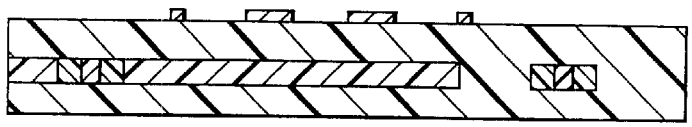
Figure 7I:
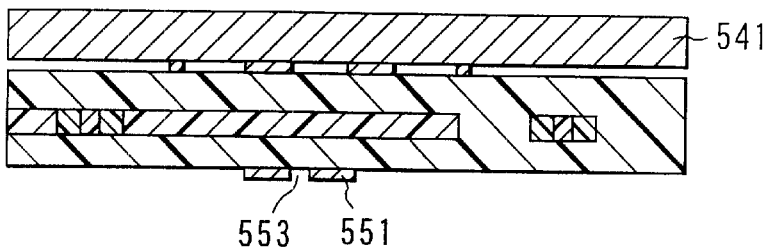
Figure 7J:
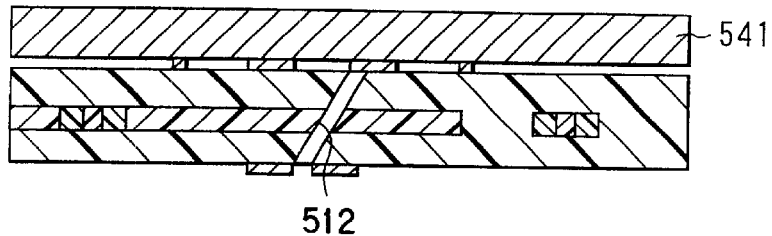
Figure 7K:
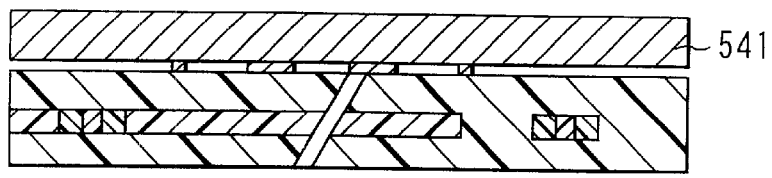
Figure 7L:
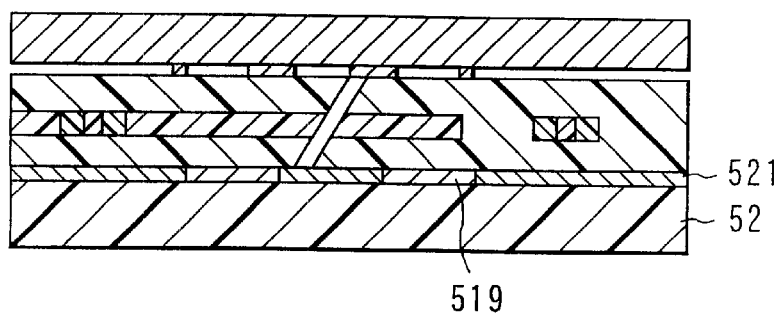
Figure 7M:
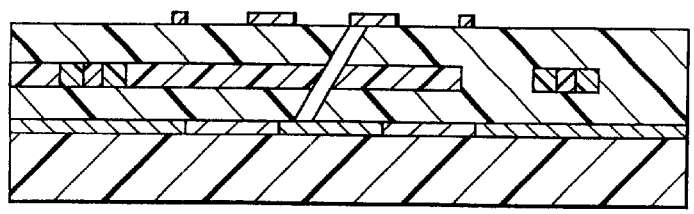
Figure 7N:
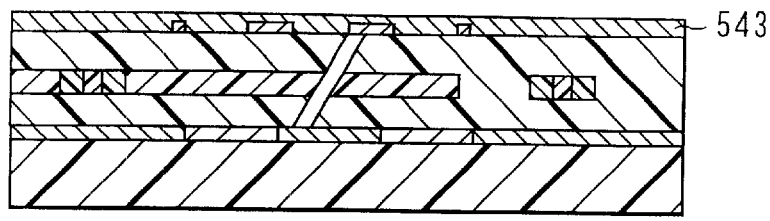
Figure 7O:
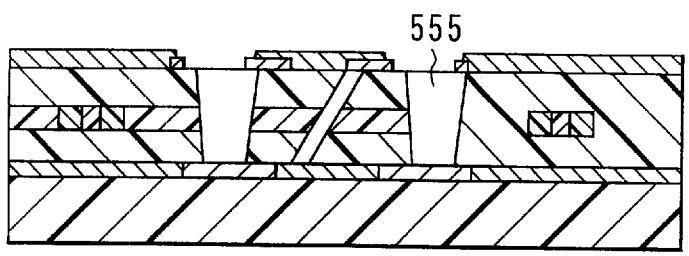
Figure 7P:
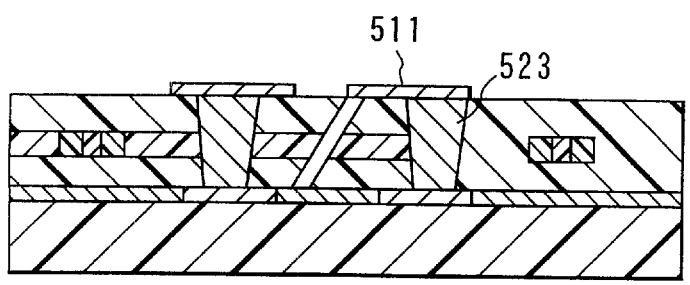

FIGS. 7A to 7P show each step of the method for manufacturing the optoelectric wiring substrate 53 and are arranged in the order of the steps.

First, as shown in FIG. 7A, a thin film layer of Cr and Cu is sputtered as a release layer 531 on a substrate 52 that is a silicon wafer, and about 10 μm of Cu layer is subsequently formed thereon in a copper sulfate plating bath.

Next, as shown in FIG. 7B, Polyimide OPI-N1005 (manufactured by Hitachi Chemical Industry Inc.) is spin-coated on the release layer 531 as a first clad 504 and imidized at 350° C. At this point, the film thickness is, for example, about 20 μm.

As shown in FIG. 7C, Polyimide OPI-N1305 (manufactured by Hitachi Chemical Industry Inc.) is similarly spin-coated on the first clad 504 as a core layer 532 and imidized at 350° C. At this point, the film thickness is, for example, about 8 μm. The materials of the core 501 (core layer 532) and clad 503, which constitute an optical wiring layer, need not necessarily be the polyimide resins. The materials may be polymeric materials such as fluorinated or deuterated epoxy resins, ester methacrylate resins, or the like which are subject to fewer losses in the wavelength of light used for optical signals.

Further, Al is deposited on a surface of the core layer 532, and a predetermined photo resist pattern is formed and etched to form Al metal masks 533 and 535. The metal mask 533 corresponds to a pattern of a core 501 that will be an optical wiring. In addition, the metal mask 535 corresponds to a pattern of alignment marks 507.

Next, as shown in FIG. 7D, an oxygen gas is used to etch the core layer 532 by means of reactive ion etching. Further, the Al film, which is the metal masks, is etched off to simultaneously form the pattern of the core 501 (optical wiring) and the pattern of the alignment marks 507. At this point, the line width of the core 501 pattern is, for example, 8 μm. In addition, its cross section is a square, for example, 8 μm in height and 8 μm in width. The size of the cross section of the core 501 are not limited to this but may be between 5 and 100 μm depending on differences in transmission mode and in refractive index between the core and the clad.

As shown in FIG. 7E, OPI-1005 is coated and imidized as a second clad 506. This step is similar to that for the first clad 504. At this point, the clad has a thickness of 20 μm, for example, on the core optical wiring layer.

As shown in FIG. 7F, a thin metal film of Cr and Cu is sputtered on a surface of the second clad 506. In addition, about 10 μm of a Cu layer is formed in a copper sulfate plating bath. Further, a photo resist pattern is formed using the photolithography technique, and is etched using an etchant. As a result, pads 509, an electric wiring 513, and lands 511 can be formed. Previously formed openings 537 are shown with the lands 511 in FIG. 7E. In these openings 535, hole sections for forming via holes 523 are formed later by means of a laser. In addition, although not shown, at the same time, pads, an electric wiring, and lands for connections with an electric part are formed.

Next, a photo resist 539 is coated as a protect film as shown in FIG. 7G. This film protects the pads, 509, electric wiring 513, and lands 511, which are formed of copper, from a release agent.

Next, the Cu layer in the release layer 22 is dissolved using a ferric chloride liquid as a release agent, and the optical wiring layer 51 is released to produce an optical wiring film, as shown in FIG. 7H.

As shown in FIG. 7I, a side of the optical wiring layer 51 on which the pads 509, the electric wiring 513, and the lands 511 are formed is stuck to a second support 541 using an adhesive. In this case, the second support 541 had better be transparent so that the alignment marks 507 can be seen from its side to which the optical wiring layer 51 is not stuck. In addition, the adhesive must be easy to release or tend to have its adhesive strength reduced when hardened by means of ultraviolet rays.

Further, in FIG. 7I, a thin film layer of Cr and Cu is sputtered on the surface of the optical wiring layer 51 opposite to its stuck surface, and 10 $\mu$m of a Cu layer is formed thereon in a copper sulfate plating bath. Furthermore, a photo resist pattern is formed using the photolithography technique, and is etched using an etchant to form a laser mask 551 for forming a mirror. The position of the laser mask 551 is defined by the alignment marks 507 similarly to the pads 509 on the opposite surface. In addition, openings 553 are formed in the laser mask. Accordingly, with irradiation with laser light, only the openings 553 are processed.

Then, by irradiating the openings 553 with laser light in such a manner that the incident angle is 450° relative to the substrate surface, a mirror 512 is formed at an angle of 450° relative to the substrate 541, as shown in FIG. 7J. In this case, suitable lasers include an excimer laser, a carbon dioxide laser, a YAG laser, etc.

As shown in FIG. 7K, the laser mask 551 is removed using an etchant.

As shown in FIG. 7L, as an adhesive, a modified polyimide resin 521 exhibiting thermal plasticity is coated and dried on the substrate 52 with the electric wiring 519. Then, the surface of the optical wiring layer on which the mirror has been formed is stuck to the substrate 52 and heated for adhesion.

Next, the structure is irradiated with ultraviolet rays to release the second support 541, as shown in 7M.

Then, a plated resist 543 is coated on the optical wiring layer 51 as a protect film, as shown in FIG. 7N.

As shown in FIG. 7O, at the openings 537 of the lands 511, which correspond to positions at which via holes 523 are to be formed, holes 555 are formed by means of a laser. In this case, suitable lasers include an excimer laser, a carbon dioxide laser, a YAG laser, etc.

As shown in FIG. 7P, a thin metal film of Cr and Cu is sputtered on the surface of the optical wiring layer 51 and on the inside of the laser-processed holes. Then, this thin metal film is used as an electrode to plate the inside of the via holes 523 and the lands 511 with copper in a copper sulfate plating bath. Furthermore, the plated resist 543, which is a protect film, is removed, and the via holes 523 and the lands 511 are formed to obtain the optoelectric wiring substrate 53.

In addition, although not described in detail, in the step shown in FIG. 7F, while forming the pads 509, the lands 511, and the electric wiring 513, a mirror can be formed by forming a laser mask for mirror formation and irradiating the mask with laser light with an incident angle of 450° relative to the substrate. This simplifies the steps and enables the positions of the pads and mirror to be accurately determined using the single photo mask.

<Method 1-4 for Manufacturing an Optoelectric Wiring Substrate>

A method 1-4 for manufacturing an optoelectric wiring substrate is a method for manufacturing an optoelectric wiring substrate 55, which is shown in FIG. 3A. The method will be explained referring to FIGS. 8A and 8B.

The optoelectric wiring substrate 55 is formed by providing a resin layer 525 (having the same refractive index as the clad 503) on the optoelectric wiring layer 50 as described above. Thus, the fourth manufacturing method is the first manufacturing method with addition of new steps for manufacturing the resin layer 525. Description of the same steps as in the first manufacturing method is omitted below, and only the new additional steps will be explained.

Figure 8A:
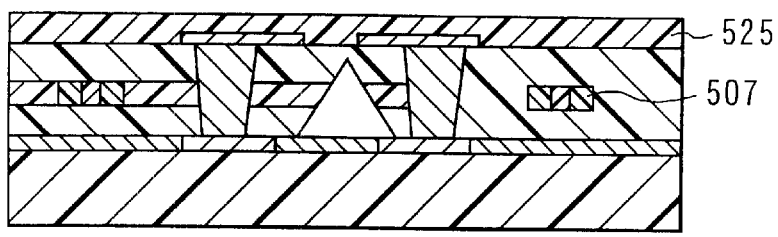
FIGS. 8A and 8B show the steps of manufacturing a resin layer 58.
Figure 8B:
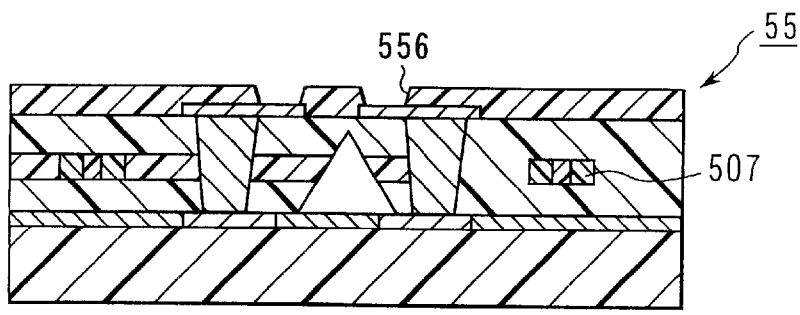

FIGS. 8A and 8B show the steps for manufacturing the resin layer 525 which are continued from FIG. 5O, and are arranged in the order of the steps.

After manufacturing the optoelectric wiring substrate 50 in the step shown in FIG. 5O, as shown in FIG. 8A, Polyimide OPI-N1005 (manufactured by Hitachi Chemical Industry Inc.), which has been used for the clad 503, is spin-coated on the surface of the optical wiring layer 50 and imidized at 350° C. At this point, the film thickness is, for example, about 10m.

Finally, as shown in FIG. 8B, the pads 509 are irradiated with laser light using the alignment marks 507 as references, thereby removing the polyimide from the pads 509. As a result, openings 556 are formed. In this case, preferable lasers include an excimer laser, a carbon dioxide laser, a YAG laser, etc.

As a result, the optoelectric wiring substrate 55 can be obtained.

The optoelectric wiring substrate 55, 57 can also be produced using the following method: The second and third manufacturing method include the additional steps wherein after completion of each optoelectric wiring substrate, the Polyimide OPI-N1005 (manufactured by Hitachi Chemical Industry Inc.) layer, which has been used for the clad 503, is formed on the optical wiring layer and the polyimide is then removed from the pads.

3. Mounted Substrate

A mounted substrate in which an optical part (a light-emitting element, a light-receiving element, or the like) is mounted on the optoelectric wiring substrate will be described below. The mounted substrate will be explained below by taking an optoelectric wiring substrate 55 by way of example, but this invention is applicable to other optoelectric wiring substrates.

Figure 9A:
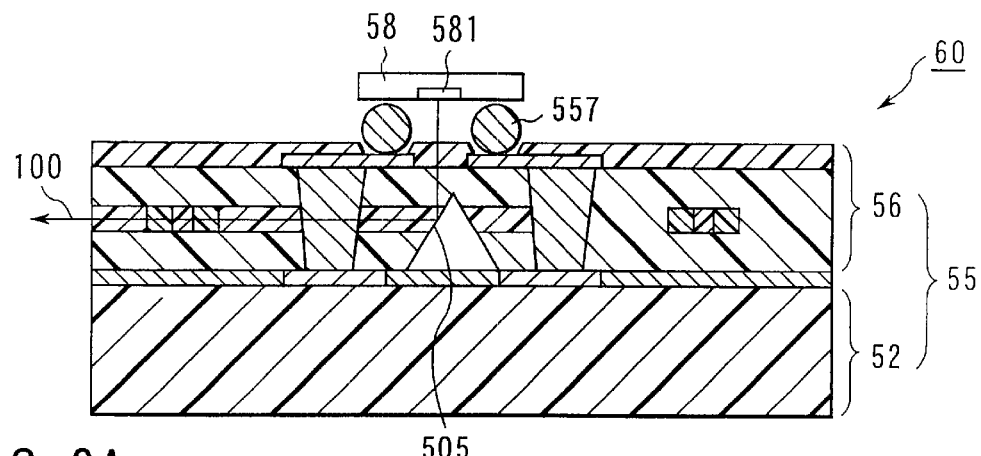
FIG. 9A shows a mounted substrate 60 in which a light-emitting element 58 is mounted on an optoelectric wiring substrate 55.

FIG. 9A shows a mounted substrate 60 in which a light-emitting element 58 is mounted on the optoelectric wiring substrate 55.

A laser beam 100 emitted from a light-emitting surface 581 of a light-emitting element 131 is reflected by a mirror 505 and then propagates through a core 501 in an optical wiring layer 506.

Figure 9B:
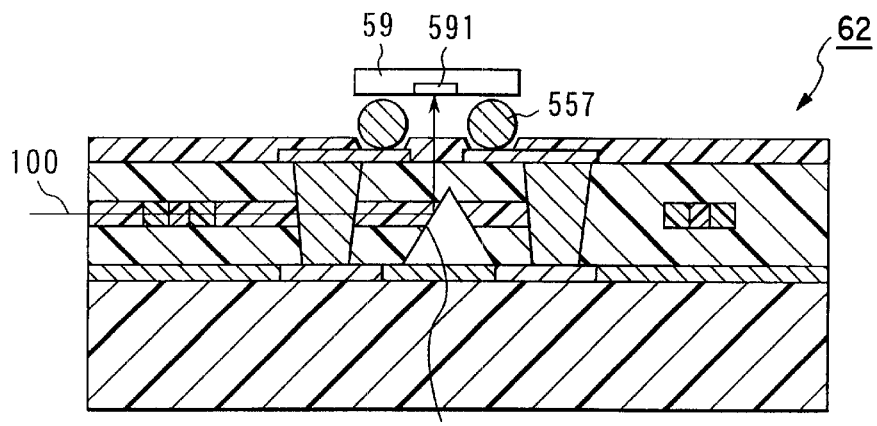
FIG. 9B shows a mounted substrate 62 in which the light-receiving element 59 is mounted on the optoelectric wiring substrate 55.

FIG. 9B shows a mounted substrate 62 in which a light-emitting element 59 is mounted on the optoelectric wiring substrate 55.

The laser beam 100, which has propagated through the core 501 in the optical wiring layer 56, is reflected by the mirror 505 and then impinges on a light-receiving surface 591 of the light-receiving element 59.

Figure 10:
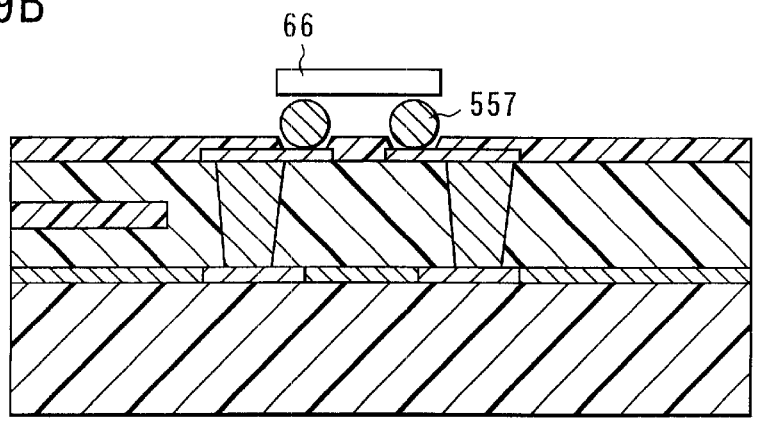
FIG. 10 is a mounted substrate 62 in which a BGA package 66 that is an electric part is mounted on an optoelectric wiring substrate.

FIG. 10 shows the mounted substrate 62 in which a BGA package 66, an electric part, is mounted on an optoelectric wiring substrate .

The above optical and electric parts and the optoelectric wiring substrate are electrically connected together using solder balls 557. In addition, if the optical part has metal leads, the electric connection is made by soldering pads 509 and the optical part together.

Next, alignment between the mounted substrate and the optical and electric parts.

As described above, each of the above manufacturing methods enables the core 501 and alignment marks 507, 515 to be simultaneously formed. Then, the alignment marks

507, 515 can be used as references to accurately determine a position of the mechanically formed mirror 505 or a position of a mirror 512 formed using a laser mask.

In addition, in mounting the pads 506 and the optical and electric parts on the optoelectric wiring substrate, a self-alignment effect of solder used for joining allows a position of the light-emitting or light-receiving surface of the optical part to be accurately determined.

Further, if a resin layer 525 of a material having the same refractive index as the clad is formed on a surface of an optical wiring layer 56, 58, the following alignment effect can further be obtained: As described in the step shown in FIG. 8B, by removing the resin from the pad surfaces by means of a laser using the alignment marks 507 as references, the optical part can be more accurately aligned during soldering of the solder balls or leads. That is, since soldering of the solder balls or leads are put in openings 556 accurately aligned based on the alignment marks 507, the optical part or the like mounted on the optoelectric wiring substrate can be more accurately aligned.

Consequently, simply by mounting the electric and optical parts on the optoelectric wiring substrate through a reflow furnace, the alignment between optical axes of the optical part and a waveguide can be performed accurately. As a result, precise optoelectric wiring substrates and mounted substrates can be obtained without the needs for advanced manual work, thereby enabling cost reduction and mass production.

The above configuration provides the following effects:

First, high-density mounting and size reduction can be achieved. This is because the optical wiring layer is laminated on the substrate with the electric wiring.

Second, the locational relationship between the core acting as the optical wiring, the pads installed an optical part or the like and the mirror can be extremely approximated to the design. This is because the optoelectric wiring substrate and mounted substrate according to the present invention have the above mentioned alignment effects to enable the optical axes of the optical part and the core acting as the optical wiring to be optically aligned easily.

Third, cost reduction and mass production can be attained compared to the prior art. This is because the above configurations require no manual work that requires experiences for optical-axis alignment and the like.

Forth, the optoelectric wiring substrate according to the present invention further enables the electric wiring to be formed on the optical wiring layer. Accordingly, cross talk between the electric wires can be restrained. As a result, noise can be reduced.

Fifth, the optical propagation loss of the core can be reduced. The reason is as follows: After being manufactured on the flat support, the optical wiring layer according to the present invention is stuck to the substrate with the electric wiring. Thus, the effect of recesses and projections of the electric wiring on the substrate can be lessened compared to an optical wiring layer directly manufactured on a substrate (with an electric wiring).

Second Embodiment

Next, a second embodiment will be explained.

The second embodiment can provide a higher alignment effect in manufacturing an optoelectric wiring substrate. In the following example, for simplicity, a method in which a mirror 505, 512 for reflecting laser light is not formed is taken by way of example. Adding a known mirror formation step to the manufacturing method described below enables an optoelectric wiring substrate with a mirror to be manufactured easily.

Two examples of manufacturing methods will be described below with reference to the drawings.

<Method 2-1 for Manufacturing an Optoelectric Wiring Substrate>

A first example of a method for manufacturing an optoelectric wiring substrate according to second embodiment will be described with reference to FIGS. 11A to 11N. The resulting optoelectric wiring substrate is a substrate 70, which is shown in FIG. 11N.

Figure 11A:
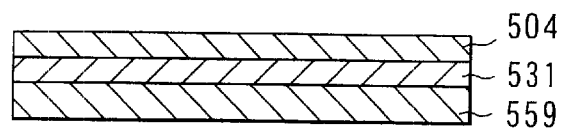
FIGS. 11A to 11N show each step of a method for manufacturing an optoelectric wiring substrate according to a second embodiment.
Figure 11B:
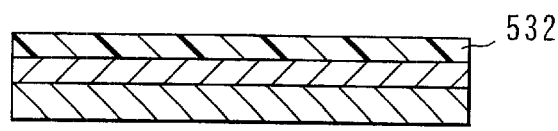
Figure 11C:
Figure 11D:
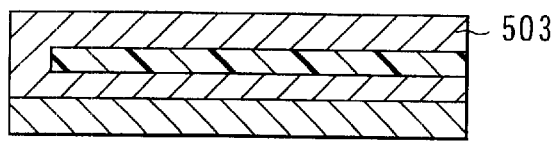
Figure 11E:
Figure 11F:
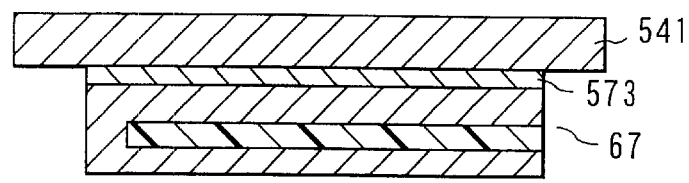
Figure 11G:
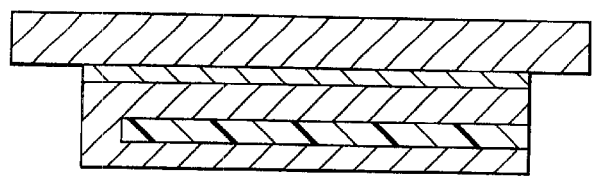
Figure 11H:
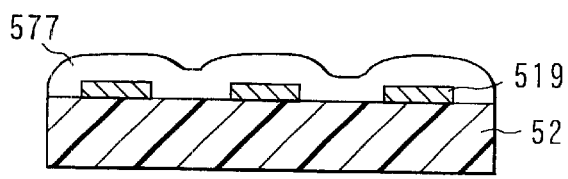
Figure 11I:
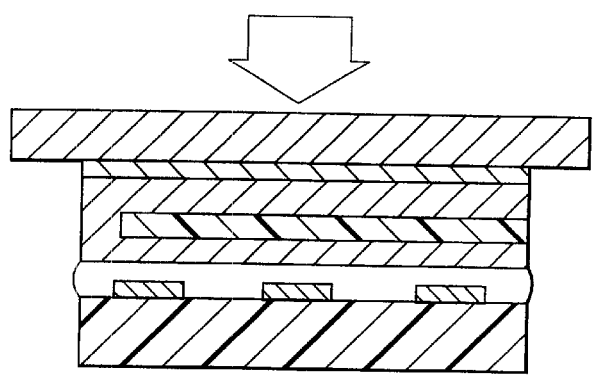
Figure 11J:
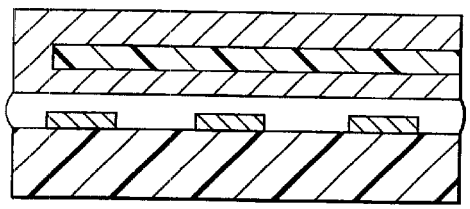
Figure 11K:
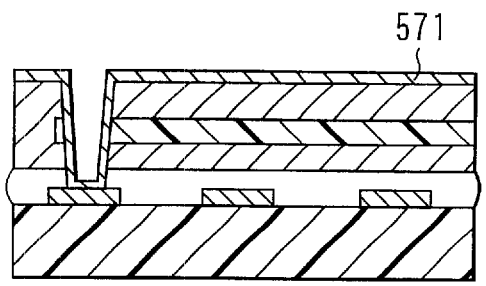
Figure 11L:
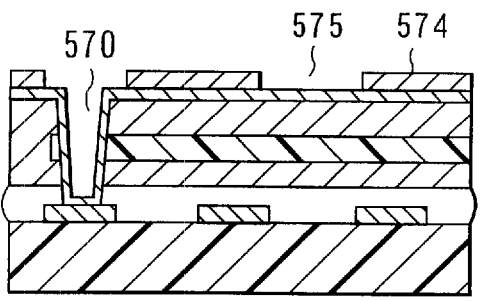
Figure 11M:
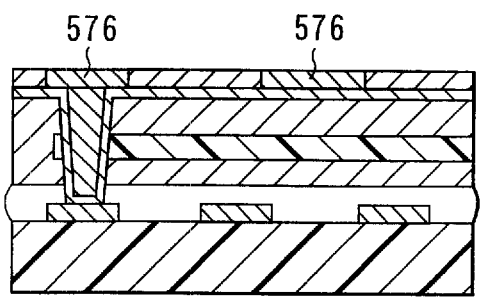
Figure 11N:
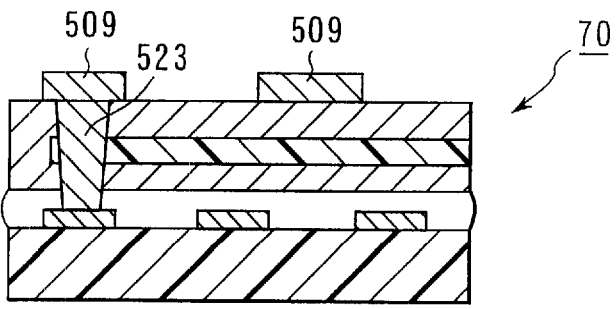

FIGS. 11A to 11N show each step of this manufacturing method and are arranged in the order of the steps.

First, as shown in FIG. 11A, a thin film layer of Cr and Cu is sputtered as a release layer 531 on a first support substrate 559 that is a silicon wafer or the like, and about 1 $\mu$m of Cu layer is subsequently formed thereon in a copper sulfate plating bath. Polyimide OPI-N1005 (manufactured by Hitachi Chemical Industry Inc.) is spin-coated on the release layer 531 as a clad layer 561 and imidized at 350° C. At this point, the film thickness is, for example, about 15 $\mu$m. The first support substrate 559 is not limited to a silicon wafer but may be a robust material having smooth surfaces and which can resist a high temperature of about 400° C.

Next, as shown in FIG. 11B, Polyimide OPI-N1305 (manufactured by Hitachi Chemical Industry Inc.) is similarly spin-coated on the first clad 504 as a core layer 532 and imidized at 350° C. At this point, the film thickness is, for example, about 8 $\mu$m.

Then, Al is deposited on a surface of the core layer 532, and a predetermined photo resist pattern is formed and etched to form aluminum metal masks. Further, as shown in FIG. 1C, an oxygen gas is used to etch part of the core layer 532 by means of reactive ion etching. Likewise, an oxygen gas is used to etch off the aluminum film to form a core 532 that will be an optical wiring. Simultaneously with the formation of the core 501, alignment marks (not shown) are formed on the core layer 532. These alignment marks act as references for sticking this substrate to an electric wiring substrate, which will be described below.

As shown in FIG. 11D, OPI-N1005 is spin-coated on the core 501 as a second clad 506 and imidized. At this point, the film thickness of the second clad 506 newly formed on the core 501 is, for example, about 15 $\mu$m (which is the same as the film thickness of the clad layer 561 formed in the step shown in FIG. 11A). As a result, an optical wiring layer 67 can be obtained which consists of the core 501 and a clad 503, which buries the core 501.

Next, a ferric chloride is used to dissolve and remove a release layer 531 to release an optical wiring layer 67, as shown in FIG. 11E.

Next, the step of sticking the optical wiring layer 67 to the electric wiring substrate 52 will be described with reference to FIGS. 11F to 11I.

An electric wiring 519 is formed on the top surface of the electric wiring substrate 52. The electric wiring 519 generates recesses and projections which correspond to a difference in height of about 18 $\mu$m on the top surface of substrate 52.

The conventional manufacturing method directly forms the optical wiring layer on the surface of the electric wiring substrate 52. Consequently, the optical wiring layer is affected by the unevenness of the surface, resulting in reduced accuracy. The manufacturing method according to the present invention solves this problem by executing the steps described below.

First, as shown in FIG. 11F, 1 $\mu$m of a first adhesive 573 is coated on a second support substrate 541 made of glass, and the optical wiring layer 67 is stuck to the second support substrate 541 using a laminator. At this point, alignment between the second support substrate 541 and the optical wiring layer 67 is not required. This is because the laminator makes the surface of the optical wiring layer 67 very smooth.

The second support substrate 541 may be any substrate made of glass or the like which has a certain level of strength and which is flat and transparent. In addition, the substrate is heated or irradiated with ultraviolet rays as required depending on the type of the adhesive.

This manufacturing method uses a polyimide multilayer wiring substrate as the electric wiring substrate 52. The electric wiring 519 is formed on the top surface of the substrate 52. The electric wiring substrate 52 is not limited to the polyimide multilayer wiring substrate but may be a single-layer insulated substrate or a multilayer wiring substrate with electric wirings and insulated layers alternately laminated together. In addition, the material may be an insulated substrate comprised of a glass cloth impregnated with a resin, a polyimide film, or a ceramic substrate.

About 20 μm of a second adhesion layer 577 is formed on the electric wiring substrate 575. Specifically, this layer can be formed by applying to the substrate a modified polyimide resin exhibiting thermal plasticity, followed by drying.

A preferable material of the second adhesion layer 577 is a thermal plastic adhesive, for example, an ethylene-ester acrylate copolymer, a styrene-poly (metha) ester acrylate, a butyral resin, a polyamide-based resin, or a modified polyimide resin. The reason why this manufacturing method employs the modified polyimide resin is that the range of sticking temperature is between 250 and 300° C., which is preferable in terms of the heat resistance of solder on an optoelectric wiring substrate.

The optical wiring layer 67 must be released from the second support substrate 541 together with a first adhesion layer 573. Thus, the design of this structure must be such that the adhesion strength with which the second adhesion layer 577 adheres to the optical wiring layer 67 is larger than the adhesion strength with which the first adhesion layer 573 adheres to the optical wiring layer 67.

Alignment marks (not shown) are formed on the electric wiring substrate 52, which is coated with the second adhesion layer 577. These alignment marks are provided at positions corresponding to the alignment marks formed in the step corresponding to FIG. 11C. As shown in FIG. 11G, the alignment marks formed on the electric wiring substrate 52 are aligned with the corresponding alignment marks formed on the optical wiring layer 52 stuck to the second support substrate 541 (glass substrate), through the glass substrate, in order to determine the positions of theses alignment marks.

That is, as described above, the second support substrate 541 is the transparent glass substrate. The glass substrate and the optical wiring layer 67 allow visible light to permeate therethrough smoothly, and the first adhesion layer 573 has a sufficiently small thickness. Consequently, the alignment marks of the optical wiring layer 67 and electric wiring substrate 52 can be visually checked from the rear surface (the surface opposite to the stuck side) of the second support substrate 577.

Next, in FIG. 11H, the structure is heated at 250° C. for one hour while applying a pressure P thereto from the rear surface of the second support substrate 541. In this case, the adhesion can be carried out with a reduced atmospheric pressure as required. If the second adhesion layer 577 tends to be hardened when exposed to electron beams or the like, it can be stuck to the optical wiring layer by irradiating it with electron beams from the second support substrate 541.

Then, as shown in FIG. 11I, the second support substrate 541 is released from the optical wiring layer together with the first adhesion layer 573 to complete the sticking of the electric wiring substrate 52 and the optical wiring layer 67.

It should be noted that the optical wiring layer 67 can be stuck and fixed to the electric wiring substrate 52 while maintaining its smoothness and without being affected by the unevenness of the underlying electric wiring substrate 52. This can be achieved by the steps in FIGS. 11F to 11I.

Next, the steps carried out before the optoelectric wiring substrate according to the present invention is completed will be described. The remaining step forms pads for mounting an optical or electric part on the optical wiring layer 67 stuck to the electric wiring substrate 52 and via holes for electrically connecting the optical part with the electric wiring substrate.

As shown in FIG. 11J, a laser is used to form a hole section 570 for via hole 523 formation using the alignment marks (not shown) on the electric wiring substrate 52. The method for forming the hole section 570 may be perforation using a carbon dioxide laser, a UV-YAG laser, an excimer laser, or dry etching such as reactive ion etching. In this case, the underlying electric wiring 519 acts as a stopper for the penetration.

Next, as shown in FIG. 11K, a sputter is used to form thin metal films (not shown) in the order of Cr and Cu. Furthermore, 10 μm of PMER (manufactured by Tokyo Applied Chemical Industry Co., LTd.) is coated on the films using a spin coater, and is then dried at 90° C. to form a photo resist 541.

Then, as shown in FIG. 11L, a photo mask having a predetermined pattern is used to carry out exposure and development using as references the alignment marks (not shown) formed on the electric wiring substrate 52. Then, an opening 570 for via hole 523 formation and an opening 575 for pad formation are produced. Further, post-baking is executed at 110° C.

As shown in FIG. 11M, the thin metal films (see the description of the step shown in FIG. 11K) are used as a negative electrode to form a plated film 576 in a copper sulfate bath. The plated film 576 is, for example, 10 μm in thickness, which is substantially equal to the thickness of the photo resist.

Finally, as shown in FIG. 11N, the photo resist 571 is removed by means of an exclusive release agent, and the thin metal films are dissolved and removed by means of an etchant to produce via holes 523 and pads 519. Thus, an optoelectric wiring substrate 70 according to the present invention can be completed.

<Method 2-2 for Manufacturing an Optoelectric Wiring Substrate>

Next, a second example of a method for manufacturing an optoelectric wiring substrate according to second embodiment will be described. This method is an another method for manufacturing the optical wiring layer on the transparent support substrate, which is similar to the manufacturing method 2-1. The resulting optoelectric wiring substrate is a substrate 70, which is shown in FIG. 11N.

FIGS. 12A to 12G show each step of the sixth manufacturing method and are arranged in the order of execution.

Figure 12A:
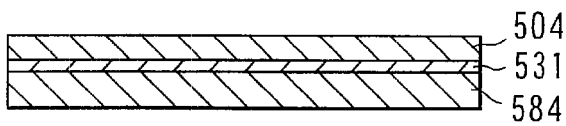
FIGS. 12A to 12G show each step of a method for manufacturing an optoelectric wiring substrate according to a second embodiment.

First, an optical wiring layer is manufactured. A thin film layer of Cr and Cu is sputtered on a third support substrate 584 made of glass or the like, to form a release layer 563 as shown in FIG. 12A. The third support substrate 584 is not limited a glass substrate but may be any robust substrate that has smooth surfaces, that can resist a temperature of about 400° C., and that allows visible light to permeate therethrough smoothly. These characteristics are common to a second substrate 541.

Subsequently, about 1 μm of a Cu layer is formed in a copper sulfate plating bath (not shown). The photo etching method, a specified method, is used to form alignment marks (not shown) at predetermined positions of this thin metal film layer. The alignment marks are used as alignment references in sticking the optical wiring layer to an electric wiring substrate, which will be described below.

Next, Polyimide OPI-N1005 (manufactured by Hitachi Chemical Industry Inc.) is similarly spin-coated on the Cu layer and imidized at 350° C. to form a clad 504 as shown in FIG. 12A. At this point, the clad 504 has a thickness, for example, of about 15 μm.

Figure 12B:
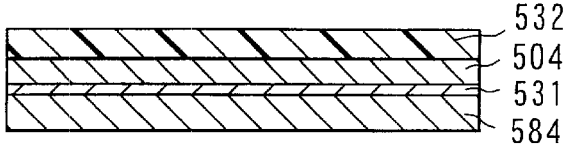

Next, Polyimide OPI-N1305 (manufactured by Hitachi Chemical Industry Inc.) is similarly spin-coated on the clad layer 561 and imidized at 350° C. to form a core layer 532 as shown in FIG. 12B. At this point, the core layer 532 has a thickness, for example, of about 8 μm.

Figure 12C:
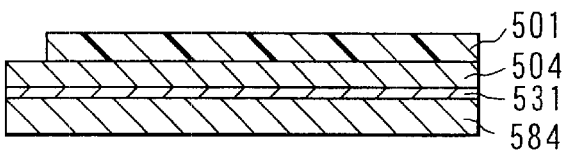
Figure 12D:
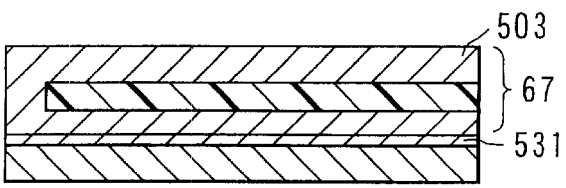

Then, aluminum is deposited on a surface of the core layer 532, and a predetermined photo resist pattern is formed and etched to form Al metal masks. Further, an oxygen gas is used to etch the core layer 532 by means of reactive ion etching in order to remove the aluminum film. As a result, a core 501 is obtained as shown in FIG. 12C. At this point, alignment marks, which are used to improve an accuracy of sticking with the substrate 52, are formed simultaneously.

Next, Polyimide OPI-N1005 is similarly coated on the core 501 and part of the clad 504 and imidized at 350° C. to form a clad 503, which buries the core 501. The clad layer newly laminated in this step has a thickness of 15 μm, for example, on the core 501.

These steps result in an optical wiring layer 67. Next, each of the steps of sticking the optical wiring layer 67 and the electric wiring substrate 52 together will be described based on FIGS. 12E to 12G.

First, about 20 μm of a second adhesion layer 577 is formed on an electric wiring substrate 52. Specifically, this layer can be formed by applying to the substrate a modified polyimide resin exhibiting thermal plasticity, followed by drying.

A preferable material of the second adhesion layer 577 is a thermal plastic adhesive, for example, an ethylene-ester acrylate copolymer, a styrene-poly (metha) ester acrylate, a butyral resin, a polyamide-based resin, or a modified polyimide resin. The reason why this manufacturing method employs the modified polyimide resin is that the range of sticking temperature is between 250 and 300° C., which is preferable in terms of the heat resistance of solder on an optoelectric wiring substrate.

Figure 12E:
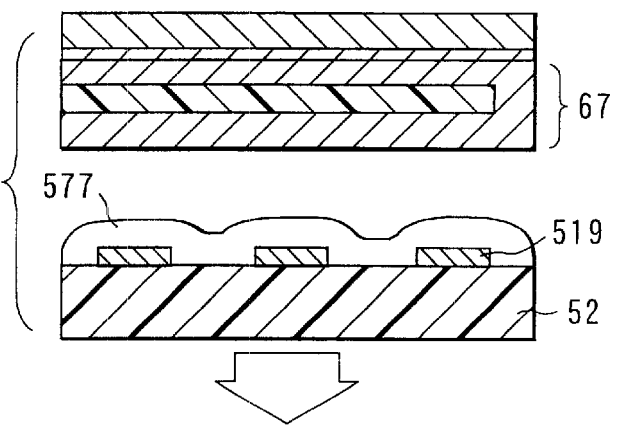
Figure 12F:
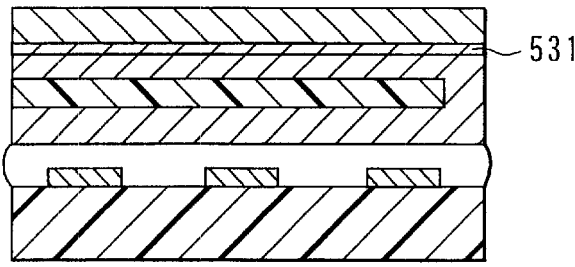

Alignment marks (not shown) are formed on the electric wiring substrate 52, which is coated with the second adhesion layer 577. These alignment marks are provided at positions corresponding to the alignment marks formed in the step corresponding to FIG. 12C. As shown in FIG. 12E, the alignment marks formed on the electric wiring substrate 52 are aligned with the corresponding alignment marks formed on the optical wiring layer stuck to the second support substrate 541 (glass substrate), through the glass substrate, in order to determine the positions of theses alignment marks.

In this case, a third support substrate 584 has characteristics similar to those of the second support substrate 541 described in the fifth manufacturing method. Accordingly, alignment between the optical wiring layer 67 and the electric wiring substrate 52 can be executed easily.

Next, as shown in FIG. 12H, the structure is heated at 250° C. for one hour while applying a pressure P thereto from a rear surface (a surface opposite to the stuck side) of the third support substrate 584. In this case, the adhesion can be carried out with a reduced atmospheric pressure as required. If the second adhesion layer 577 tends to be hardened when exposed to electron beams or the like, it can be stuck to the optical wiring layer by irradiating it with electron beams from the third support substrate 584.

Figure 12G:
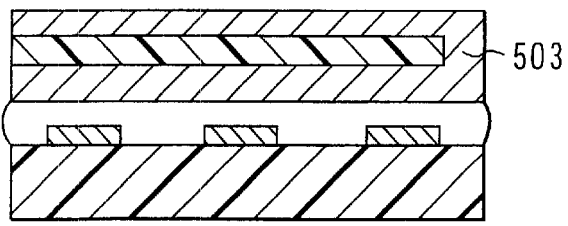

Then, the release layer 531 is dissolved and removed by means of a ferric chloride liquid to release the third support substrate 584, as shown in FIG. 12G.

These steps complete the sticking of the electric wiring substrate 52 and the optical wiring layer 67.

The subsequent steps (formation of pads, via holes, and other components) are similar to those of the above manufacturing method 2-1 which are shown in FIGS. 11J to 11N.

This manufacturing method 2-2 enables an optoelectric wiring substrate 70 to be obtained. According to the manufacturing method 2-2, the optical wiring layer 67 can also be stuck and fixed to the electric wiring substrate 52 while maintaining the smoothness of the third support substrate 584 and without being affected by the unevenness of the electric wiring substrate 52.

The above configuration can provide the following effects:

The optical wiring layer of the optoelectric wiring substrate is not affected by the unevenness of the underlying electric wiring substrate surface. The propagation loss of optical signals can be minimized. This is because the optical wiring layer is fixed to the smooth support substrate so as to be stuck to the electric wiring substrate while maintaining its smoothness.

Since during the sticking between the optical wiring layer and the electric wiring substrate, the alignment marks on the optical wiring layer and electric wiring substrate can be read easily, thereby enabling accurate sticking. This is because each of the support substrates is comprised of a transparent material. As a result, the electric wiring can be accurately aligned with pads for mounting an optical part.

A mounted substrate in which an optical part (a light-emitting element, a light-receiving element, or the like) is mounted on the optoelectric mounted substrate 70 described in the second embodiment can be manufactured using steps similar to those of the mounted-substrate manufacturing method already described in the first embodiment.

Next, a third example will be explained.

Third Embodiment

Next, a third embodiment will be explained.

The third embodiment describes another type of optoelectric wiring substrate and a manufacturing method therefor.

An important point of the optoelectric wiring substrate shown in the third embodiment is the concept that an optical wiring layer on which an optical part (optical element) is mounted is laminated on a substrate having an electric wiring, as in the first embodiment.

Further, an important point of the manufacturing method shown in the third embodiment is the concept that a core acting as an optical wiring, a pad pattern, and alignment marks are simultaneously manufactured.

The third embodiment will be described below with reference to the drawings.

Figure 13:
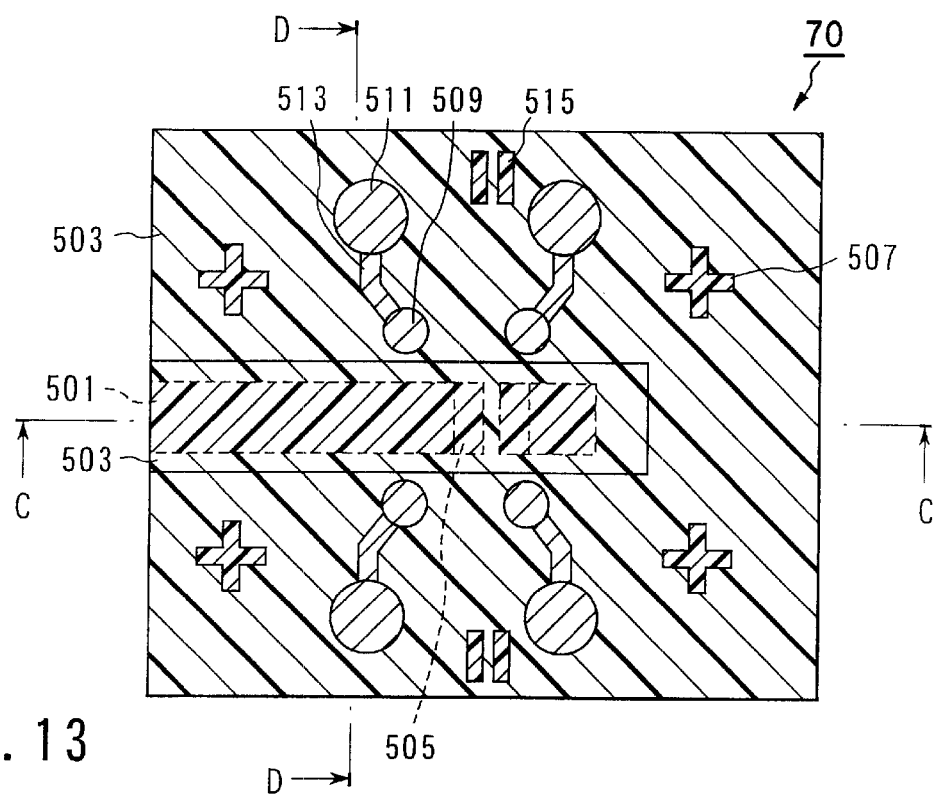
FIG. 13 is a top view showing an optoelectric wiring substrate 71 according to a third embodiment as seen from an optical part-mounted side.
Figure 15:
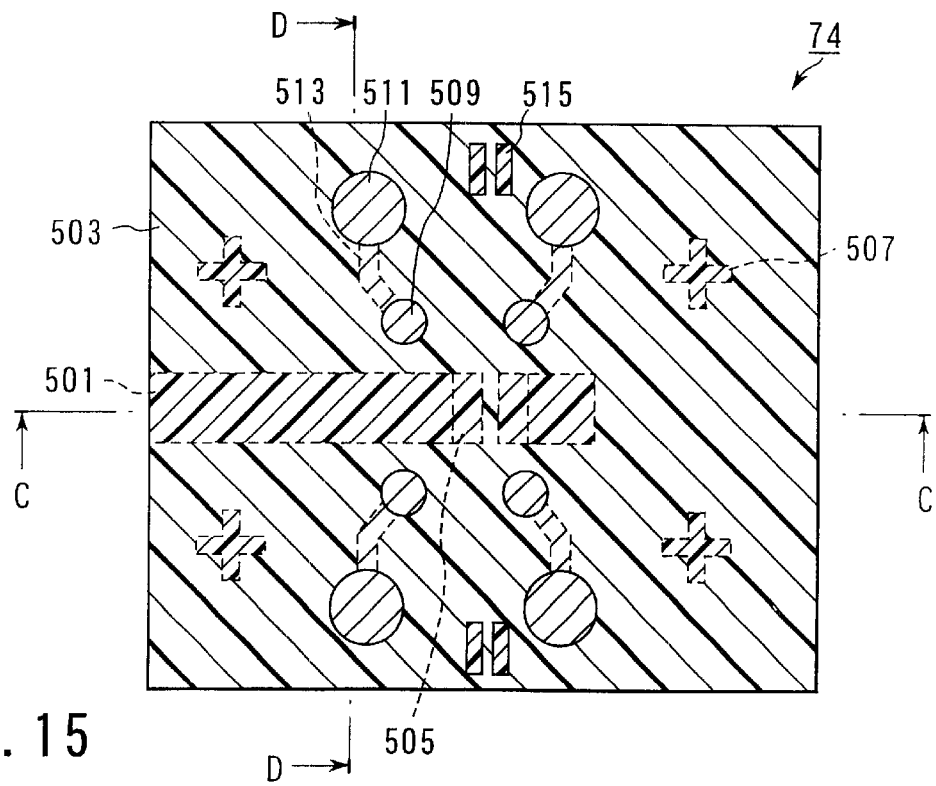
FIG. 15 is a top view of optoelectric wiring substrates 74, 76 with only a pad 509 section exposed.

FIG. 13 shows a top view showing an optoelectric wiring substrate 70 according to the third embodiment as seen from an optical part-mounted side.

Figure 14A:
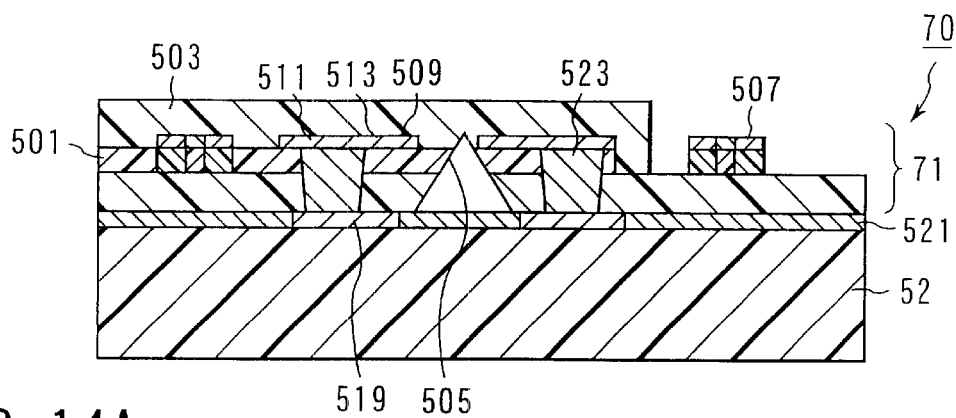
FIGS. 14A and 14B are sectional views taken along the direction C—C in FIG. 13.

FIG. 14A is a sectional view taken along the direction C—C in FIG. 13.

Figure 14B:
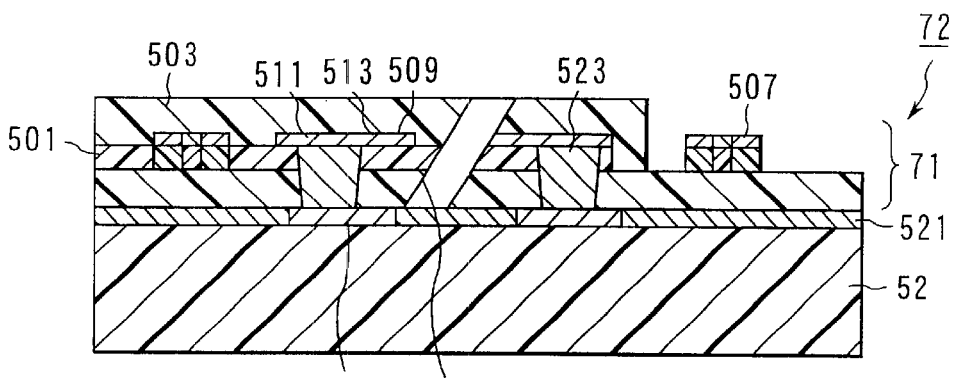
Figure 14C:
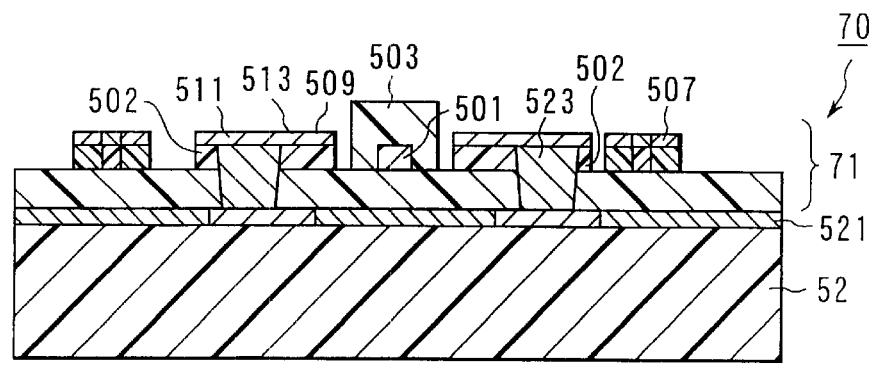
FIG. 14C is a sectional view taken along the direction D—D in FIG. 13.

FIG. 14C is a sectional view taken along the direction D—D in FIG. 13.

First, based on FIGS. 13, 14A, and 14C, a configuration of the optoelectric wiring substrate 70 will be described in the order of an optical wiring system, an electric wiring system, and connections between the optical and electric wiring systems.

An optical wiring layer 71 consists of a core 501 through which optical signals propagate and a clad 503 that confines optical signals in the core 501. Optical signals propagate through the core 501 by increasing the refractive index of a material forming the core 501 above that of the clad 503.

The core 501 has a mirror 505 installed in such a manner that optical signals are incident at 45°. Optical signals propagate between optical waveguides and an optical part (a laser diode or a photo diode) via a mirror 505 (see FIGS. 20A and 20B). An interface of the mirror 505 is brought in contact with a resin having a lower refractive index than the core 501 or with air. Alternatively, a thin metal film may be formed on the interface.

An optoelectric wiring substrate 72, which is shown in FIG. 14B, shows an example having another mirror 512 installed in such a manner that optical signals are incident at 45°. The optoelectric wiring substrates 70 and 52 have the same configuration except for formation of the mirror 512.

In addition, the optical wiring layer 71 has a second core 502 that is not used as an optical wiring. Pads 509, lands 511, and an electric wiring 513 are provided on the second core 502 in such a manner as to be arranged immediately above the mirror 505 and in a periphery thereof.

The number and shape of the pads 509 is as described in the first embodiment.

The substrate 52 has an electric wiring on its surface and its type and material are as described in the first embodiment.

The optical wiring layer 71 is fixed to the substrate 52 via an adhesive 521. In addition, the optical part and the electric wiring 519, which are both provided on the optical wiring layer 51, are electrically connected together as follows:

That is, the lands 511 and the electric wiring 519 are electrically connected together via the via holes 523. A current from the electric wiring 519 is supplied to the lands 511 via the via holes 523 and further to the pads 509 via the electric wiring 513.

The optical part provided on the optical wiring layer 71 can obtain a required current by means of electric connections with the pads 509.

Although not shown, an electric part and the electric wiring on the substrate are similarly electrically connected together.

In the optoelectric wiring substrate shown in FIGS. 14A and 14B, the pads 509, the lands 511, and the electric wiring 513 are exposed from a surface of the optical wiring layer 71. On the contrary, optoelectric wiring substrates 74, 76 are shown in FIGS. 16A and 16B wherein the lands 511 and electric wiring 513 on the surface of the optical wiring layer 71 are coated with a resin layer 525 having the same refractive index as the clad 503 and wherein only part of the pad 509 for electric connections with the optical part is exposed.

Differences between a method for manufacturing the optoelectric substances 70, 72 and a method for manufacturing the optoelectric substances 74, 76 and differences in the effects of these substrates will be described below.

Figure 16A:
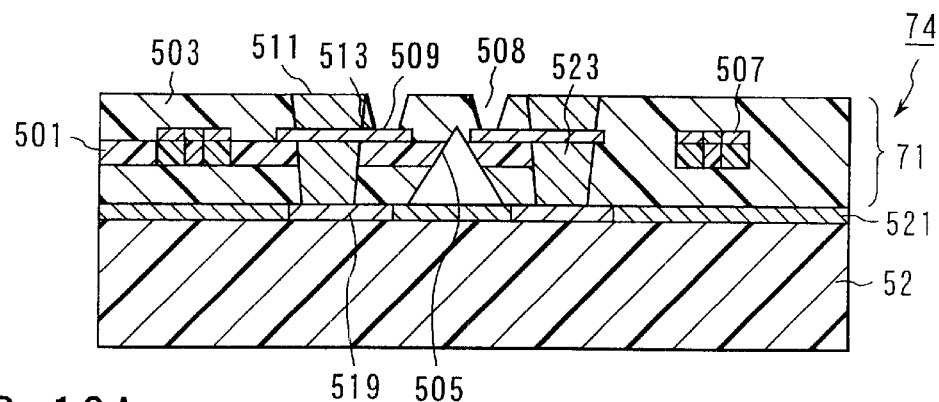
FIGS. 16A and 16B are sectional views taken along the direction C—C in FIG. 15.
Figure 16B:
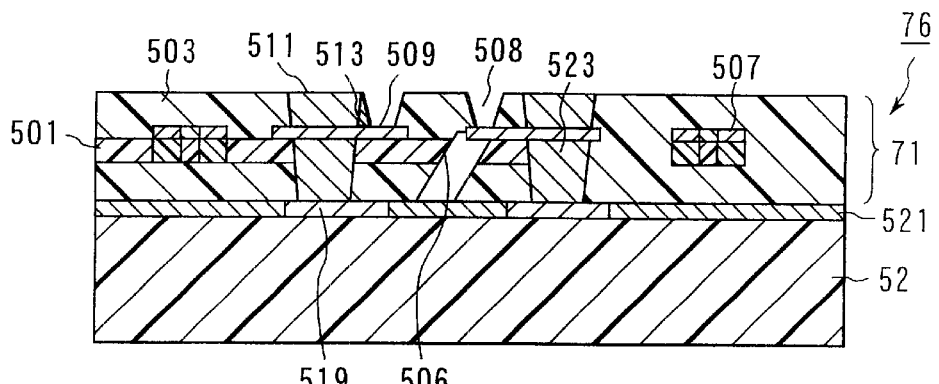
Figure 16C:
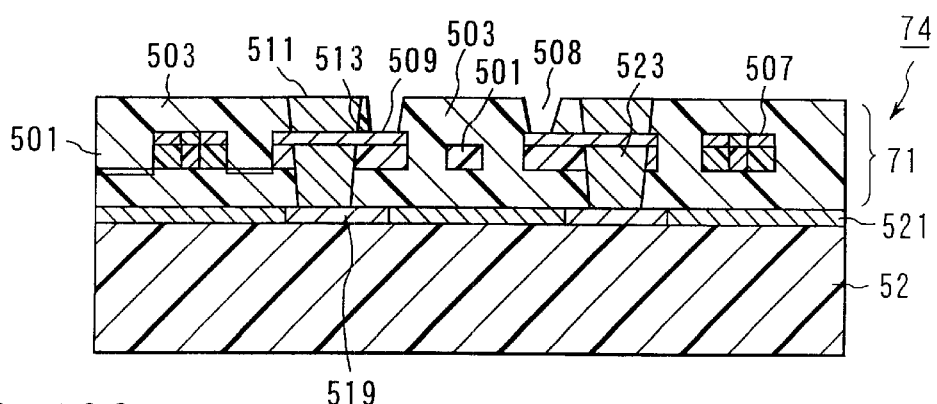
FIG. 16C is a sectional view taken along the direction D—D in FIG. 15.

Although not shown in FIGS. 16A and 16B, the pads for electric connections with the electric pads must be similarly exposed.

Next, alignment of the optoelectric wiring substrate according to the present invention will be explained.

Each of the optoelectric wiring substrates 70, 72, 74, 76 according to the present invention has alignment marks 507 formed thereon for determining the positions of the pads 509 for mounting the optical part and alignment marks 515 for determining the position of the mirror 505. These alignment marks are formed simultaneously with the core 501 and the pad 509 pattern (that is, the second core 502) as described below.

Although not explained in this embodiment, the alignment marks 515 may be provided as required. If, for example, alignment marks 515 are not formed, the surface of the optoelectric wiring substrate 70 on which the optical part is mounted is as shown in FIG. 4.

2. Method for Manufacturing an Optoelectric Wiring Substrate

Next, a method for manufacturing an optoelectric wiring substrate according to the present invention will be explained.

A summary of the method for manufacturing an optoelectric wiring substrate according to the present invention will be given below.

First, an optical wiring layer is produced on a support substrate that is separate from a substrate having an electric wiring. This step is characterized by the following two points: A first point is that an optical wiring is formed by means of dry etching using a metal mask, whereas an optical wiring pattern, pads, and alignment marks are simultaneously formed using the photolithography technology. A second point is that a metal film constituting the metal mask is also used as a pad conductor film.

Next, a mirror is formed in part of the core using the alignment marks as references. The optical wiring layer thus manufactured is stuck to the substrate having an electric wiring.

Finally, pads for installing an optical part or the like are electrically connected with the electric wiring substrate through via holes.

An import point of this manufacturing method is that the method comprises the step of producing beforehand the optical wiring layer on the support separate from the electric wiring substrate and the step of sticking this layer to the electric wiring substrate. Due to these steps, the optical wiring layer serves to lessen the effect of recesses and projections on the underlying electric wiring substrate, thereby reducing the loss of optical signals arising from this unevenness.

Three examples of manufacturing methods will be describe below in further detail with reference to the drawings.

<Method 3-1 for Manufacturing an Optoelectric Wiring Substrate>

The method 3-1 for manufacturing an optoelectric wiring substrate will now be described with reference to FIGS. 17A to 17Q. FIGS. 13 and 14A show an optoelectric wiring substrate 74 that is finally obtained in this method.

Figure 17A:
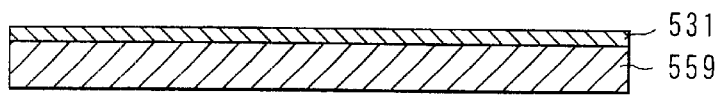
FIGS. 17A to 17P show each step of a method for manufacturing an optical wiring layer substrate 70.
Figure 17B:
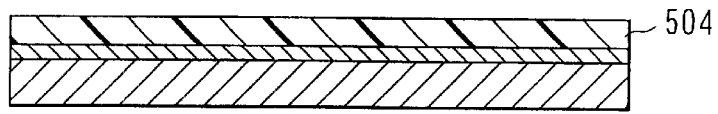
Figure 17C:
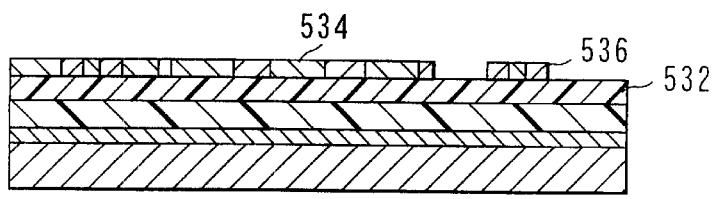
Figure 17D:
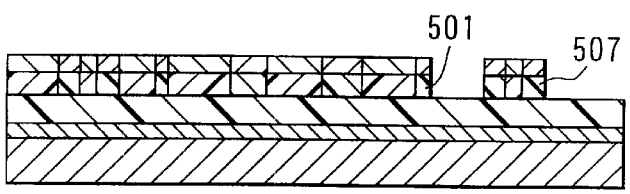
Figure 17E:
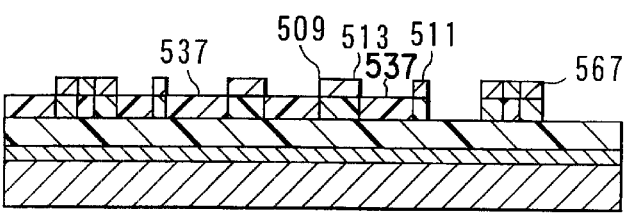
Figure 17F:
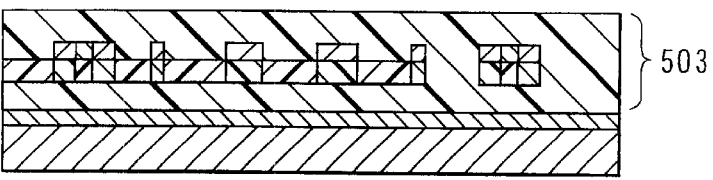
Figure 17G:
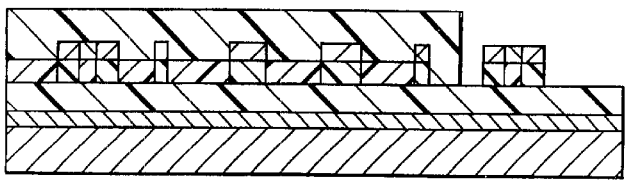
Figure 17H:
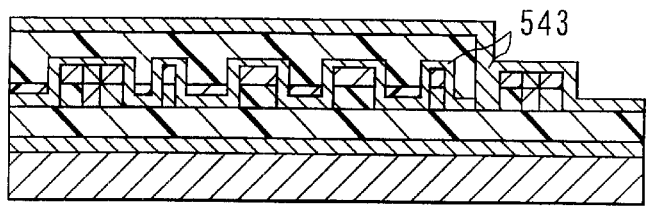
Figure 17I:
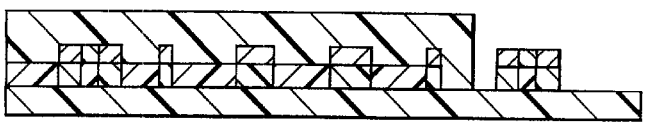
Figure 17J:
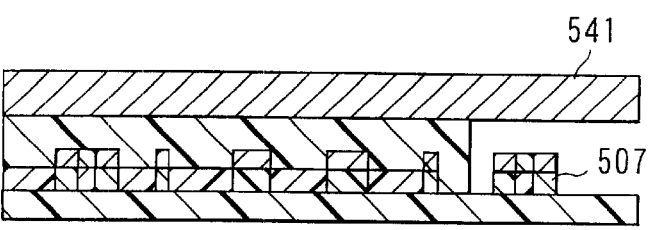
Figure 17K:
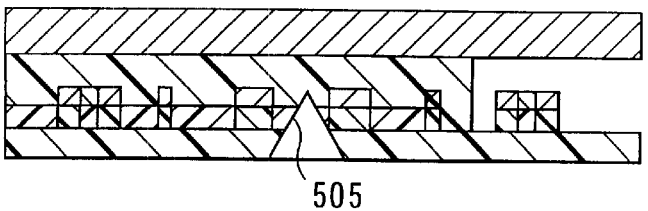
Figure 17L:
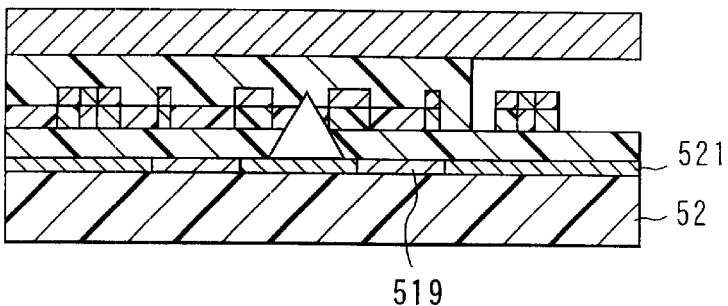
Figure 17M:
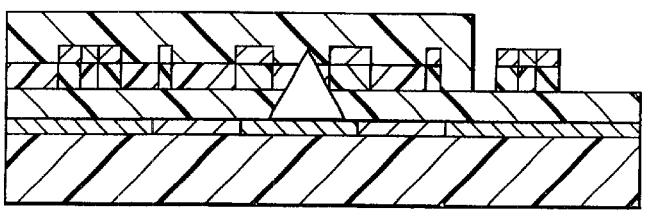
Figure 17N:
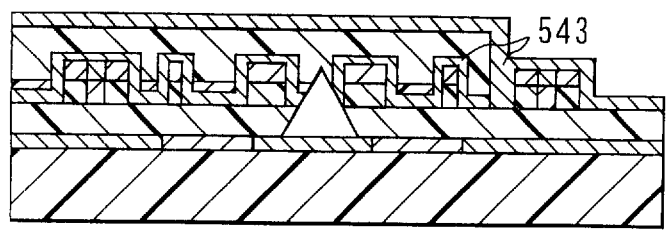
Figure 17O:
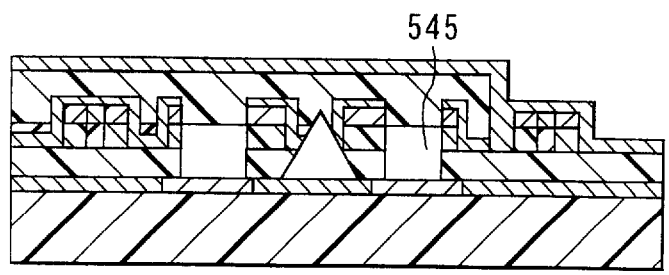
Figure 17P:
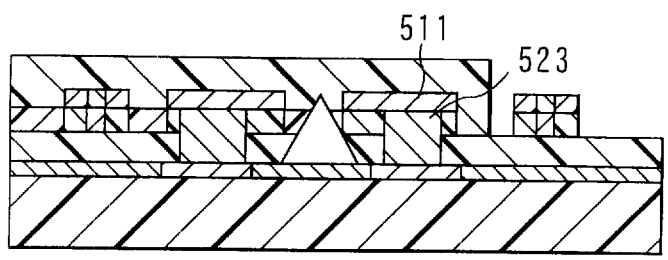

FIG. 17A to 17P show each step of the method for manufacturing the optoelectric wiring substrate 70 and arranged in the order of the steps.

In the first step, a thin film consisting of Cr and Cu and constituting a release layer 531 is formed by a sputtering method on a silicon wafer constituting a first support substrate 559, followed by forming a Cu layer (not shown) within a copper sulfate plating bath in a thickness of about 10 $\mu$m, as shown in FIG. 17A.

Then, OPI-N1005 (trade name of a polyimide manufactured by Hitachi Kasei Kogyo K.K.) is spin-coated on the release layer 531, followed by conversion into imide at 350° C. for forming a first clad 504, as shown in FIG. 17B. The thickness of the first clad 504 is, for example, 20 μm.

Further, OPI-N1305 (trade name of polyimide manufactured by Hitachi Kasei K.K.) is spin-coated on the first clad 504, followed by conversion into imide at 350° C. to form a core layer 532, as shown in FIG. 17C. The thickness of the core layer 532 is, for example, 8 μm.

The materials of the core layer 532 and the clad 504 used in the optical wiring layer 71 are not limited to polyimide resins. For example, it is possible to use fluorinated or deuterated epoxy resins, methacrylic acid ester resins or the like which are subject to fewer losses in the wavelength of light used for optical signals.

In the next step, Cr and Cu are sputtered on the core layer 532, followed by forming a Cu plating film (not shown) by using a copper sulfate plating bath. The thickness of the Cu plated film is, for example, 10 μm. Then, a predetermined photoresist pattern is formed, followed by performing an etching treatment to form Cr/Cu metal masks 534 and 536. The metal mask 534 corresponds to a pattern of the core 501 forming an optical wiring. On the other hand, the metal mask 536 corresponds to a pattern of an alignment mark 507. Also, a pattern of pads, lands and electric wiring, which are not shown in the drawing, is formed similarly.

Then, the core layer 532 is etched by a reactive ion etching using an oxygen gas to form a core 501 as shown in FIG. 17D. Then, a photoresist coating was applied, followed by light exposure and development to expose the metal mask (not shown) on the core pattern acting as an optical wiring, as shown in FIG. 17E. Further, the exposed metal mask is removed by etching. In this step, the line width of the core pattern was 8 μm, and the core pattern was found to be square (8 μm×8 μm) in cross section. It is possible for the cross sectional size to be determined appropriately to fall within a range of between 5 μm square and 100 μm square depending on the transmission mode and the refractive indexes of the core and the clad.

The metal mask positioned on the pad 509, the electric wiring 513 and the land 511 is used as it is as a conductive layer conducting electric signals. An opening 537 for forming a via hole is formed separately by a laser beam irradiation in the land 511. At the same time, a pad, an electric wiring and a land are formed for connection to electric parts.

As shown in FIG. 17F, a second clad 506 is formed by coating of OPI-1005, followed by conversion into imide. The thickness of the clad 506 is 20 μm on, for example, the core 501.

In the next step, a metal mask consisting of a thin Al film is formed by a photolithography technology on the surface of the second clad 506. Then, a reactive ion etching was applied by using an oxygen gas to permit the clad to be left at least around the optical wiring (see FIG. 14), and a pattern of the clad 503 as shown in FIG. 17G was formed such that the Cu surface on the surface layer of the pad 509 was exposed to the outside.

As shown in FIG. 17H, a photoresist 543 acting as a protective film was formed by coating in order to protect the pad 509 made of copper, the electric wiring 513 and the land 511 from the a releasing solution.

As shown in FIG. 17I, the Cu layer in the release layer 531 was dissolved in the release solution containing ferric chloride so as to peel the optical wiring layer from the first support substrate 559.

As shown in FIG. 17J, the second clad 506 was bonded to a second support substrate 541 by using an adhesive. The second support substrate 36 should be transparent such that an alignment mark 507 can be observed from the side on which the optical wiring layer is not bonded. It is desirable to use an adhesive that can be peeled off easily or that can be hardened upon irradiation with an ultraviolet light so as to decrease the adhesive strength.

As shown in FIG. 17K, a mirror 505 making an angle of 45° with the substrate is formed by a mechanical processing in a part of the core 501 using as a criterion the alignment mark (not shown) formed simultaneously with formation of the pattern of the core 501 acting as an optical wiring.

As shown in FIG. 17L, the substrate 52 is coated with a thermoplastic denatured polyimide resin 521 as an adhesive 521 in a thickness of 20 μm and, then, the coating is dried. Further, the polyimide resin 521 (adhesive 521) is attached to that surface of the optical wiring layer which is on the side of the mirror 505 so as to achieve bonding by heating.

As shown in FIG. 17M, the optical wiring layer is peeled off the second support substrate 541 by irradiation with an ultraviolet light. The optical wiring layer is covered with a plating resist 543 as a protect film as shown in FIG. 17N.

As shown in FIG. 17O, a hole 545 for a via hole 523 is formed by a laser irradiation in the opening portion 537 of the land. An excimer laser, a carbon dioxide gas laser, a YAG laser, or the like is suitable for use as the laser.

As shown in FIG. 17P, a metal thin film of Cr and Cu is formed by a sputtering method on the surface of the optical wiring layer and within the hole having a laser processing applied thereto. Then, a copper plating is applied within the via hole 523 and the land 511 within a copper sulfate bath using the metal thin film as an electrode. Further, the plating resist 543 acting as a protective film is removed to form a via hole 523 and a land 511.

The optoelectric wiring substrate 74 can be obtained through the manufacturing steps described above.

<Method 3-2 for Manufacturing an Optoelectric Wiring Substrate>

A method of manufacturing the optoelectric wiring substrate 72 shown in FIG. 14B will now be described. The optoelectric wiring substrate 72 differs from the optoelectric wiring substrate 70 in only the mirror formation. Therefore, the following description covers only the different steps while omitting the common steps.

Figure 18A:
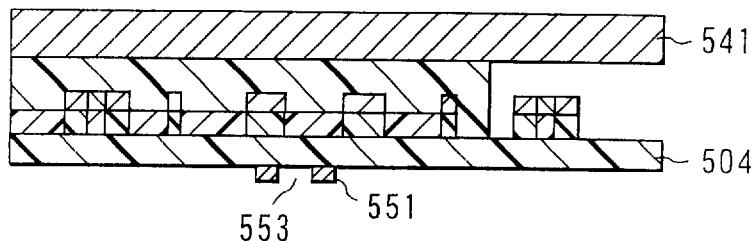
FIGS. 18A to 18C show each step continued from FIG. 17J in another method for manufacturing the optoelectric wiring substrate 70.
Figure 18B:
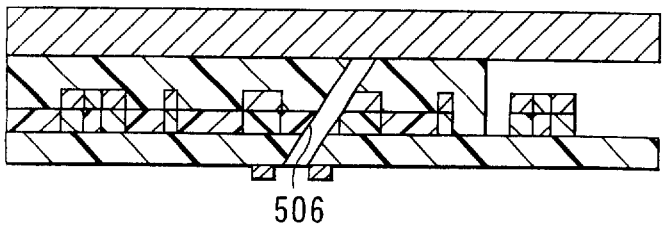
Figure 18C:
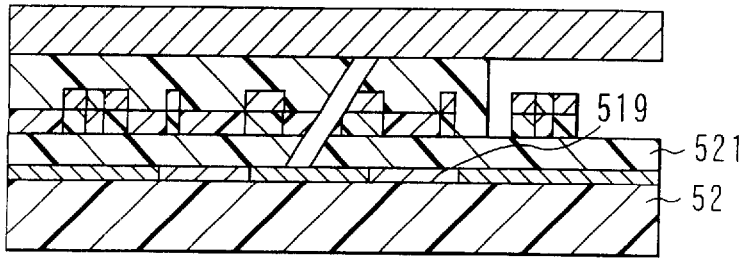

FIGS. 18A to 18C show the steps following the step shown in FIG. 17J.

After the second clad 506 is bonded to the second support substrate 541 in the step shown in FIG. 17J, a thin film of Cr and Cu is formed by a sputtering method on the first clad 504, as shown in FIG. 18A. In addition, a Cu layer is formed within a copper sulfate bath in a thickness of about 10 μm. Further, a photoresist pattern is formed by a photolithography technology, followed by etching with an etchant to form a mask 551 for a laser for forming a mirror. An opening 553 is formed in the mask 551 for the laser. The opening 553 alone can be processed by irradiation with a laser beam. The position of the mask for the laser is defined by the alignment mark 507.

In the next step, the mask 551 for the laser is irradiated with a laser beam such that the angle made between the substrate surface and the laser beam is set at 45° so as to form a mirror 512 making an angle of 45° with the substrate. An excimer laser, a carbon dioxide gas laser, a YAG laser, or the like is suitable for use as the laser.

Then, the mask 551 for the laser is removed with an etchant, as shown in FIG. 18C. Further, the substrate 52 having an electric wiring 519 formed thereon is coated with a thermoplastic denatured polyimide resin 521 used as an adhesive in a thickness of 20 µm. Then, the coating is dried, and the mirror-formed portions of the optical wiring layer are bonded to each other under heating.

Then, the steps shown in FIGS. 17M to 17P are carried out to obtain finally the optoelectric wiring substrate 72.

<Method 3-3 for Manufacturing an Optoelectric Wiring Substrate>

A method 3-3 of manufacturing an optoelectric wiring substrate 74 shown in FIG. 16A will now be described. The optoelectric wiring substrate 74 differs from the optoelectric wiring substrate 70 in two aspects. First of all, pads 509, lands 511 and electric wirings 513 formed are covered with the clad 503. Also, the clad 503 has a different pattern. It follows that the steps for patterning the clad 503 employed in method 3-1 can also be employed in method 3-3. Also, the steps for forming the resin layer 525 is newly added in method 3-3. The steps shown in FIGS. 19A to 19F are equal to those in method 3-1 and, thus, the description thereof is omitted.

Figure 19A:
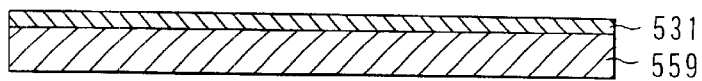
FIGS. 19A to 19O show each step of a method for manufacturing an optical wiring layer substrate 74.
Figure 19B:
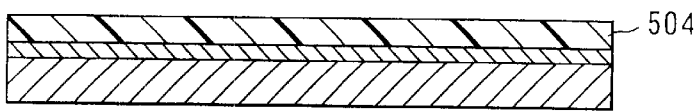
Figure 19C:
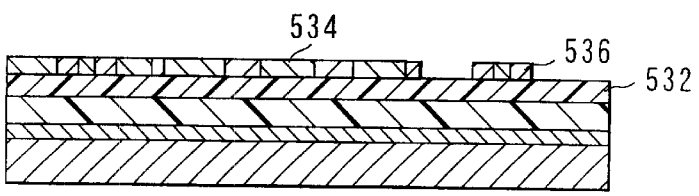
Figure 19D:
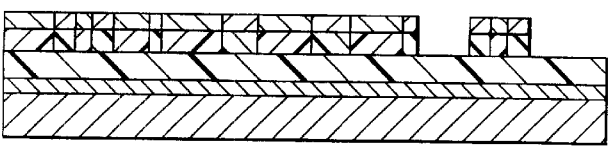
Figure 19E:
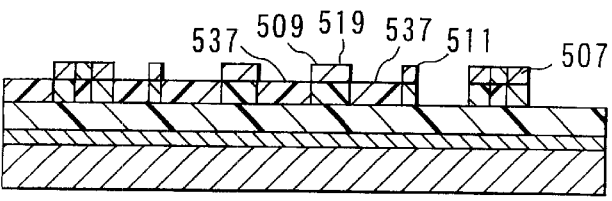
Figure 19F:
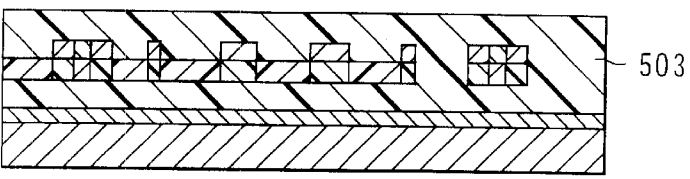
Figure 19G:
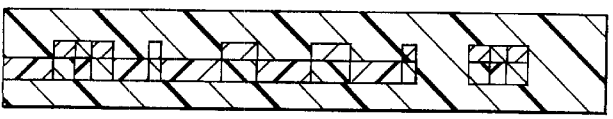
Figure 19H:
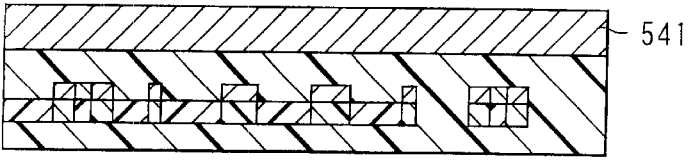
Figure 19I:
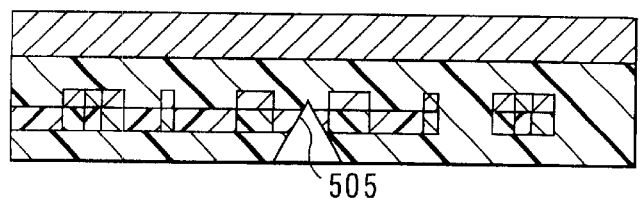
Figure 19J:
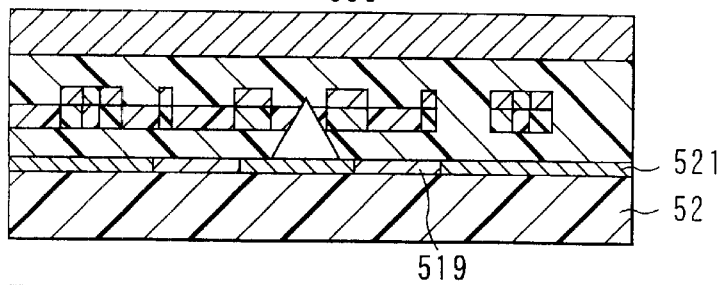
Figure 19K:
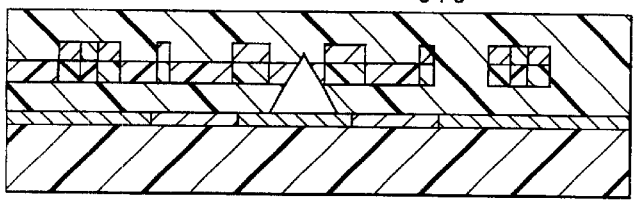
Figure 19L:
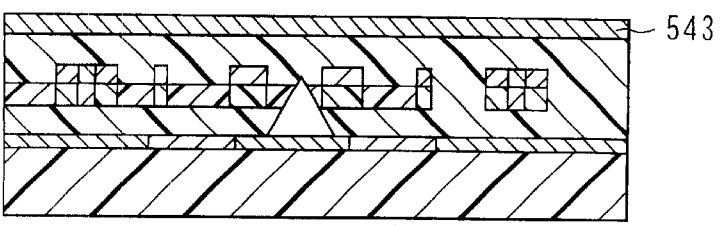
Figure 19M:
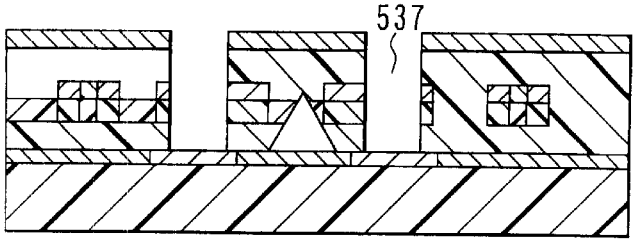
Figure 19N:
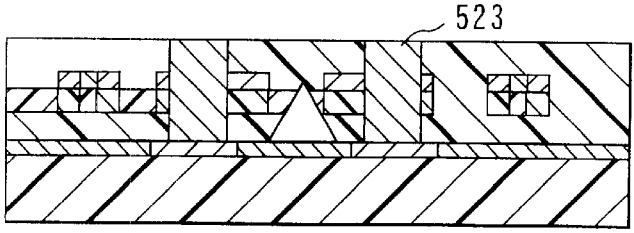
Figure 19O:
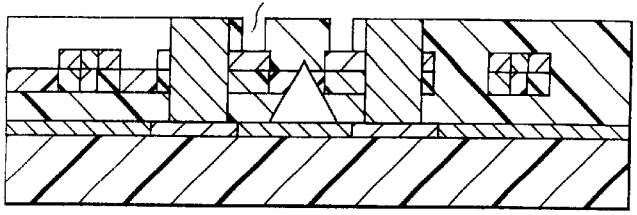

FIGS. 19G and 19O show the steps newly employed in method 3-3, which follow the step shown in FIG. 17E.

As shown in FIG. 19G, the Cu layer in the release layer 531 was dissolved in the release solution containing ferric chloride so as to peel the optical wiring layer from the first support substrate 559.

As shown in FIG. 19H, the second clad 506 was bonded to a second support substrate 541 by using an adhesive. The second support substrate 36 should be transparent such that an alignment mark 507 can be observed from the side on which the optical wiring layer is not bonded. It is desirable to use an adhesive that can be peeled off easily or that can be hardened upon irradiation with an ultraviolet light so as to decrease the adhesive strength.

As shown in FIG. 19I, a mirror 505 making an angle of 45° with the substrate is formed by a mechanical processing in a part of the core 501 using as a criterion the alignment mark (not shown) formed simultaneously with formation of the pattern of the core 501 acting as an optical wiring.

As shown in FIG. 19J, the substrate 52 is coated with a thermoplastic denatured polyimide resin 521 as an adhesive 521 in a thickness of 20 µm and, then, the coating is dried. Further, the polyimide resin 521 (adhesive 521) is attached to that surface of the optical wiring layer which is on the side of the mirror 505 so as to achieve bonding by heating.

As shown in FIG. 19K, the optical wiring layer is peeled off the second support substrate 541 by irradiation with an ultraviolet light. The optical wiring layer is covered with a plating resist 543 as a protect film as shown in FIG. 17N.

As shown in FIG. 19L, the optical wiring layer is peeled off the second support substrate 541 by irradiation with an ultraviolet light. The optical wiring layer is covered with a plating resist 543 as a protect film as shown in FIG. 19L.

As shown in FIG. 19M, a hole 545 for a via hole 523 is formed by a laser irradiation in the opening portion 537 of the land. An excimer laser, a carbon dioxide gas laser, a YAG laser, or the like is suitable for use as the laser.

In the step shown in FIG. 19M, a hole 537 for forming a via hole 523 is formed, followed by forming a thin film of Cr and Cu by a sputtering method on the surface of the optical wiring layer 75 and within the hole having a laser processing applied thereto. Then, a copper plating is applied to the inner region of the via hole 523 and to the land 513 within a copper sulfate bath using the metal thin film as an electrode. Further, the plating resist, which is the protective film 543, is removed to form the via hole 523.

As shown in FIG. 19O, the second clads 506 on the pads 509 are removed by laser processing using the alignment mark 507 as a criterion so as to expose the surface of the Cu plating and form holes 508. An excimer laser, a carbon dioxide gas laser, a YAG laser or the like is suitable for use as the laser.

The optoelectric wiring substrate 74 can be obtained by the steps described above.

Incidentally, in the method of manufacturing the optoelectric wiring substrate 74, it is possible to form a metal mask for a laser processing on the optical wiring layer 71, followed by applying a laser processing, in place of applying a mechanical processing to the mirror 512, thereby manufacturing the optoelectric wiring substrate 76 shown in FIG. 16B.

3. Mounting Substrate

Figure 20A:
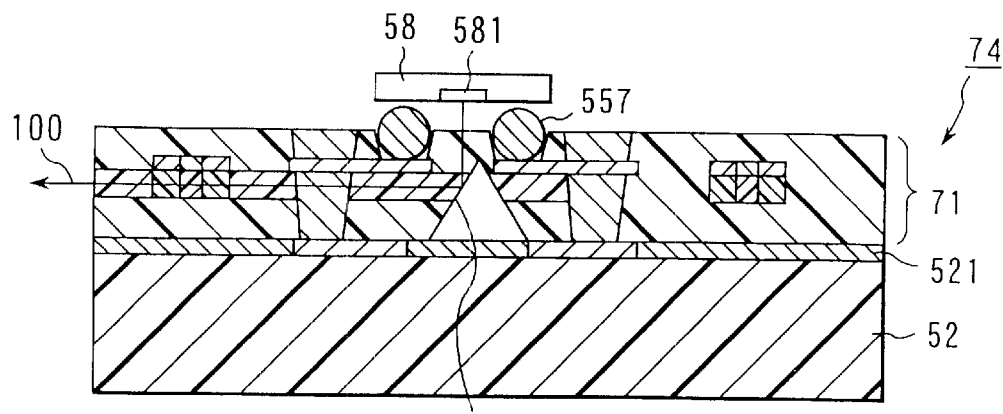
FIGS. 20A, 20B, and 21 show a mounted substrate in which an optical part (a light-emitting element, a light-receiving element, or the like) or an electric part is mounted on an optoelectric wiring substrate 70, 72, 74, 76.
Figure 20B:
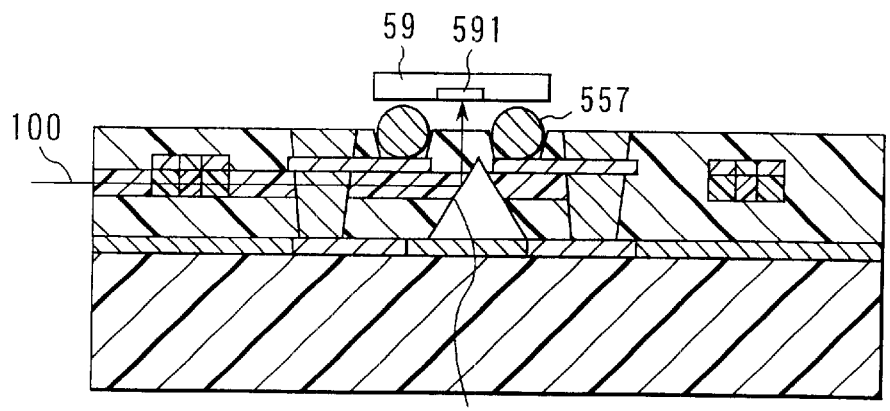
Figure 21:
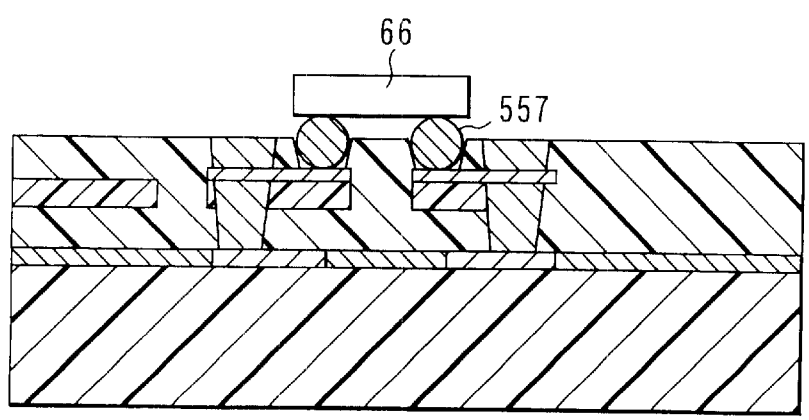

A mounting substrate having optical parts such as a light-emitting device and a light-receiving device and an electric part mounted to the optoelectric wiring substrate 70, 72, 74 or 76 obtained by the example of the present invention can be obtained by the method similar to that of the first embodiment. As a result, a mounting substrate as shown in FIGS. 20A, 20B and 21 can be obtained.

The particular construction of the present invention produces prominent effects as summarized below:

1. Since an optical wiring layer is formed on a substrate having an electric wiring formed thereon, a high density mounting or miniaturization can be achieved.

2. Since the positional relationship among the core that is an optical wiring, a pad for an optical part and a mirror is very close to that which is intended to achieve, the optical axis of the optical part can be easily aligned optically with the optical axis of the core that constitutes an optical wiring. As a result, the optical part and the electric part can be mounted simultaneously.

3. Since an electric wiring can also be formed on an optical wiring layer, it is possible to suppress the crosstalk between electric wirings.

4. Since an optical wiring layer is formed on a support member separately from the substrate having an electric wiring formed thereon, followed by bonding the optical wiring layer to the substrate, it is possible to suppress the influences given by the irregularity of the electric wiring formed on the substrate, thereby diminishing the light transmission loss of the core.

Fourth Embodiment

An important point of the optoelectric wiring substrate shown in forth embodiment is the concept that an absorption layer is provided between the optical wiring layer 82 and the substrate 52 for absorbing unevenness of the electric wiring 519.

A method of the optoelectric wiring substrate 80 according to the forth embodiment will be explained with reference to FIGS. 22 to 29.

Figure 22:
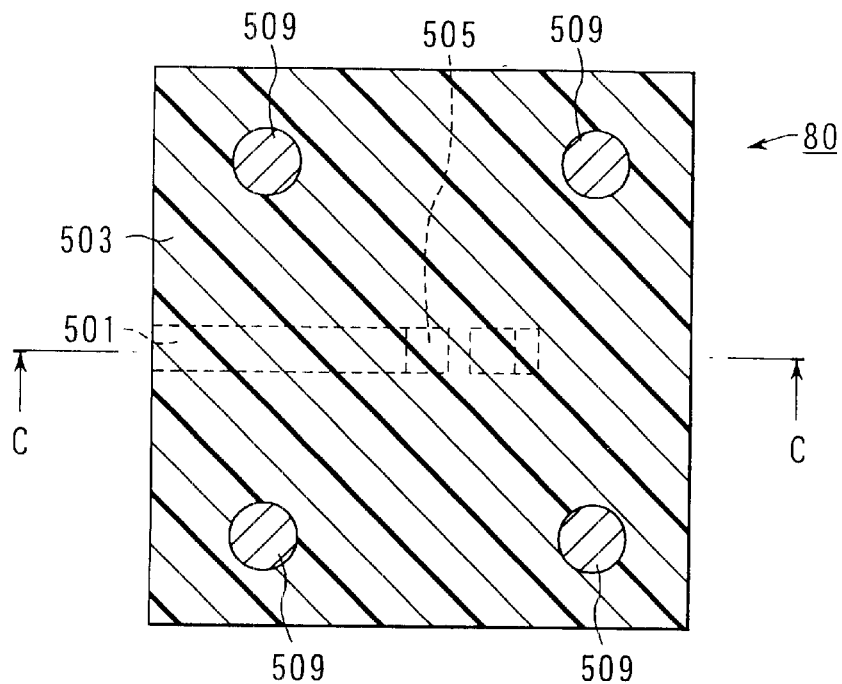
FIG. 22 is a top view of an optoelectric wiring substrate 80 as seen from an optical part-mounted side.

FIG. 22 shows a top view showing an optoelectric wiring substrate 80 as seen from an optical part-mounted side.

Figure 23:
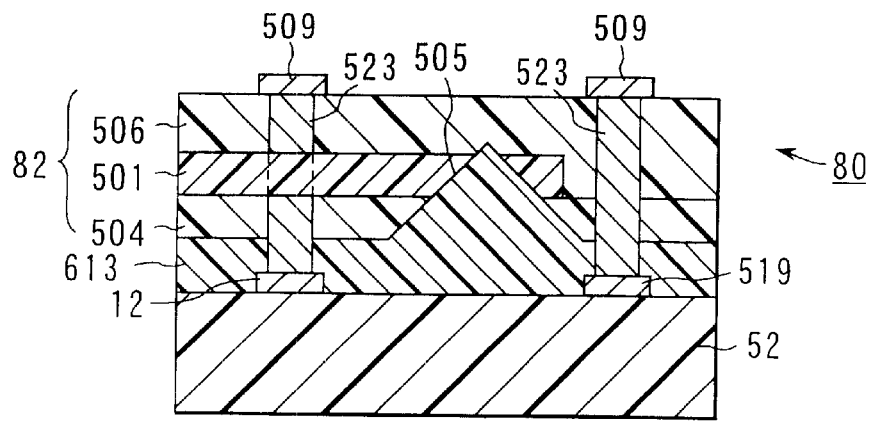
FIG. 23 is a sectional view taken along the direction C—C in FIG. 22.

FIG. 23 is a sectional view taken along the direction C—C in FIG. 22.

The electric wiring 519 is formed on the substrate 52. An absorption layer 613 absorbs unevenness of the electric wiring 519. According to this configuration, the optoelectric layer 82 is not affected by unevenness of the electric wiring 519.

The absorption layer 613 is comprised of a material having plasticity, elasticity, or both. In general, a plastic absorption layer is called a "smooth layer", and an elastic absorption layer is called a "cushion layer". Most preferably, a plastic and elastic adhesive is used to stick the optical wiring layer 82 to the substrate 52, so that the adhesive forms an adhesion layer also acting as an absorption layer.

Figure 24:
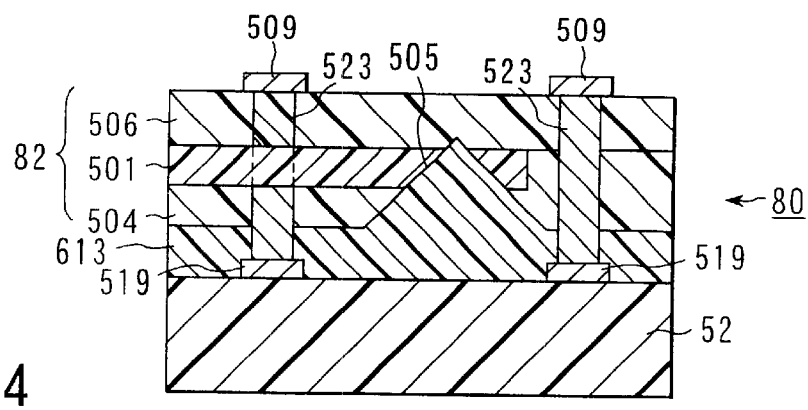
FIG. 24 shows another example of the optoelectric wiring substrate 80.

Incidentally, the positions of the first clad 504 and the second clad 506 and 4 may be reversed, as shown in FIG. 24, depending on formation of an optical and electric wiring layers. A substance constituting the first clad 504 may or may not be the same as a substance constituting the second clad 506. In addition, the second clad 506 in FIG. 24 is not necessarily flat and may even be absent.

Figure 25:
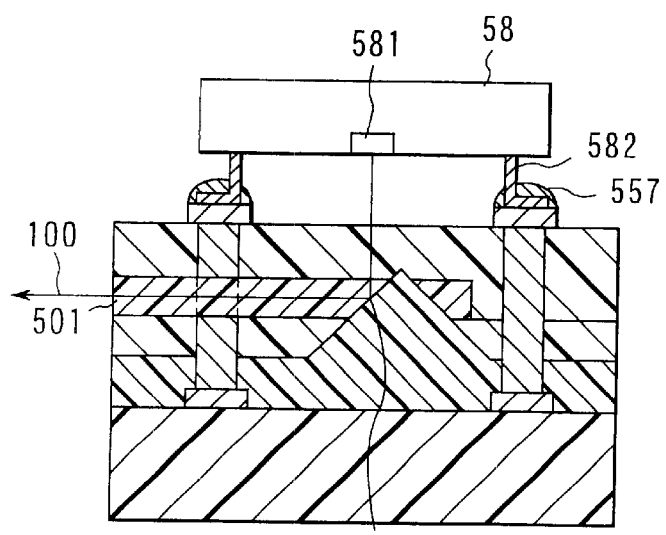
FIG. 25 is a sectional view of the optoelectric wiring substrate 80 with a light-receiving element soldered thereto.

FIG. 25 is a sectional view showing that leads 582 from a light-emitting element 58 such as a semiconductor laser are soldered to the pads 509. A laser beam 100 emitted from a light-emitting surface 581 of the laser light-emitting element 58 is reflected by a mirror 505 and then propagates through the core 501.

Figure 26:
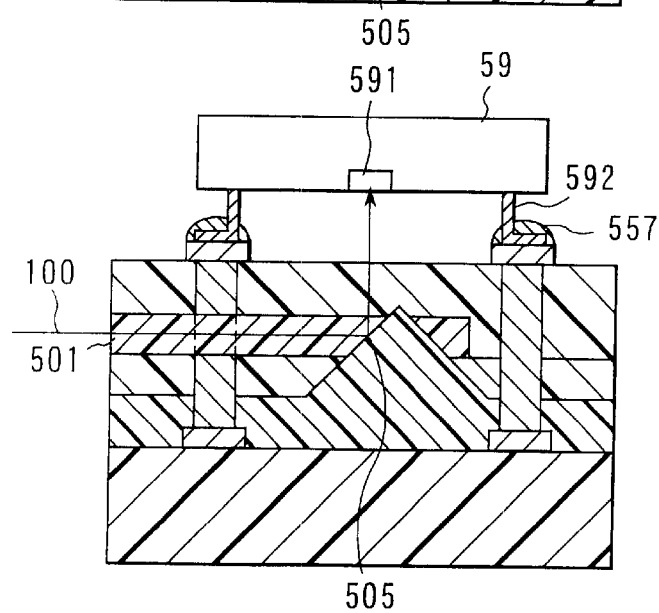
FIG. 26 is a sectional view of the optoelectric wiring substrate 80 with a light-emitting element photo diode soldered thereto.

FIG. 26 is a sectional view showing that leads from a laser light-receiving element 59 such as a photo diode are soldered to the pads 509. A laser beam 100 propagating through the core 501 is reflected by the mirror 505 and is then incident on a light-receiving surface 591 of the light-receiving element 59.

Moreover, pads 510 (not shown) for soldering an electric part or an electric wiring may be provided on the optical wiring layer of the optoelectric wiring substrate. Like the pads 509 for an optical part, the pads 510 for an electric part may be electrically connected to the electric wiring 519 on the substrate 52 through via holes 523.

If a electric wiring is provided on the optical wiring layer 82, the pads 510 may be connected only to the electric wiring on the optical wiring layer 82 but not to the electric wiring 519 on the substrate 52. In this case, of course, no via hole 523 exists which electrically connects the pad 510 to the electric wiring on the substrate 52.

2. Method for Manufacturing an Optoelectric Wiring Substrate

Next, a method for manufacturing an optoelectric wiring substrate 80 will be explained.

A summary of the method for manufacturing an optoelectric wiring substrate 80 will be given below.

First, an optical wiring layer 82 is produced on a support substrate which is separated from the substrate 52 having the electric wiring 519.

Next, a mirror is formed in part of a core.

Next, the optical wiring layer 82 is stuck to the electric wiring of the substrate 52 via the absorption layer 613.

Further, pads are produced which are electrically connected to the electric wiring 519 on the substrate through the via holes 523.

An import point of this manufacturing method is that the method comprises the step of stucking to the electric wiring of the substrate 52 via the absorption layer 613

Three examples of manufacturing methods will be describe below in further detail with reference to the drawings.

<Method 4-1 for Manufacturing an Optoelectric Wiring Substrate>

A method 4-1 for manufacturing an optoelectric wiring substrate will be explained by focusing on pads 509 for an optical part which are electrically connected to an electric wiring 519 on a substrate 52 via the via holes 523.

Figure 27A:
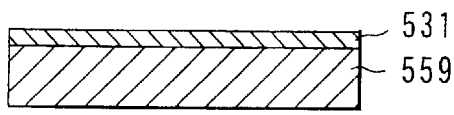
FIGS. 27A to 27Q show each step of a method for manufacturing an optical wiring layer substrate 80.
Figure 27F:
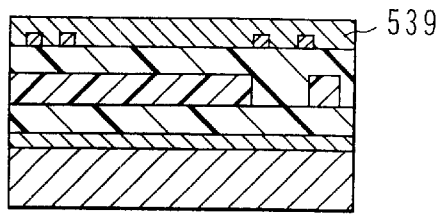
Figure 27B:
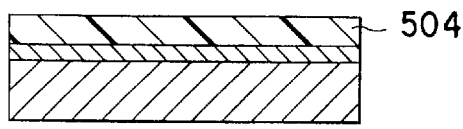
Figure 27G:
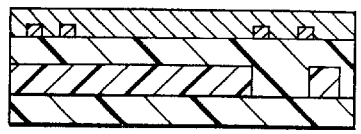
Figure 27C:
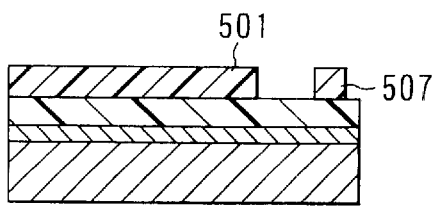
Figure 27H:
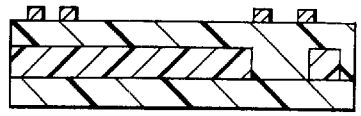
Figure 27D:
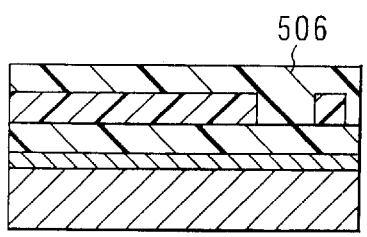
Figure 27I:
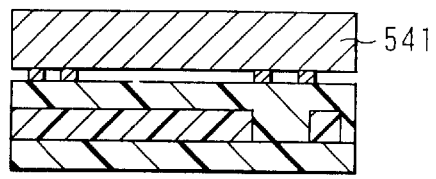
Figure 27E:
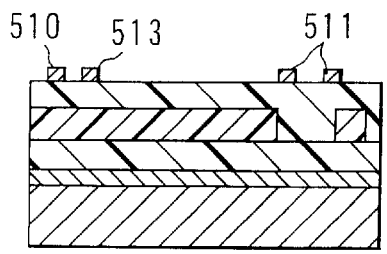
Figure 27J:
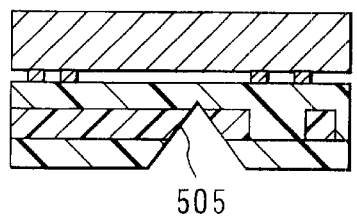
Figure 27K:
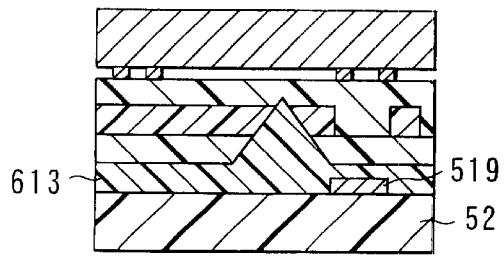
Figure 27L:
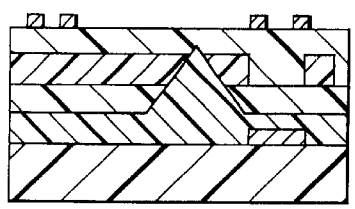
Figure 27M:
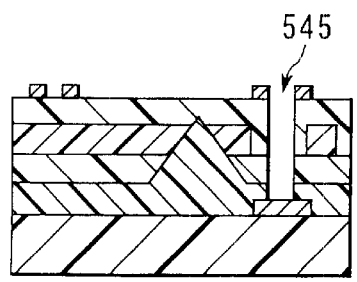
Figure 27N:
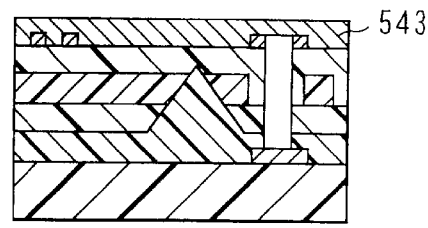
Figure 27O:
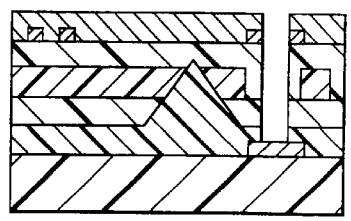
Figure 27P:
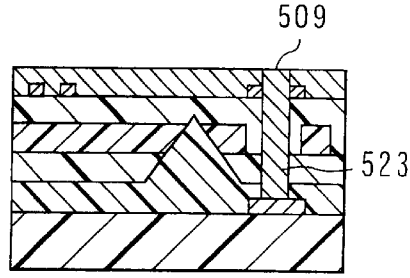
Figure 27Q:
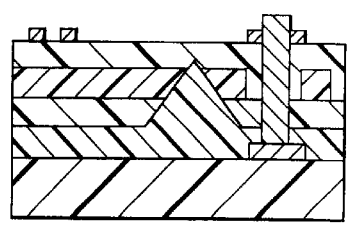

FIGS. 27A to 27Q show each step of the method for manufacturing the optoelectric wiring substrate 80 and arranged in the order of the steps.

As shown in FIG. 27A, a release layer 531 is formed on a first support substrate 559. The first support substrate 559 must be heat-resistant and robust and have a thermal expansion coefficient equal or close to that of an optical wiring layer.

As shown in FIG. 27B, a first clad 504 is formed on the release layer 531.

A core layer 532 is formed on the first clad 504, and a core 501 through which light propagates and an alignment mark 507 for alignment are simultaneously produced using the photolithography technology as shown in FIG. 27C. The resulting locational relationship between the core 501 and the alignment mark 507 is very close to an intended one.

As shown in FIG. 27D, the core 501 and the alignment mark 507 are covered with an second clad 506.

This results in an optical wiring layer consisting of the first clad 504, the core 501 for propagating light, and the second clad 506.

Next, using the alignment mark 507 as a reference, lands 511, pads 510 for an electric part, and an electric wiring 513 are produced on the optical wiring layer by means of the semi-additive method. FIG. 27E show lands 511, pads 510 for an electric part, and an electric wiring 513.

Further, a release agent protect film 539 is formed, as shown in FIG. 27F, to protect the lands 511, pads 510 for an electric part, and electric wiring 513 produced on the optical wiring layer.

Furthermore, the structure is immersed in a release agent to dissolve the release layer 531, and the optical wiring layer is released from the first support substrate 559 to produce an optical wiring layer such as that shown in FIG. 6G.

Further, the protect film 539 is removed to obtain an optical wiring layer 82 such as that shown in FIG. 27H.

As shown in FIG. 27I, a side of the optical wiring layer 82 on which the lads 511, the pads 510 for an electric part, and the electric wiring 513 are formed is stuck to a second support 541 using an adhesive. The second support 541 must be transparent so that the alignment mark 507 can be seen from its side to which the optical wiring layer 82 is not stuck. In addition, the adhesive must be easy to release or have a thermosetting or an ultraviolet-hardening property.

A groove is formed in the optical wiring layer by means of dicing to form a mirror 505, as shown in FIG. 27J.

As shown in FIG. 27K, using the alignment mark 507 and an alignment mark on the substrate 52 (not shown) as references, the mirror 505 side of the optical wiring layer 82 is stuck via an absorption layer 613 to a side of the substrate 52 which has an electric wiring 519. The absorption layer 613 is produced on the substrate 52 before the optical wiring layer 82 is stuck thereto or the absorption layer 613 is produced on the mirror 505 side of the optical wiring layer before it is stuck to the substrate 52. As described above, the absorption layer 613 may be a smooth or cushiony layer or have both of these properties, but it is preferably an adhesion layer comprised of an adhesive having both properties.

As shown in FIG. 27L, the second support substrate 541 is released from the optical wiring layer 82. If an thermosetting or ultraviolet-hardening adhesive has been used to stick the second support substrate 541 and the optical wiring layer 82 together, the second support substrate 541 is peeled off after being hardened by means of heat or ultraviolet rays, respectively.

As shown in FIG. 27M, using the alignment mark 507 as a reference, a hole 66 for forming a via hole is formed in the optical wiring layer by means of a laser. Next, although not shown, a thin chromium film is sputtered on the surface of the hole 66 and a surface of the optical wiring layer which is opposed to the substrate 52, and then a thin copper film is also sputtered on the thin chromium film.

A protect film 543 is coated on the surface of the optical wiring layer 82 as shown in FIG. 27N.

Next, alignment is carried out using the alignment mark 507 and a pad 510 pattern in a photo mask, and the protect film 543 is exposed via this photo mask and then developed in such a manner that only the hole 66 portion of the protect film 543 is removed.

Further, the thin copper film formed on the surfaces of the hole 545 and optical wiring layer is used as an electrode to electroplate the copper in order to produce a pad 509 and a via hole 523 for an optical part, as shown in FIG. 27O.

The protect film 543 is removed. Subsequently, the thin chromium and copper films formed on the surface of the optical wiring layer are removed by means of soft etching to obtain an optoelectric wiring substrate 80 such as that shown in FIG. 27Q.

<Method 4-2 for Manufacturing an Optoelectric Wiring Substrate>

An another method 4-2 for manufacturing an optoelectric wiring substrate will be explained by focusing on pads 509 for an optical part which are electrically connected to an electric wiring 519 on a substrate 52 via the via holes 523.

FIGS. 28A to 28L show each step of the method for manufacturing the optoelectric wiring substrate 80 and arranged in the order of the steps.

As shown in FIG. 28A, a release layer 531 is formed on a first support substrate 559.

As shown in FIG. 28B, a first clad 504 is formed on the release layer 531.

A core layer 532 is formed on the first clad 504, and a core 501 through which light propagates alignment marks 507 for alignment are simultaneously produced using the photolithography technology as shown in FIG. 28C. The resulting locational relationship between the core 501 and the alignment marks 501 is very close to an intended one.

As shown in FIG. 28D, the core 501 and the alignment mark 507 are covered with an second clad 506. This results in an optical wiring layer consisting of the first clad 504, the core 501 for propagating light, and the second clad 506.

A groove is formed in the optical wiring layer by means of dicing to form a mirror 505, as shown in FIG. 28E.

Furthermore, the structure is immersed in a release agent to dissolve the release layer 531, and the optical wiring layer is released from the first support substrate 559 to obtain an optical wiring layer 82 such as that shown in FIG. 28F.

As shown in FIG. 28G, using the alignment marks 507 and an alignment mark on a substrate 52 (not shown) as references, a mirror 505 side of the optical wiring layer is stuck via an absorption layer 613 to a side of the substrate 52 which has an electric wiring 519. The absorption layer 613 is produced on the substrate 52 before the optical wiring layer is stuck thereto or the absorption layer 613 is produced on the mirror 505 side of the optical wiring layer before it is stuck to the substrate 52. As described above, the absorption layer 613 may be a smooth or cushiony layer or have both of these properties, but it is preferably an adhesion layer comprised of an adhesive having both properties.

As shown in FIG. 28H, using the alignment mark 507 as a reference, a hole 545 for forming a via hole 523 is formed in the optical wiring layer by means of a laser. Next, although not shown, a thin chromium film is sputtered on the surface of the hole 545 and a surface of the optical wiring layer which is opposed to the substrate 52, and then a thin copper film is also sputtered on the thin chromium film.

A resist 554 (protect film 539) is coated on the surface of the optical wiring layer 82 as shown in FIG. 28I.

Next, a photo mask is aligned using the alignment mark 507 as a reference, and the resist 539 is exposed via this photo mask and then developed in such a manner that only a portion of the resist 539 is removed on which pads and an electric wiring are to be produced, as shown in FIG. 28J.

Further, the thin copper film formed on the surfaces of the hole 545 and optical wiring layer is used as an electrode to electroplate the copper in order to produce a pad 509 for an electric part, an electric wiring 513, a via hole 523, and the pad 510 for an electric part, as shown in FIG. 28K.

The resist 539 is removed. Subsequently, the thin chromium and copper films formed on the surface of the optical wiring layer 82 are removed by means of soft etching to obtain an optoelectric wiring substrate such as that shown in FIG. 28L.

<Method 4-3 for Manufacturing an Optoelectric Wiring Substrate>

Another method 4-3 for manufacturing an optoelectric wiring substrate 83 (see FIG. 29P) will be explained by focusing on pads 509 for an electric part which are electrically connected to an electric wiring 519 via the via holes 523.

Figure 29A:
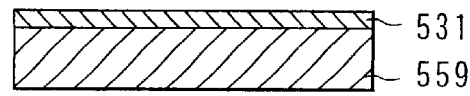
FIGS. 29A to 29P show each step of a method for manufacturing an optical wiring layer substrate 83.
Figure 29B:
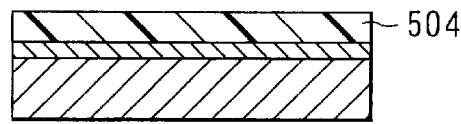
Figure 29C:
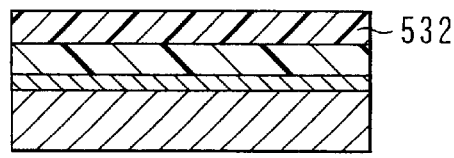
Figure 29D:
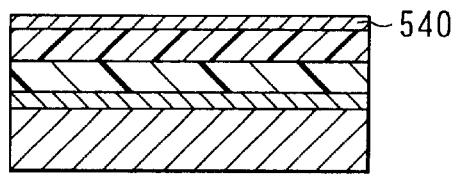
Figure 29E:
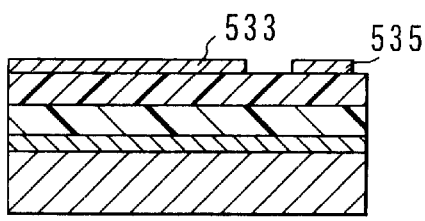
Figure 29F:
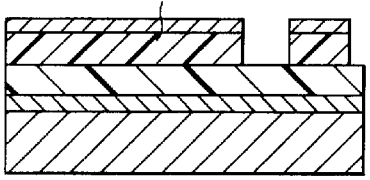
Figure 29G:
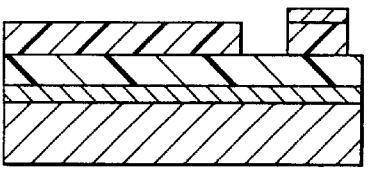
Figure 29H:
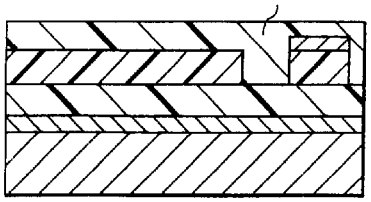
Figure 29I:
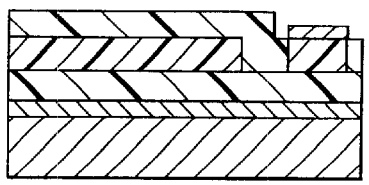
Figure 29J:
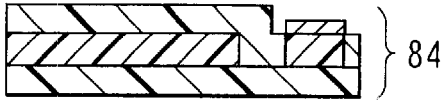
Figure 29K:
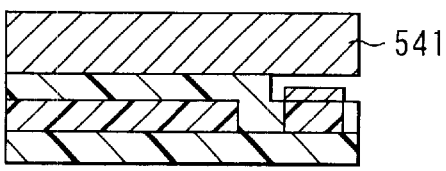
Figure 29L:
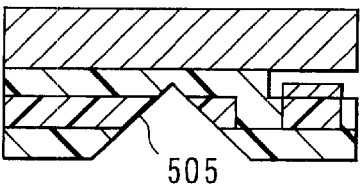
Figure 29M:
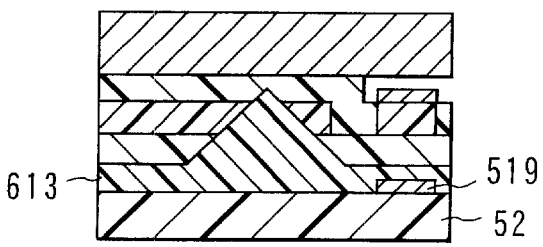
Figure 29N:
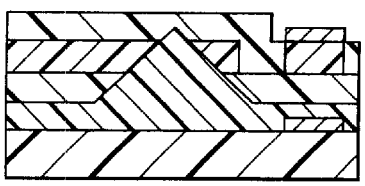
Figure 29O:
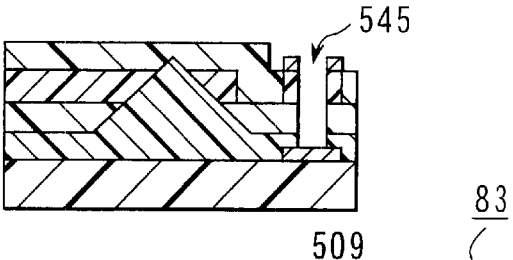
Figure 29P:
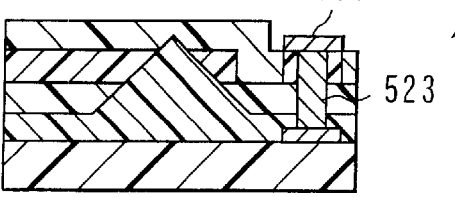

FIG. 29A to 29P show each step of the method for manufacturing the optoelectric wiring substrate 83 and arranged in the order of the steps.

As shown in FIG. 29A, a release layer 531 is formed on a first support substrate 559. The first support substrate 559 must be heat-resistant and robust and have a thermal expansion coefficient equal or close to that of an optical wiring layer.

As shown in FIG. 29B, a first clad 504 is formed on the release layer 531.

As shown in FIG. 29C, a core layer 532 is formed on the first clad 504.

As shown in FIG. 29D, a thin chromium film is sputtered on the core layer 532, and then a thin copper film is also sputtered on the chromium film to produce a thin metal film 540 consisting of two layers of the chromium film and the copper film.

The thin metal film 540 is processed by means of the photolithography technology to produce metal masks. As seen in FIG. 29E, the metal masks include a metal mask 533 corresponding to the core 501 pattern and a metal mask 535 corresponding to a pattern of optical-part pads 509. Both patterns are simultaneously formed. Thus, the locational relationship between the core 501 acting as an optical wiring and the pads 509 for an optical part is precisely equal to an intended one. A metal mask section may also be simultaneously formed which represents a pattern of pads 510 for an electric part and a pattern of an electric wiring 513.

As shown in FIG. 29F, a portion of the core layer 532 which is not covered with the metal mask is removed by means of dry etching to remove the metal mask, that is, a core 501 is formed.

As shown in FIG. 29G, the metal masks 533, 535 are removed from the core 501, using the photolithography technology.

An second clad 506 is coated as shown in FIG. 29H.

Using the photolithography technology, the second clad 506 is removed from the optical-part pads 509, as shown in FIG. 29I. During this processing, the optical-part pads 509 functions as a resist so as not to be affected by etching.

A release agent protect film is formed on the second clad 506 and the optical-part pad 509. Then, the structure is immersed in a release agent, and the optical wiring layer is released from the first support 559. Further, the release agent protect film 531 is removed to obtain an optical wiring layer such as that shown in FIG. 29J.

As shown in FIG. 29K, the optical-part pads 509 side of the electric wiring layer 84 is stuck to a second support substrate 541. The adhesive used must be easy to release or have a thermosetting or an ultraviolet-hardening property.

A groove is formed in the optical wiring layer by means of dicing to form a mirror 505, as shown in FIG. 29L.

As shown in FIG. 29M, the mirror 505 side of the optical wiring layer 84 is stuck via an absorption layer 613 to a side of the substrate 52 which has an electric wiring 519. The absorption layer 613 is produced on a substrate 115 before the optical wiring layer is stuck thereto or the absorption layer 613 is produced on the mirror 505 side of the optical wiring layer before it is stuck to the substrate 52. As described above, the absorption layer 613 may be a smooth or cushiony layer or have both of these properties, but it is preferably an adhesion layer comprised of an adhesive having both properties.

As shown in FIG. 29N, the second support substrate 541 is released from the optical wiring layer 84. If an thermosetting or ultraviolet-hardening adhesive has been used to stick the second support substrate 541 and the optical wiring layer together, the second support substrate 541 is peeled off after being hardened by means of heat or ultraviolet rays, respectively.

As shown in FIG. 29O, a hole 116 for forming via holes 545 is formed in a central portion of the optical-part pads 509 by means of a laser.

Further, as shown in FIG. 29P, the hole 545 is filled with copper by means of the semi-additive method to form via holes 523 and pads 509 electrically connected through the via holes 523 to the electric wiring 519 on the substrate 52, thereby obtaining an optoelectric wiring substrate.

These steps complete the optoelectric wiring substrate 83.

In the method 4-3 for manufacturing an optoelectric wiring substrate 83, the second clad 506 may be omitted. In this case, the method is the same as the above manufacturing method except for the lack of the need to coat the second clad 506 or to remove the second clad 506 from the optical-part pad 509.

As understood from the above explanation, the present invention has the following effects:

First, since the absorption layer absorbs the unevenness of the electric wiring on the substrate, the propagation loss of optical signals does not occur. In addition, when the optical wiring layer is stuck to the electric substrate, the sticking operation can be preformed precisely as intended.

Second, since the optical wiring layer is provided on the substrate with the electric wiring, high-density mounting or size reduction can be achieved.

Third, according to the embodiment of the present manufacturing method, the locational relationship between the core acting as an optical wiring through which light propagates and the pads for an optical part is very close to an intended one, whereby an optical axis of an optical part can be optically aligned with an optical axis of an optical wiring easily. Consequently, optical and electric parts can be simultaneously and automatically mounted.

Fifth Embodiment

Some conventional methods for optically coupling an optical part to an optical wiring provide a mirror in an optical wiring layer.

Figure 30:
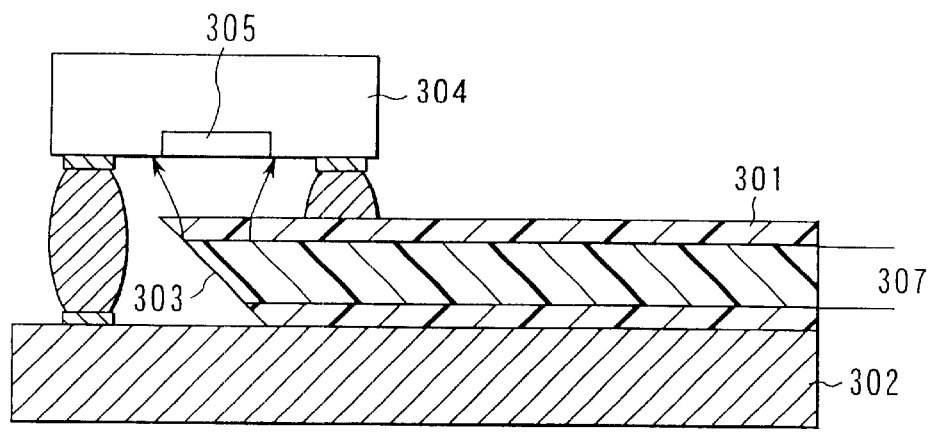
FIG. 30 shows an example of a conventional optical wiring layer.

FIG. 30 is a specific example described in Japanese Laid-Open Patent Publication (Kokai) No. 5-241044. A laser beam 307 propagating through an optical waveguide 301 is reflected by a mirror 303 and is then incident on a light-receiving surface 305 of a light-receiving element 304.

Figure 31:
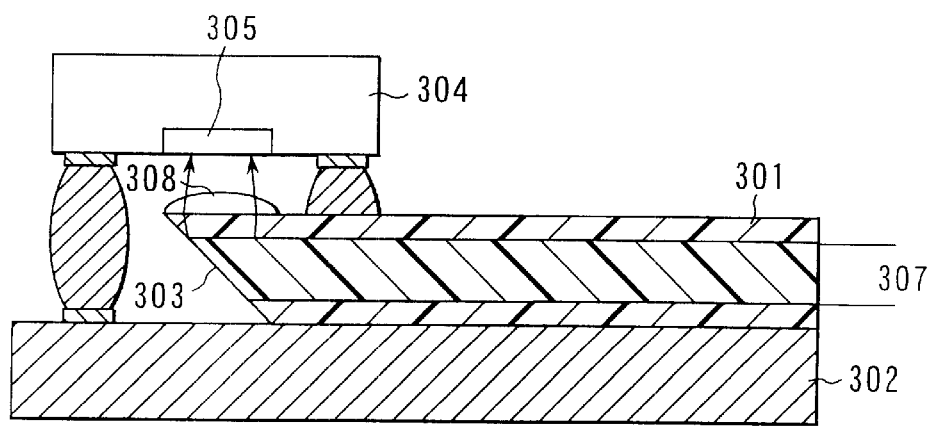
FIG. 31 shows another example of a conventional optical wiring layer.

Since, however, the laser beam 307 reflected by the mirror 303 diffuses, the optical coupling efficiency diminishes if the light-receiving surface 305 is small. For example, the invention in Japanese Laid-Open Publication (Kokai) No. 5-241044 takes the following action:

FIG. 31 shows an example of an apparatus described in Japanese Laid-Open Publication (Kokai) No. 5-241044. This apparatus has a convex lens 308 on a surface of the waveguide 301 to converge the diffused laser beam 307 on the light-receiving surface 305, thereby increasing the optical coupling efficiency In the configuration shown in FIG. 31, however, the optimal convex lens 308 varies depending on the relative locational relationship between a light-receiving element 304 and the optical waveguide 301 or the size of the light-receiving surface. Thus, if various types of optical parts are mounted, different convex lenses 308 must be produced which correspond to each type of optical part, and this is cumbersome.

1. Optical Wiring Layer

In fifth embodiment, an optoelectric wiring substrate, which increases the optical coupling efficiency between an optical wiring of the optoelectric wiring substrate and an optical part or the like, will be explained. Incidentally, this optoelectric wiring substrate is available for each of the optoelectric wiring substrates above mentioned.

Figure 32:
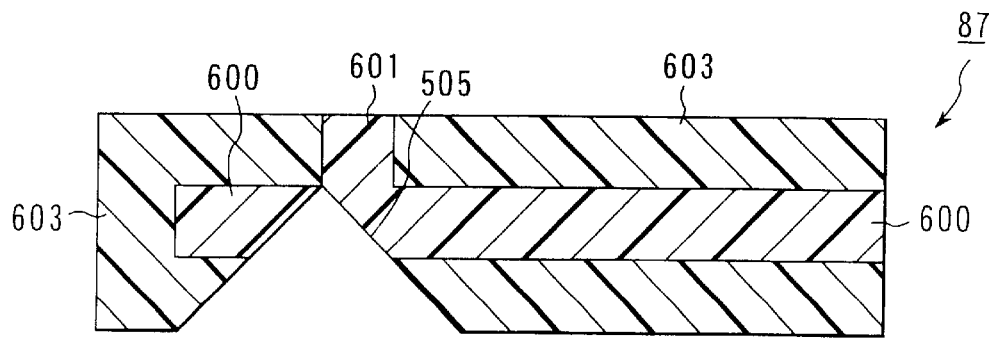
FIG. 32 is a sectional view of an optical wiring layer 87.

An important point of the optoelectric substrate shown in fifth embodiment is the concept that a new optical wiring layer, which propagates optical signals reflected by a mirror, is provided 1. Optoelectric Wiring Substrate FIG. 32 is a sectional view of an optical wiring layer 87 of an optoelectric mounted substrate 86 according to a fifth embodiment (see FIGS. 37 and 38). First, the optical wiring layer 87 will be described with reference to these figures.

The optical wiring layer 87 has a first core 600 extending parallel therewith and a second core 601 extending perpendicularly thereto. These cores constitute an optical wiring and are surrounded by a clad 23.

Figure 33:
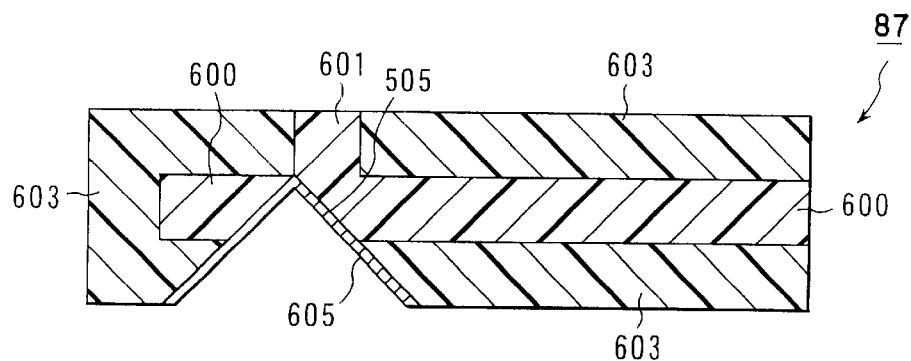
FIG. 33 is another example of the optical wiring layer 87.

An intersection between the first core 600 and the second core 601 includes a mirror 505 formed at 45° relative to the optical wiring layer. As described above, the interface of the mirror 505 is brought in contact with a resin having a lower refractive index than the second core 601 or with air. Alternatively, a reflecting layer comprised of a thin metal film 505 (for example, a thin aluminum film) may be provided as in the optoelectric wiring substrate 81 shown in FIG. 33.

Figure 34:
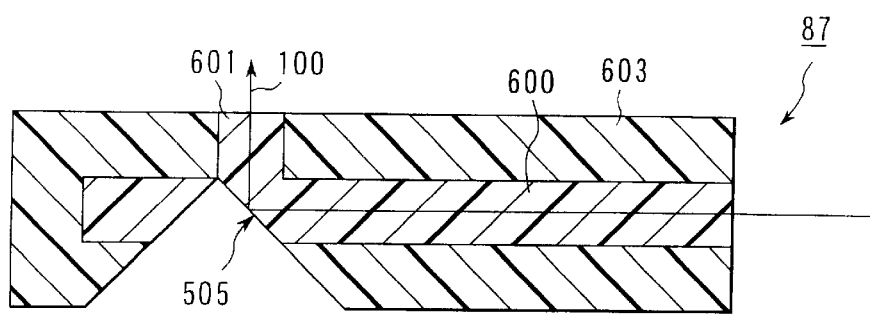
FIG. 34 describes propagation of an optical signal through the optical wiring layer 87.

An optical signal propagates through the optical wiring layer as follows:

FIG. 34 describes propagation of an optical signal (laser beam) through the optical wiring layer.

As shown in FIG. 5, a laser beam 100 propagating through the first core 600 is reflected by the mirror 505 and further propagates through the second core 602. Thus, even when the laser beam 100 diffuses after reflection from the mirror 505, it is confined in the core 601 and thus emitted from an end of the core 691 to an optical part (not shown) as a thin beam.

2. Method for Manufacturing an Optical Wiring Layer.

Next, a method for manufacturing the optical wiring layer 87 will be described.

First, a manufacturing method will be explained in which a reflecting layer comprised of a metal film is not provided on the mirror 505.

<Method 5-1 for Manufacturing an Optical Wiring Layer>

FIGS. 35A to 35F sequentially show the steps of the manufacturing method.

First, as shown in FIG. 38A, a release layer 531 is formed on a first support substrate 559.

Figure 35A:
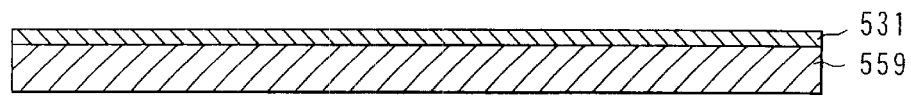
FIGS. 35A to 35F show each step of a method for manufacturing the optical wiring layer 87.
Figure 35B:
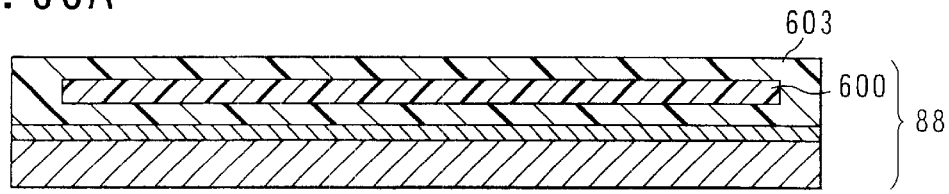

As shown in FIG. 35B, a layer 88 consisting of the first core 600 and the clad 603 is formed on the release layer 531 by means of the photolithography technology.

Figure 35C:
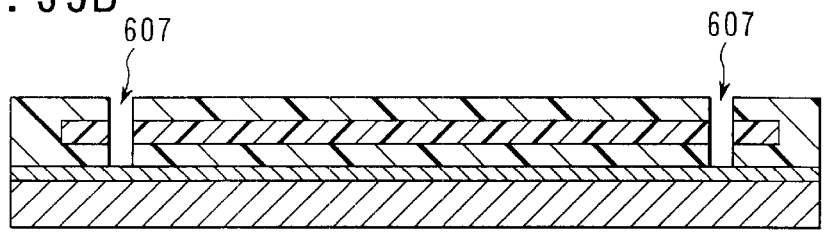

As shown in FIG. 35C, a laser is used to form a hole 607 extending perpendicularly to a layer 82.

Figure 35D:
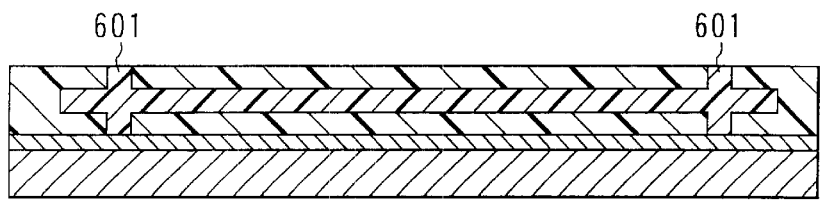

As shown in FIG. 35D, the hole 607 is filled with the same material as the first core 600 to form the second core 601.

Figure 35E:
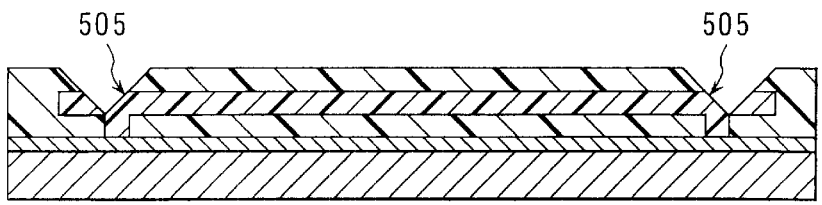

As shown in FIG. 35E, grooves are formed at intersections between the first core 600 and the second core 601 by means of dicing.

Figure 35F:
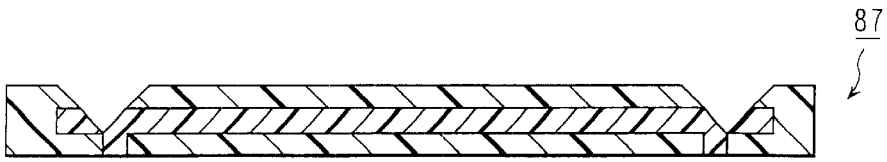

The release layer 531 is immersed in a release agent to release the optical wiring layer from the first substrate 559, thereby obtaining the optoelectric wiring layer 87 shown in FIG. 35F.

<Method 5-2 for Manufacturing an Optical Wiring Layer>

Next, a manufacturing method will be described in which a mirror 506 with a reflecting layer comprised of a metal film is formed.

FIGS. 36A to 36H sequentially show the steps of the manufacturing method.

Figure 36A:
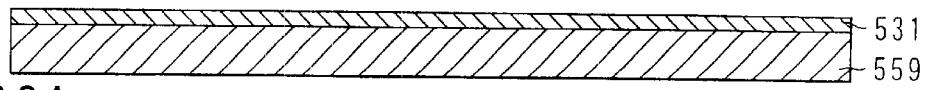
FIGS. 36A to 36H show each step of another method for manufacturing the optical wiring layer 87.

As shown in FIG. 36A, the release layer 531 is formed on the first support substrate 559.

Figure 36B:
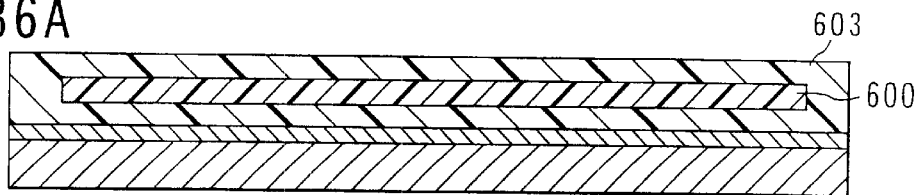

As shown in FIG. 36B, the layer 82 consisting of the first core 600 and the clad 603 is formed on the release layer 531 by means of the photolithography technology.

Figure 36C:
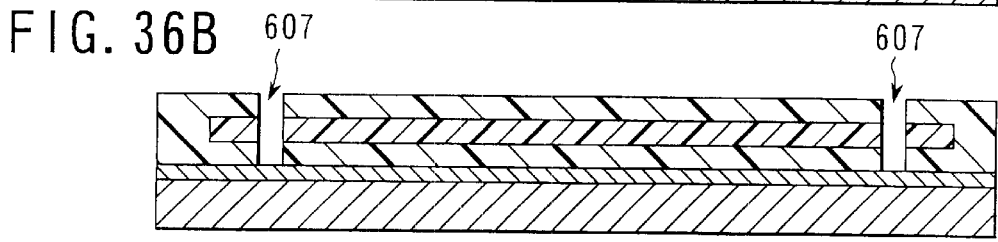

As shown in FIG. 36C, a laser is used to form the hole 607 extending perpendicularly to the layer 88.

Figure 36D:
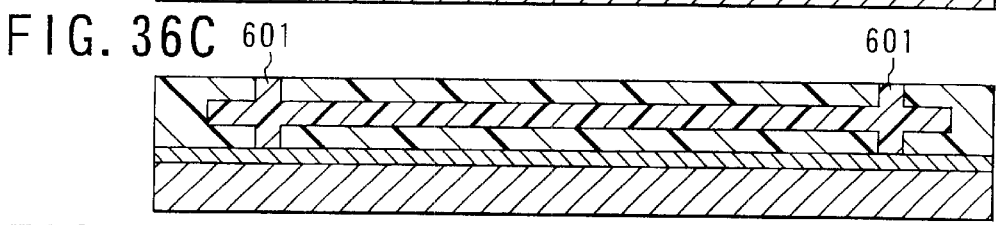

As shown in FIG. 36D, the hole 607 is filled with the same material as the first core 600 to form the second core 601.

Figure 36E:
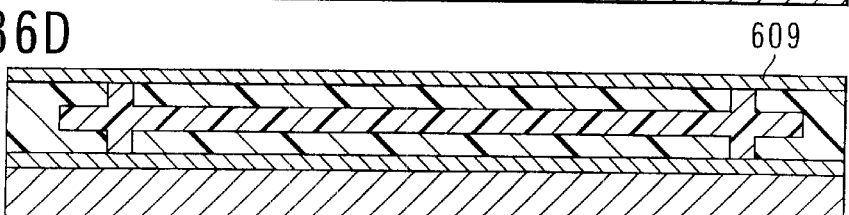

As shown in FIG. 36E, a film 609 is coated on the layer 88. The film 609 may be replaced with a resist.

Figure 36F:
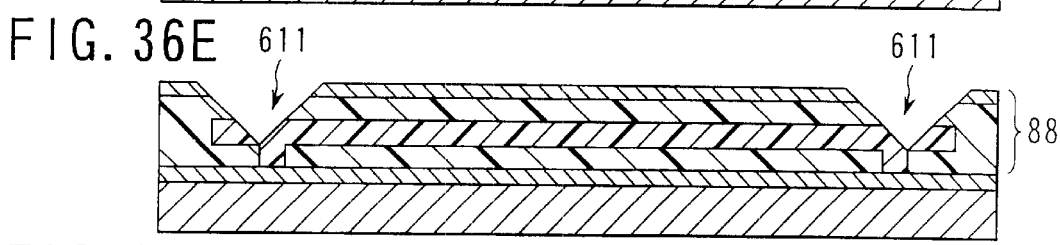

Grooves 611 are formed by means of dicing as shown in FIG. 36F.

Figure 36G:
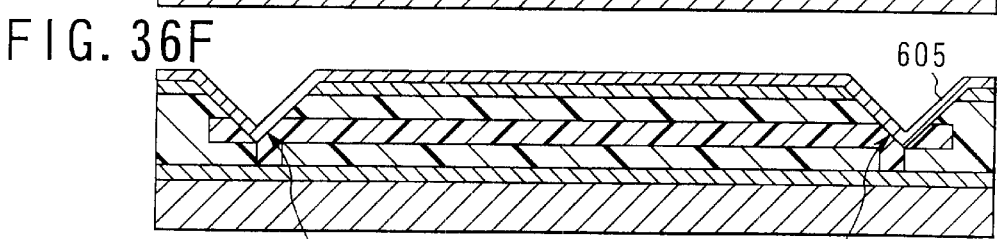
Figure 36H:
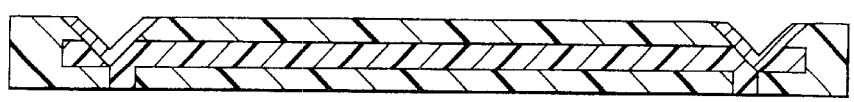

As shown in FIG. 36G, the layer 88 is covered with a metal film 605 such as aluminum to produce the mirror 505.

The film 609 is peeled off to release the metal film 605 except for the groove 607 portions. Further, the release layer 531 is immersed in a release agent to release the optical wiring layer from the first substrate 559, thereby obtaining the photoelectric wiring layer 81 shown in FIG. 39H.

3. Photoelectric Wiring Substrate

Next, a photoelectric wiring substrate 86 having the optical wiring layer 87 will be described.

Figure 37:
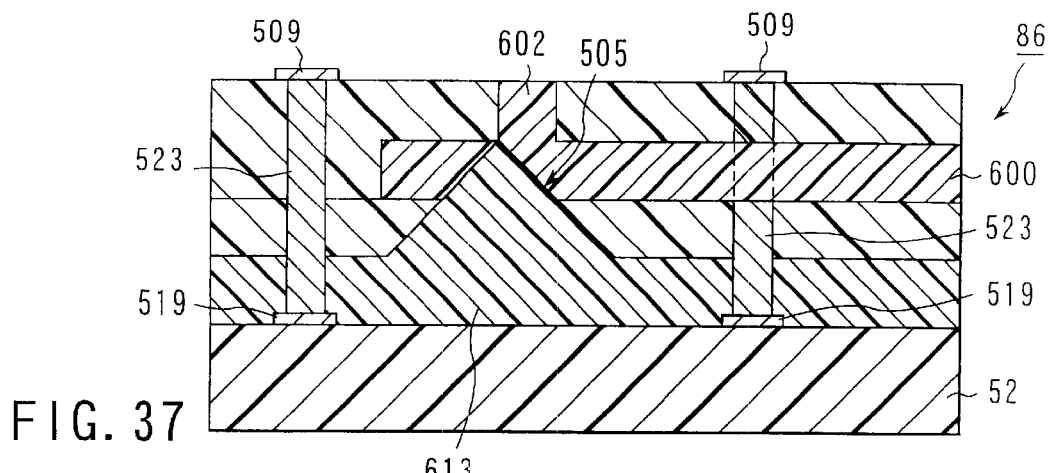
FIG. 37 is a sectional view of an optoelectric wiring substrate 86.

FIG. 37 is a sectional view taken along the first core 600 of the photoelectric mounted substrate 86 according to the fifth embodiment. Furthermore, the photoelectric wiring substrate 86 comprises the optical wiring layer 81 and an electric wiring substrate 52 stuck together via an absorption layer 519. Further, the optical wiring layer 87 has pads, lands, an electric wiring, and via holes formed therein.

New components will be explained below.

An absorption layer 613 absorbs the unevenness of the electric wiring 519 to reduce the propagation loss of optical signals through the first and second cores 600 and 601. The absorption layer 67 must be comprised of a substance having plasticity, elasticity, or both. In general, an absorption layer comprised of a plastic substance is called a "smooth layer", and an absorption layer comprised of an elastic material is called a "cushion layer". Most preferably, a plastic and elastic adhesive is used to stick the optical wiring layer to the substrate 52, so that the adhesive forms an adhesion layer also acting as the absorption layer.

If a reflecting layer comprised of a metal film is not provided on the mirror 505, the mirror surface, which corresponds to the end surfaces of the first and second cores 600 an 601, is in direct contact with the absorption layer 613. In this case, to allow a laser beam to be totally reflected by the mirror 505, the absorption layer 613 must have a smaller refractive index than the cores 600, 601. Accordingly, the absorption layer 613 is preferably a medium that is flexible enough to fill in the grooves 611 and that has a smaller refractive index than the cores. With these properties, the absorption layer 613 can not only fill the grooves 611 but also stick the optical wiring layer to the substrate.

In addition, an end surface of the mirror 505 and the absorption layer 613 may be in contact with each other via a medium meeting the above conditions. For example, air may be present between the end surface of the mirror 505 and the absorption layer 613 (because air meets the above conditions).

As in the above photoelectric wiring substrates, pads for soldering an electric part or the electric wiring may be provided on the optical wiring layer 87 of this substrate 86. Like pads for an optical part, pads for an electric part may be electrically connected to the wiring on the substrate through via holes.

In addition, if the electric wiring is provided on the optical wiring layer, the pads may be connected only to the electric wiring on the optical wiring layer but not to the electric wiring on the substrate. In this case, of course, no via hole exists which electrically connects the pad to the electric wiring on the substrate.

Figure 38:
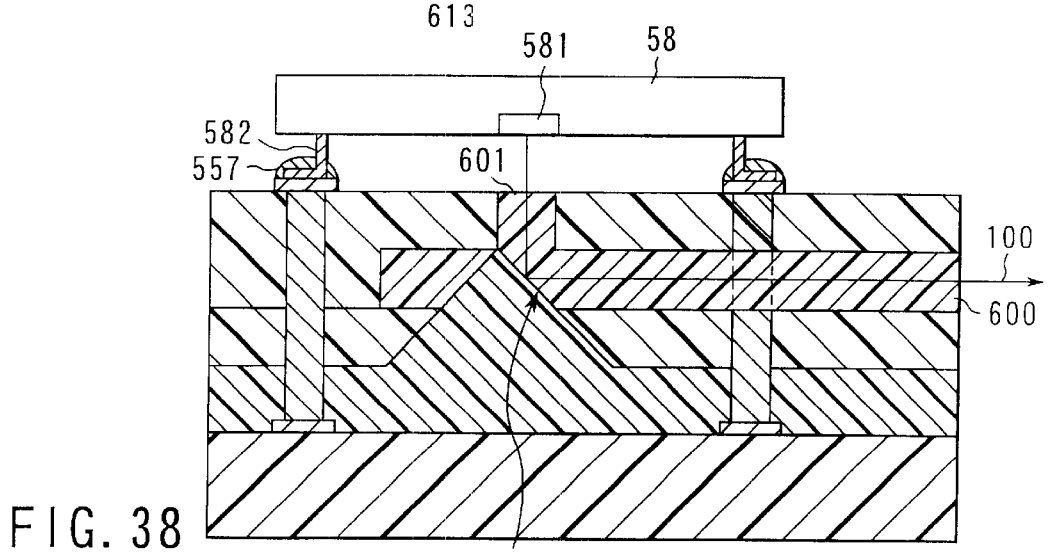
FIG. 38 is a sectional view of the optoelectric wiring substrate 86 with a light-emitting element mounted thereon.

FIG. 38 is a sectional view of the photoelectric wiring substrate 86 showing that leads from a laser light-emitting element 58 are soldered to pads 509. A laser beam 100 emitted from a laser light-emitting surface 581 of the laser light-emitting element 58 propagates through the second core 602, is reflected by the mirror 505, and then propagates through the first core 600.

Figure 39:
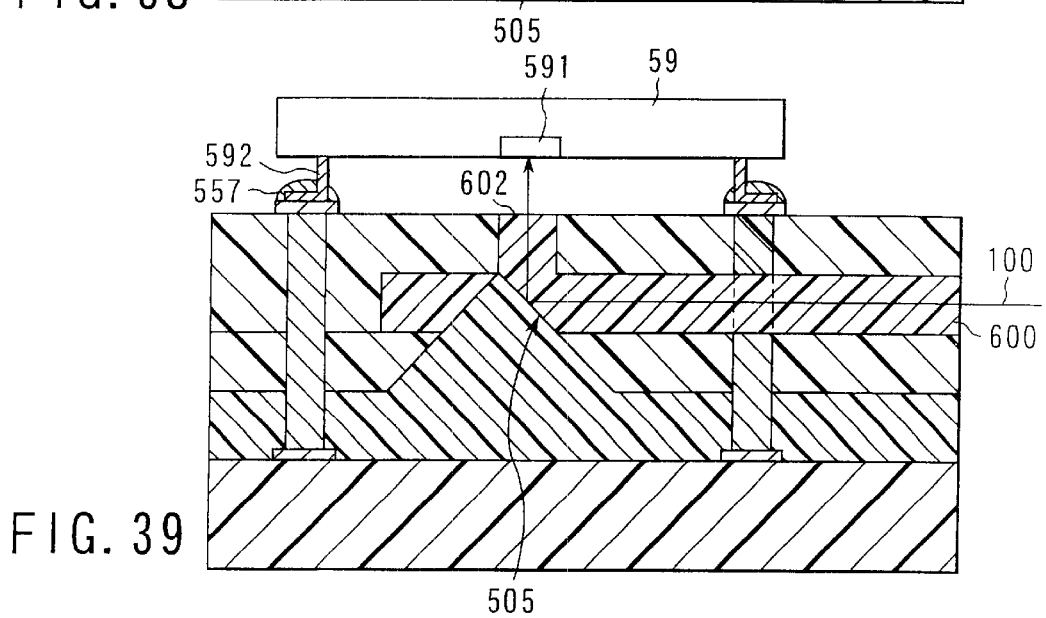
FIG. 39 is a sectional view of the optoelectric wiring substrate 86 with a light-receiving element mounted thereon.

FIG. 39 is a sectional view showing that leads from a laser light-receiving element 59 are soldered to the pads 509. The laser beam 100 propagating through the first core 600 is reflected by the mirror 505, propagates through the second core 602, and is then incident on a light-receiving surface 591 of the light-receiving element 59. As described above, the laser beam 100 reflected by the mirror 505 diffuses but is confined in the second core 602, so that it is emitted from the end of the second core 602 as a thin beam and then efficiently impinges on the light-receiving surface 591.

4. Method for Manufacturing a Photoelectric Wiring Substrate

<Method 5-3 for Manufacturing a Photoelectric Wiring Substrate>

Next, a method for manufacturing a photoelectric wiring substrate 86 laminated on an optical wiring layer 87 according to the present invention will be described.

FIGS. 40A to 40H sequentially show the steps of the method for manufacturing the photoelectric wiring substrate 86.

Figure 40A:
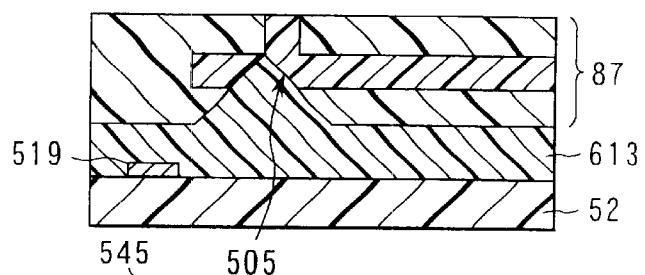
FIGS. 40A to 40F show each step of a method for manufacturing the optoelectric wiring substrate 86.

First, as shown in FIG. 40A, a mirror 505 side of the optical wiring layer 87 is stuck via an absorption layer 613 to an electric-wiring 519 side of a substrate 52. In this case, the absorption layer 613 is produced on the substrate 52 before the optical wiring layer is stuck thereto or the absorption layer 613 is produced on the mirror 505 side of the optical wiring 87 before it is stuck to the substrate 52. As described above, if a reflecting layer comprised of a metal film is not provided on the mirror surface of the mirror 505 and the absorption layer is in contact with the mirror surface, the absorption layer must have a smaller refractive index than cores.

Figure 40B:
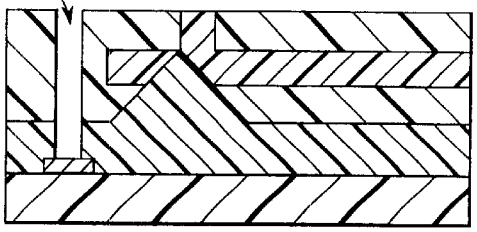

As shown in FIG. 40B, a hole 545 for forming a via hole is formed by means of a laser. Next, although not shown, a thin chromium film is sputtered on the surface of the hole 545 and a surface of the optical wiring layer 87 which is opposed to the substrate 52, and then a thin copper film is also sputtered on the thin chromium film.

Figure 40C:
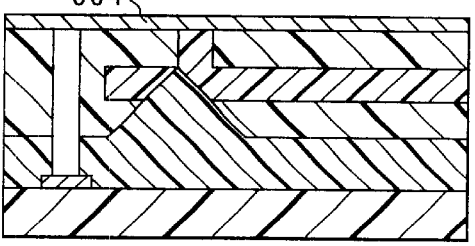
Figure 40D:
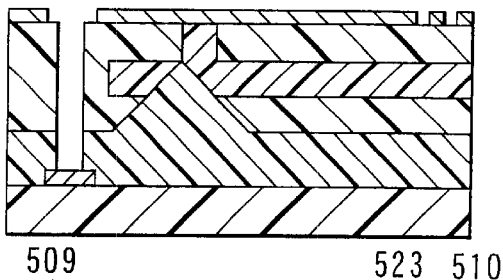

A resist 554 is coated on the surface of the optical wiring layer 87 as shown in FIG. 40C.

The resist 554 is exposed via a photo mask and then developed in such a manner that only portions of the resist 554 on which pads and an electric wiring are to be provided are removed.

Figure 40E:
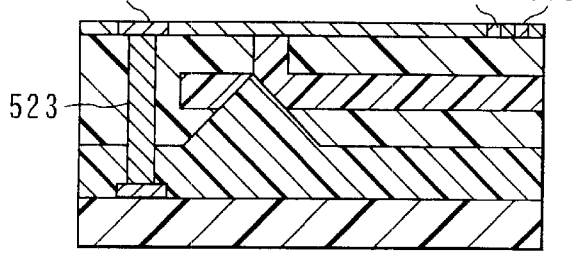
Figure 40F:
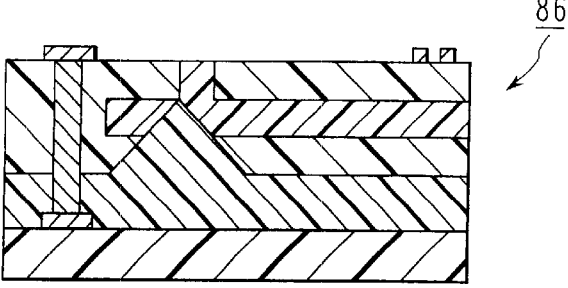

Further, the thin copper film formed on the surfaces of the hole 545 and optical wiring layer 87 is used as an electrode to electroplate the copper in order to produce a pad for an electric part 510, an electric wiring 513, a via hole 523, and a pad for an optical part 509, as shown in FIG. 40E.

The resist 554 is removed. Subsequently, the thin chromium and copper films formed on the surface of the optical wiring layer 87 are removed by means of soft etching to obtain a photoelectric wiring substrate 86 such as that shown in FIG. 40F.

As understood from the above explanation, the present invention has the following effects:

First, since a thin beam-like laser is emitted from the core propagating light perpendicularly to the optical wiring layer, a light-receiving element can be efficiently optically coupled to the optical wiring without the use of a converging convex lens. Thus, it is unnecessary to produce different converging convex lenses depending on the relative locational relationship between the light-receiving element and the optical wiring and the size of a light-receiving surface of the light-receiving element, resulting in easier manufacturing than with the conventional technique using a converging convex lens.

Second, since the optical wiring layer is provided on the substrate with the electric wiring, the photoelectric wiring substrate can have a higher mounting density and a reduced size.

Third, since the electric wiring can also be provided on the optical wiring layer, interference between the electric wires can be restrained.

Fourth, according to the embodiment of a method for manufacturing a photoelectric wiring substrate, the absorption layer is provided to absorb the unevenness of the electric wiring on the substrate, thereby eliminating the propagation loss of optical signals. In addition, when the optical wiring layer is stuck to the substrate, the sticking operation is performed precisely as intended.

Sixth Embodiment

1. Optoelectric Wiring Substrate

Figure 41:
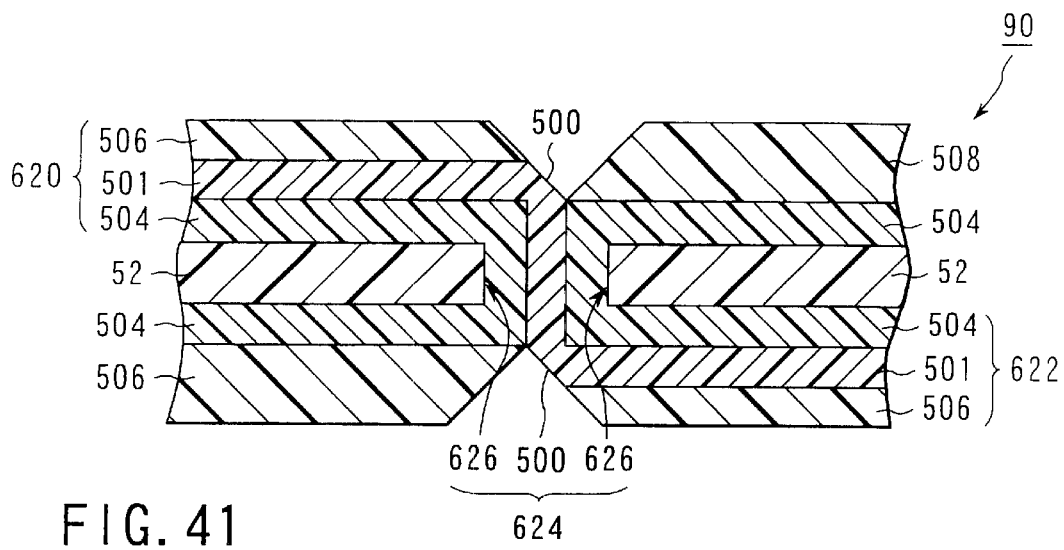
FIG. 41 is a sectional view of an optoelectric wiring substrate 90.

Optoelectric wiring substrates above mentioned, mount an optical part or the like on only one of the surfaces. On the contrary, Optoelectric wiring substrate according to fifth embodiment can mount an optical part or the like on both of the surfaces An important point of the optoelectric substrate shown in sixth embodiment is the concept that a new optical wiring layer, which makes optical signals reflected by a mirror to propagate from one of the surfaces to the other surface, is provided FIG. 41 is a sectional view taken along the direction of light propagating in an optoelectric wiring substrate 90 according to the sixth embodiment. First, based on FIG. 41, a configuration of the optoelectric wiring substrate 90 will be described.

In FIG. 41, a substrate 52 with an electric wiring 519 has a first optical wiring layer 620 on one of its surfaces (in FIG. 41, a top surface) which consists of a first clad 502, a second clad 506, and a core 501 surrounded by both clads. The substrate 52 has a second optical wiring layer on the other surface (in FIG. 41, a bottom surface) which consists of a first clad 504, a second clad 506, and a core 501 surrounded by both clads. Further, the substrate 52 has an optical through-hole 624 penetrating the substrate 52 with the electric wiring in a vertical direction and consisting of a core 500 surrounded by the first clad 504.

The optical through-hole 624 is made in the substrate 52 and extend vertically as shown in FIG. 41. Nonetheless, the optical through-hole is not limited to a vertical one in the present embodiment. The optical through-hole 624 need not be a vertical, so long as it can perform its essential function of guiding light from one surface of the substrate 52 to the other surface. For example, it may be a slant one, in which case the optical through-hole mirror 505 must be inclined at such an angle as to reflect the light into the optical through-hole 624.

The core 501 of the first wiring layer 620, the core 500 of the optical through-hole 624, and the core 501 of the second wiring layer 622 all have an equal refractive index. One end of the core 500 of the optical through-hole 624 (in FIG. 41, an upper end) is connected to the core 501 of the first wiring layer 620, and in this connection area between the cores is formed a mirror 505 having a mirror surface inclined at 45° relative to the surfaces of the substrate 52.

Likewise, the other end of the core 500 of the optical through-hole 624 (in FIG. 41, a lower end) is connected to the second wiring layer 622, and in this connection area is formed a mirror 505 having a mirror surface inclined at 45° relative to the surfaces of the substrate 52.

If the electric wiring 519 consists of plural layers, a conductor layer for electrically connecting these electric wiring layers may be formed as required on an inner surface 626 of a hole in the substrate through which the optical through-hole 624 is extended.

Figure 42:
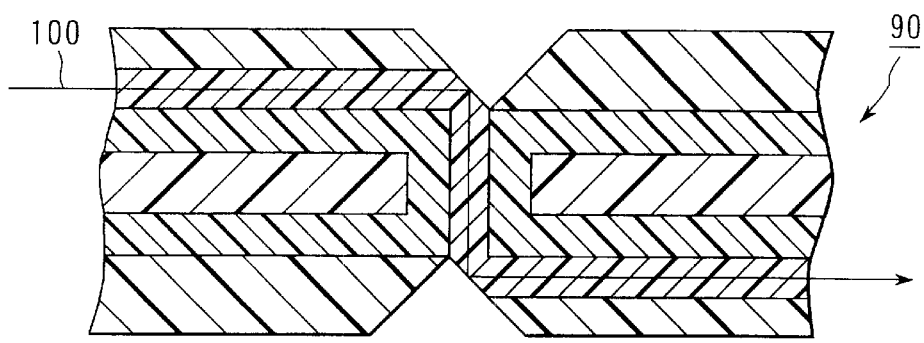
FIG. 42 describes propagation of an optical signal through the optoelectric wiring substrate 90.

As shown in FIG. 42, a laser beam 100 that has propagated through the core 501 of the first wiring layer 620 is reflected by the upper mirror 505 and then propagates through the core 500 of the optical through-hole 624. The beam is then reflected by the lower mirror 505 and propagates through the core 501 of the second wiring layer 622.

2. Method for Manufacturing a Photoelectric Wiring Substrate

<Method 6-1 for Manufacturing a Photoelectric Wiring Substrate>

Next, a method for manufacturing a photoelectric wiring substrate 90 according to the present invention will be described. This description focuses on an optical through-hole 624.

FIGS. 43A to 43J show each step of the method for manufacturing the photoelectric wiring substrate 90 and are arranged in the order of execution.

Figure 43A:
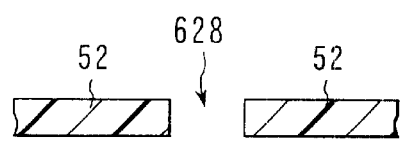
FIGS. 43A to 43J show each step of a method for manufacturing the optoelectric wiring substrate 90.

As shown in FIG. 43A, a first through-hole 628 is formed in a substrate 52 having an electric wiring 519. Methods for forming the first through-hole 628 include a drill, a laser, RIE (Reactive Ion Etching), etc. When the substrate 52 has an electric wiring consisting of multiple layers, an electric through-hole may be used as the through-hole 628. In this case, a dielectric layer is provided on an inner surface of the first through-hole 628 for electrically connecting these electric wiring layers together.

Figure 43B:
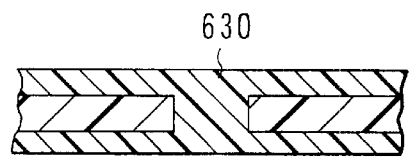

As shown in FIG. 43B, a clad 630 is coated on both surfaces of the substrate 52 and on the inner surface of the first through-hole 628 in such a manner that the through-hole 22 is filled with the clad 630.

Figure 43C:
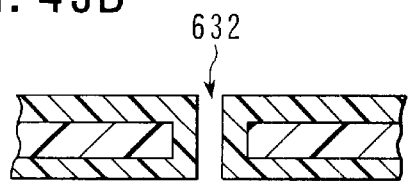

As shown in FIG. 43C, a second through-hole 632 having a smaller inner diameter than the first through-hole 628 is formed in a central portion of the filled first through-hole 628. Thus, the second through-hole 632 is surrounded by the clad. Methods for forming the second through-hole 632 include a drill, a laser, RIE, etc.

Figure 43D:
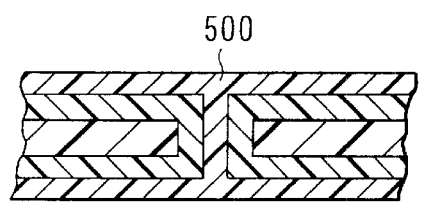

As shown in FIG. 43D, a core layer 532 is formed on both surfaces of the substrate 52 and on an inner surface of the second through-hole 632. As a result, the second through-hole 632 is filled with a core 500.

Figure 43E:
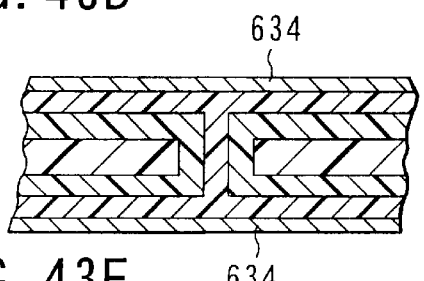

Next, the core layer 532 is covered with a metal film 634 on both surfaces of the substrate 52, as shown in FIG. 43E.

Figure 43F:
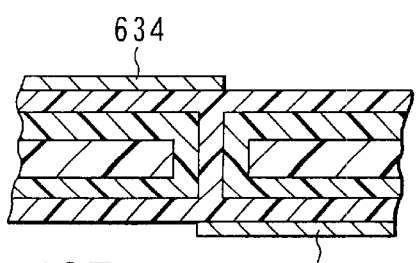

As shown in FIG. 43F, the photolithography technology is used to remove unwanted portions of the metal film 634 which correspond to portions of the core layer 532 which are not used as an optical wiring.

Figure 43G:
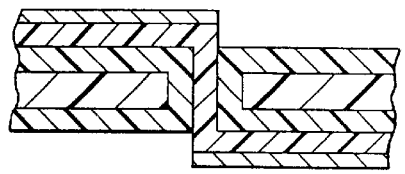

Both surfaces of the substrate 52 are etched by means of RIE to remove portions of the core 532 which are not covered with the remaining metal film 634, as shown in FIG. 43G.

Figure 43H:
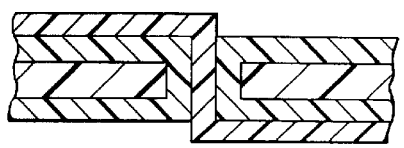

The remaining metal film 634 is removed from both surfaces of the substrate 52 as shown in FIG. 43H.

Figure 43I:
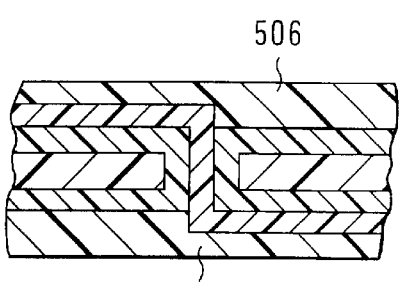
Figure 43J:
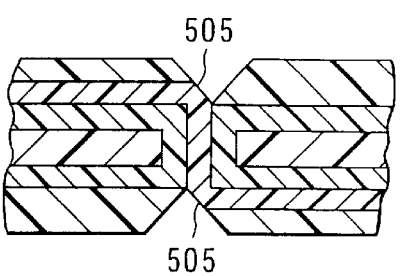

A second clad 506 is coated on both surfaces of the substrate 52 as shown in FIG. 43I.

Mirrors 505 each having a mirror surface inclined at 45° relative to the surfaces of the substrate 52 are formed in connections between the core parallel with the substrate 52 and the core perpendicular thereto, by means of dicing with a 90° cutting edge or RIE diagonal etching. The mirrors 505 may be mirrors 506 each formed with a metal reflecting film by means of sputtering or deposition.

According to this invention, the optical wiring layers are provided on both surfaces of the substrate with the electric wiring and are optically connected together via the optical through-hole, thereby enabling a complicated optical wiring while allowing optical parts to be mounted on both surfaces of the substrate. Therefore, the optical wiring design can be simplified and high-density wiring and mounting can be achieved.

Incidentally, the mirror in each of embodiments is formed so that light propagating through the optical wiring is incident thereon at 45°. Nonetheless, the angle of the mirror not limited to a vertical one. Accordingly, if a mirror having anther incident angle is formed, the optoelectric wiring substrate is designed corresponded to the angle (for example, an situation of pads 509, 510, an angle between the first core 600 and the second core 601, an angle of optical through-hole) so that passage through optical wave propagate can be formed arbitrary .

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An optoelectric substrate, comprising:
a substrate;
an electric wiring layer laminated on the substrate; and
an optical wiring layer laminated on the electric wiring layer, comprising
a core through which light propagates
a clad that holds the core
a mirror that reflects light propagating through the core
a first conductor, formed on a surface of the optical wiring layer that allows the installation of either a light receiver that receives light reflected by the mirror or light emittor that emits light toward the mirror and
a connector that electrically connects the first conductor to the electric wiring.

2. An optoelectric substrate, comprising:
a substrate;
an electric wiring layer laminated on the substrate; and
an optical wiring layer laminated on the electric wiring layer, comprising
a core through which light propagates
a clad that holds the core
a mirror that reflects light propagating through the core
a conductor formed on a surface of the optical wiring layer that allows installation of an electric part and
a connector that electrically connects the conductor to the electric wiring.

3. An optoelectric substrate, comprising:
a substrate;
an electric wiring layer laminated on the substrate; and
an optical wiring layer laminated on the electric wiring layer, comprising
a core through which light propagates
a clad that holds the core
a mirror that reflects light propagating through the core
a first conductor, formed on a surface of the optical wiring layer that allows the installation of either a light receiver that receives light reflected by the mirror or light emittor that emits light toward the mirror
a second conductor formed on a surface of the optical wiring layer that allows installation of an electric part and
a connector that electrically connects the first conductor to the electric wiring.

4. An optoelectric substrate, comprising:
a substrate;
an electric wiring layer laminated on the substrate; and
an optical wiring layer laminated on the electric wiring layer, comprising
a first clad
a first core formed on the first clad through which light propagates
a mirror that reflects light propagating through the core
a second core formed on the first clad using a material identical to that of the first core
a first conductor laminated on the second core that allows the installation of either a light receiver that receives light reflected by the mirror or light emittor that emits light toward the mirror
a connector that electrically connects the first conductor to the electric wiring and
a second clad that holds at least one of the first clad, the first core, the mirror, the second core, and the connector.

5. An optoelectric substrate, comprising:
a substrate;
an electric wiring layer laminated on the substrate; and
an optical wiring layer laminated on the electric wiring layer, comprising
a first clad
a first core formed on the first clad through which light propagates a mirror that reflects light propagating through the core a second core formed on the first clad using a material identical to that of the first core a first conductor laminated on the second core that allows the installation of either a light receiver that receives light reflected by the mirror or light emittor that emits light toward the mirror a second conductor formed on a surface of the optical wiring layer that allows installation of an electric part a connector that electrically connects the first conductor to the electric wiring and a second clad that holds at least one of the first clad, the first core, the mirror, the second core, and the connector.

6. An optoelectric substrate, comprising:

a substrate;

an electric wiring layer laminated on the substrate; and an optical wiring layer laminated on the electric wiring layer, comprising a first clad a first core formed on the first clad through which light propagates a mirror that reflects light propagating through the core a second core formed on the first clad using a material identical to that of the first core;

a conductor formed on a surface of the optical wiring layer that allows installation of an electric part a connector that electrically connects the conductor to the electric wiring and a second clad that holds at least one of the first clad, the first core, the mirror, the second core, and the connector.

7. An optoelectric wiring substrate according to claim 4, wherein the second clad covers part of the conductor.

8. An optoelectric wiring substrate according to claim 7 wherein the second clad has a hole for exposing part of the conductor.

9. An optoelectric wiring substrate according to claim 1, further comprising:

an absorption layer provided between the optical wiring layer and the substrate having the electric wiring that absorbs an unevenness of the electric wiring.

10. An optoelectric wiring substrate according to claim 1, wherein the optical wiring layer further comprises an aligner formed from a material identical to that of the first core aligning the substrate and the connector.

11. An optoelectric wiring substrate according to claim 1, wherein the optical wiring layer further comprises an aligner formed from a material identical to that of the first core that assists alignment when forming the mirror and the connector.

12. An optical wiring substrate according to claim 1, wherein the mirror is formed so that light is incident thereon at 45°.

13. An optical wiring substrate according to claim 1, wherein the mirror has a metal film formed on one of its surfaces.

14. An optical wiring substrate according to claim 1, wherein one surface of the mirror is in contact with the core and another surface is in contact with a medium having a smaller refractive index than the core.

15. A mounted substrate, comprising:

the optical wiring substrate according to claim 1; and an optical part installed on the first conductor that either receives a light reflected by the mirror or emits light toward the mirror.

16. A mounted substrate according to claim 15, wherein the optical part and the first conductor are soldered together.

17. A mounted substrate, comprising:

the optical wiring substrate according to claim 2; and an electric part installed on the conductor that either receives a light reflected by the mirror or emits light toward the mirror.

18. A mounted substrate according to claim 17, wherein the optical part and the conductor are soldered together.

19. An optoelectric wiring substrate according to claim 5, wherein the second clad covers part of the conductor.

20. An optoelectric wiring substrate according to claim 6, wherein the second clad covers part of the conductor.

21. An optoelectric wiring substrate according to claim 2, further comprising:

an absorption layer provided between the optical wiring layer and the substrate having the electric wiring that absorbs an unevenness of the electric wiring.

22. An optoelectric wiring substrate according to claim 3, further comprising:

an absorption layer provided between the optical wiring layer and the substrate having the electric wiring that absorbs an unevenness of the electric wiring.

23. An optoelectric wiring substrate according to claim 4, further comprising:

an absorption layer provided between the optical wiring layer and the substrate having the electric wiring that absorbs an unevenness of the electric wiring.

24. An optoelectric wiring substrate according to claim 5, further comprising:

an absorption layer provided between the optical wiring layer and the substrate having the electric wiring that absorbs an unevenness of the electric wiring.

25. An optoelectric wiring substrate according to claim 6, further comprising:

an absorption layer provided between the optical wiring layer and the substrate having the electric wiring that absorbs an unevenness of the electric wiring.

26. An optoelectric wiring substrate according to claim 7, further comprising:

an absorption layer provided between the optical wiring layer and the substrate having the electric wiring that absorbs an unevenness of the electric wiring.

27. An optoelectric wiring substrate according to claim 8, further comprising:

an absorption layer provided between the optical wiring layer and the substrate having the electric wiring that absorbs an unevenness of the electric wiring.

28. An optoelectric wiring substrate according to claim 2, wherein the optical wiring layer further comprises an aligner formed from a material identical to that of the first core aligning the substrate and the connector.

29. An optoelectric wiring substrate according to claim 3, wherein the optical wiring layer further comprises an aligner formed from a material identical to that of the first core aligning the substrate and the connector.

30. An optoelectric wiring substrate according to claim 4, wherein the optical wiring layer further comprises an aligner formed from a material identical to that of the first core aligning the substrate and the connector.

31. An optoelectric wiring substrate according to claim 5, wherein the optical wiring layer further comprises an aligner formed from a material identical to that of the first core aligning the substrate and the connector.

32. An optoelectric wiring substrate according to claim 6, wherein the optical wiring layer further comprises an aligner formed from a material identical to that of the first core aligning the substrate and the connector.

33. An optoelectric wiring substrate according to claim 7, wherein the optical wiring layer further comprises an aligner formed from a material identical to that of the first core aligning the substrate and the connector.

34. An optoelectric wiring substrate according to claim 8, wherein the optical wiring layer further comprises an aligner formed from a material identical to that of the first core aligning the substrate and the connector.

35. An optoelectric wiring substrate according to claim 3, wherein the optical wiring layer further comprises an aligner formed from a material identical to that of the first core that assists alignment when forming the mirror and the connector.

36. An optoelectric wiring substrate according to claim 4, wherein the optical wiring layer further comprises an aligner formed from a material identical to that of the first core that assists alignment when forming the mirror and the connector.

37. An optoelectric wiring substrate according to claim 6, wherein the optical wiring layer further comprises an aligner formed from a material identical to that of the first core that assists alignment when forming the mirror and the connector.

38. An optoelectric wiring substrate according to claim 7, wherein the optical wiring layer further comprises an aligner formed from a material identical to that of the first core that assists alignment when forming the mirror and the connector.

39. An optoelectric wiring substrate according to claim 8, wherein the optical wiring layer further comprises an aligner formed from a material identical to that of the first core that assists alignment when forming the mirror and the connector.

40. An optical wiring substrate according to claim 3, wherein the mirror is formed so that light is incident thereon at 45°.

41. An optical wiring substrate according to claim 4, wherein the mirror is formed so that light is incident thereon at 45°.

42. An optical wiring substrate according to claim 6, wherein the mirror is formed so that light is incident thereon at 45°.

43. An optical wiring substrate according to claim 7, wherein the mirror is formed so that light is incident thereon at 45°.

44. An optical wiring substrate according to claim 8, wherein the mirror is formed so that light is incident thereon at 45°.

45. An optical wiring substrate according to claim 20, wherein the mirror is formed so that light is incident thereon at 45°.

46. An optical wiring substrate according to claim 2, wherein the mirror has a metal film formed on one of its surfaces.

47. An optical wiring substrate according to claim 3, wherein the mirror has a metal film formed on one of its surfaces.

48. An optical wiring substrate according to claim 4, wherein the mirror has a metal film formed on one of its surfaces.

49. An optical wiring substrate according to claim 7, wherein the mirror has a metal film formed on one of its surfaces.

50. An optical wiring substrate according to claim 8, wherein the mirror has a metal film formed on one of its surfaces.

51. An optical wiring substrate according to claim 20, wherein the mirror has a metal film formed on one of its surfaces.

52. An optical wiring substrate according to claim 3, wherein one surface of the mirror is in contact with the core and another surface is in contact with a medium having a smaller refractive index than the core.

53. An optical wiring substrate according to claim 4, wherein one surface of the mirror is in contact with the core and another surface is in contact with a medium having a smaller refractive index than the core.

54. An optical wiring substrate according to claim 7, wherein one surface of the mirror is in contact with the core and another surface is in contact with a medium having a smaller refractive index than the core.

55. An optical wiring substrate according to claim 22, wherein one surface of the mirror is in contact with the core and another surface is in contact with a medium having a smaller refractive index than the core.

56. An optical wiring substrate according to claim 23, wherein one surface of the mirror is in contact with the core and another surface is in contact with a medium having a smaller refractive index than the core.

57. A mounted substrate, comprising:
the optical wiring substrate according to claim 2; and
an optical part installed on the conductor that either receives a light reflected by the mirror or emits light toward the mirror.

58. A mounted substrate according to claim 57, wherein the optical part and the conductor are soldered together.

59. A mounted substrate, comprising:
the optical wiring substrate according to claim 3; and
an optical part installed on the first conductor that either receives a light reflected by the mirror or emits light toward the mirror.

60. A mounted substrate according to claim 59, wherein the optical part and the first conductor are soldered together.

61. A mounted substrate, comprising:
the optical wiring substrate according to claim 4; and
an optical part installed on the first conductor that either receives a light reflected by the mirror or emits light toward the mirror.

62. A mounted substrate according to claim 61, wherein the optical part and the first conductor are soldered together.

63. A mounted substrate, comprising:
the optical wiring substrate according to claim 6; and
an optical part installed on the conductor that either receives a light reflected by the mirror or emits light toward the mirror.

64. A mounted substrate according to claim 63, wherein the optical part and the conductor are soldered together.

65. A mounted substrate, comprising:
the optical wiring substrate according to claim 7; and
an optical part installed on the conductor that either receives a light reflected by the mirror or emits light toward the mirror.

66. A mounted substrate according to claim 65, wherein the optical part and the conductor are soldered together.

67. A mounted substrate, comprising:
the optical wiring substrate according to claim 8; and
an optical part installed on the conductor that either receives a light reflected by the mirror or emits light toward the mirror.

68. A mounted substrate according to claim 67, wherein the optical part and the conductor are soldered together.

69. A mounted substrate, comprising:

the optical wiring substrate according to claim 19; and an optical part installed on the first conductor that either receives a light reflected by the mirror or emits light toward the mirror.

70. A mounted substrate according to claim 69, wherein the optical part and the first conductor are soldered together.

71. A mounted substrate, comprising:

the optical wiring substrate according to claim 20; and an optical part installed on the conductor that either receives a light reflected by the mirror or emits light toward the mirror.

72. A mounted substrate according to claim 71, wherein the optical part and the conductor are soldered together.

73. A mounted substrate, comprising:

the optical wiring substrate according to claim 3; and an electric part installed on the second conductor that either receives a light reflected by the mirror or emits light toward the mirror.

74. A mounted substrate according to claim 73, wherein the optical part and the second conductor are soldered together.

75. A mounted substrate, comprising:

the optical wiring substrate according to claim 5; and an electric part installed on the second conductor that either receives a light reflected by the mirror or emits light toward the mirror.

76. A mounted substrate according to claim 75, wherein the optical part and the second conductor are soldered together.

77. A mounted substrate, comprising:

the optical wiring substrate according to claim 19; and an electric part installed on the second conductor that either receives a light reflected by the mirror or emits light toward the mirror.

78. A mounted substrate according to claim 77, wherein the optical part and the second conductor are soldered together.

* * * * *